US011493580B2

(12) United States Patent
Park et al.

(10) Patent No.: US 11,493,580 B2
(45) Date of Patent: Nov. 8, 2022

(54) RF MAGNETIC FIELD HOMOGENEITY AND MAGNETIC RESONANCE IMAGE UNIFORMITY USING INDUCTIVE COUPLING

(71) Applicant: THE UNITED STATES OF AMERICA, AS REPRESENTED BY THE SECRETARY, DEPARTMENT OF HEALTH AND HUMAN SERVICES, Silver Spring, MD (US)

(72) Inventors: Bu S. Park, Bethesda, MD (US); Brenton McCright, Gaithersburg, MD (US); Sunder S. Rajan, Warrenton, VA (US)

(73) Assignee: THE UNITED STATES OF AMERICA, AS REPRESENTED BY THE SECRETARY, DEPARTMENT OF HEALTH AND HUMAN SERVICES, Silver Springs, MD (US)

(*) Notice: Subject to any disclaimer, the term of this patent is extended or adjusted under 35 U.S.C. 154(b) by 0 days.

(21) Appl. No.: 17/411,610

(22) Filed: Aug. 25, 2021

(65) Prior Publication Data
US 2021/0382126 A1 Dec. 9, 2021

Related U.S. Application Data

(63) Continuation of application No. 16/760,202, filed as application No. PCT/US2018/057698 on Oct. 26, 2018, now Pat. No. 11,131,732.
(Continued)

(51) Int. Cl.
*G01R 33/36* (2006.01)
*G01R 33/565* (2006.01)

(52) U.S. Cl.
CPC ..... *G01R 33/3642* (2013.01); *G01R 33/3635* (2013.01); *G01R 33/5659* (2013.01)

(58) Field of Classification Search
CPC .......... G01R 33/3642; G01R 33/3635; G01R 33/5659
See application file for complete search history.

(56) References Cited

U.S. PATENT DOCUMENTS

| | | |
|---|---|---|
| 4,734,647 A | 3/1988 | Yoshimura |
| 4,825,162 A | 4/1989 | Roemer et al. |

(Continued)

OTHER PUBLICATIONS

International Search Report, International Application No. PCT/US2018/057698 filed Oct. 26, 2018, 3 pages (dated Feb. 27, 2019).
(Continued)

*Primary Examiner* — G. M. A Hyder
(74) *Attorney, Agent, or Firm* — Klarquist Sparkman, LLP

(57) ABSTRACT

An apparatus, method, and system are disclosed for improving uniformity of RF magnetic field in an MRI system, and thereby improving both signal-to-noise ratio and uniformity of imaging sensitivity across a sampling volume, to provide more uniform MRI images. A passive LC resonator develops induced EMF and induced currents in a primary RF magnetic field; the secondary magnetic field produced thereby can counteract magnetic field amplitude gradients to produce a more homogeneous RF magnetic field. In systems with separate transmit and receive coils, a shunt detuning circuit is pulsed ON to prevent interference during the transmit period. In a dual-frequency MRI machine (e.g. 19F and 1H), the RF magnetic field at the lower operating frequency can be homogenized by tuning the resonance of the passive resonator between the two operating frequencies. Another resonator can improve RF field uniformity at the
(Continued)

higher operating frequency. Variants and experimental results are disclosed.

20 Claims, 28 Drawing Sheets

Related U.S. Application Data

(60) Provisional application No. 62/579,014, filed on Oct. 30, 2017.

(56) References Cited

U.S. PATENT DOCUMENTS

| | | | |
|---|---|---|---|
| 4,973,907 | A | 11/1990 | Bergman et al. |
| 5,136,244 | A | 8/1992 | Jones et al. |
| 7,417,431 | B2 | 8/2008 | Lanz et al. |
| 2011/0309832 | A1 | 12/2011 | Alagappan et al. |
| 2012/0306497 | A1 | 12/2012 | Kaneko et al. |
| 2013/0021033 | A1 | 1/2013 | Stoeckel et al. |
| 2013/0123609 | A1 | 5/2013 | Odoj et al. |
| 2013/0165768 | A1 | 6/2013 | Biber |
| 2020/0408861 | A1 | 12/2020 | Park et al. |

OTHER PUBLICATIONS

Written Opinion of the International Searching Authority, International Application No. PCT/US2018/057698 filed Oct. 26, 2018, 10 pages (dated Feb. 27, 2019).

Bilgen, "Inductively-overcoupled coil design for high resolution magnetic resonance imaging", BioMedical Engineering OnLine 2006, 5:3, 10 pages (Jan. 2006).

Bulumulla et al., "Inductively coupled wireless RF coil arrays", Magnetic Resonance Imaging 33, pp. 351-357 (Apr. 2015).

Detroye et al., "The Calculation and Measurement of Helmholtz Coil Fields", Army Research Laboratory, ARL-TN-35, pp. 5-17 (Nov. 1994).

Doty et al., "Using a cross-coil to reduce RF heating by an order of magnitude in triple-resonance multinuclear MAS at high fields", Journal of Magnetic Resonance 182, pp. 239-253 (Jul. 2006).

Hoult et al., "Use of Mutually Inductive Coupling in Probe Design", Concepts in Magnetic Resonance, vol. 15(4), pp. 262-285 (Aug. 2002).

Kuhns, "Inductive Coupling and Tuning in NMR Probes; Applications", Journal of Magnetic Resonance 78, pp. 69-76 (Jun. 1988).

Lam, "Magnetic Field Uniformity of Helmholtz Coils and Cosine $\theta$ Coils", The Department of Physics, The Chinese University of Hong Kong, 9 pages (apparently dated Aug. 2009).

Merkle et al., "Transmit $B_1$-Field Correction at 7T Using Actively Tuned Coupled Inner Elements", Magnetic Resonance in Medicine 66, pp. 901-910 (Mar. 2011).

Park et al., "Improvement of Magnetic Field Uniformity of 19F Imaging using the Inductive Coupling at 7.0T", Proc. Intl. Soc. Mag. Reason. Med. 25, Poster No. 4418, 3 pages (Apr. 2017).

Park et al., "Improvement of $^{19}$F MR image uniformity in a mouse model of cellular therapy using inductive coupling", 11 pages, also published as Park et al., "Improvement of $^{19}$F MR image uniformity in a mouse model of cellular therapy using inductive coupling", Magnetic Resonance Materials in Physics, Biology and Medicine, vol. 30, No. 2, pp. 15-23 (Jun. 2018).

Park et al., "Sensitivity and Uniformity Improvement of Phased Array Animal MR Images Using Inductive Coupling and RF Detuning Circuits", 18 pages, also published as Park et al., "Sensitivity and uniformity improvement of phased array MR images using inductive coupling and RF detuning circuits", Magnetic Resonance Materials in Physics, Biology and Medicine, (Jan. 2020).

Qian et al., "Sensitivity Enhancement of an Inductively Coupled Local Detector Using a HEMT-Based Current Amplifier", Magnetic Resonance in Medicine 75, pp. 2573-2578 (Jul. 2015).

Quick et al., "Inductively Coupled Stent Antennas in MRI", Magnetic Resonance in Medicine 48, pp. 781-790 (Dec. 2002).

Rao et al., "RF Instrumentation for Same-Breath Triple Nuclear Lung MR Imaging of $^1$H and Hyperpolarized $^3$He and $^{129}$Xe at 1.5T", Magnetic Resonance in Medicine 75, pp. 1841-1848 (May 2015).

RAPID Biomedical GmbH, "Dual Tuned Flex Surface Coil @ 7 T", 1 page (Aug. 2017).

Schnall et al., "Wireless Implanted Magnetic Resonance Probes for in Vivo NMR", Journal of Magnetic Resonance 68, pp. 161-167 (Jun. 1986).

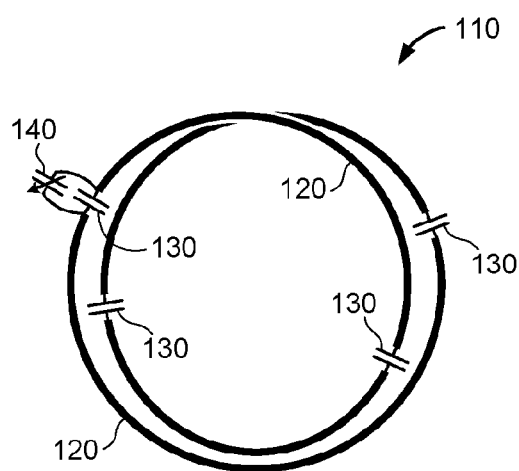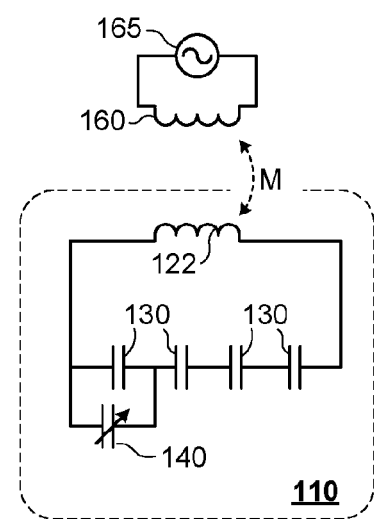
FIG. 1A  FIG. 1B
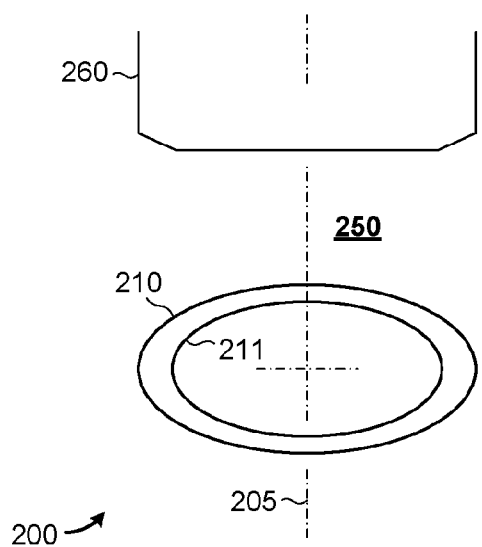
FIG. 2

$F_1 \approx 287$ MHz for $^{19}$F imaging
$F_2 \approx 305$ MHz for $^{1}$H imaging $F_1 \approx 287$ MHz for $^{19}$F imaging

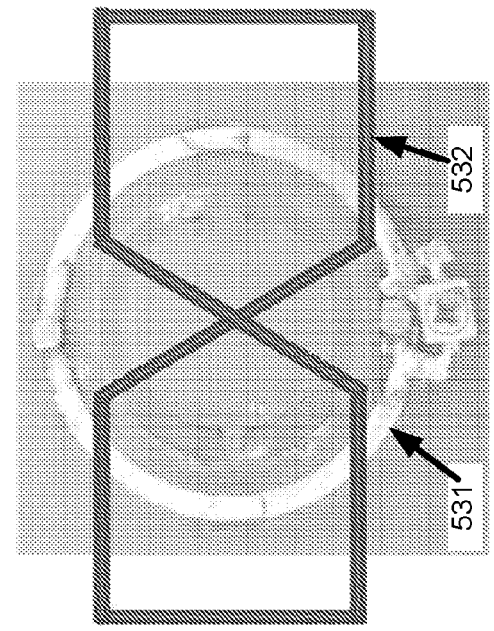
FIG. 5A Design 1
FIG. 5B Design 2
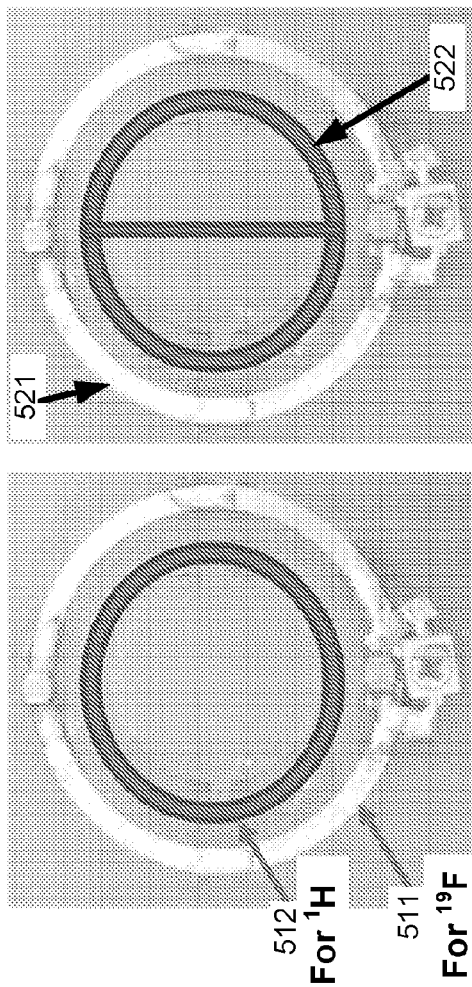
FIG. 5C Design 3
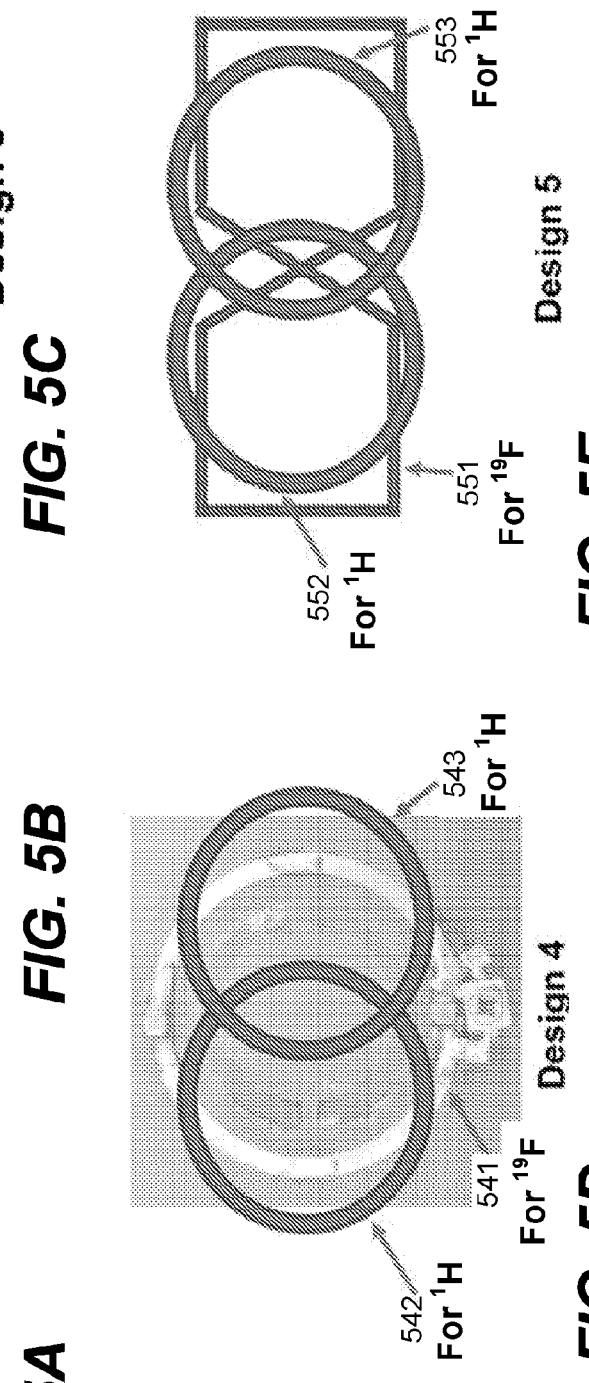
FIG. 5D Design 4
FIG. 5E Design 5

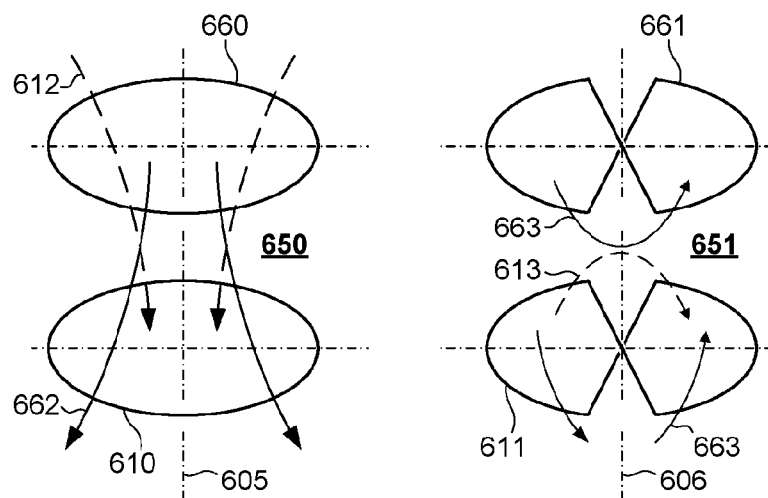
FIG. 6A  FIG. 6B
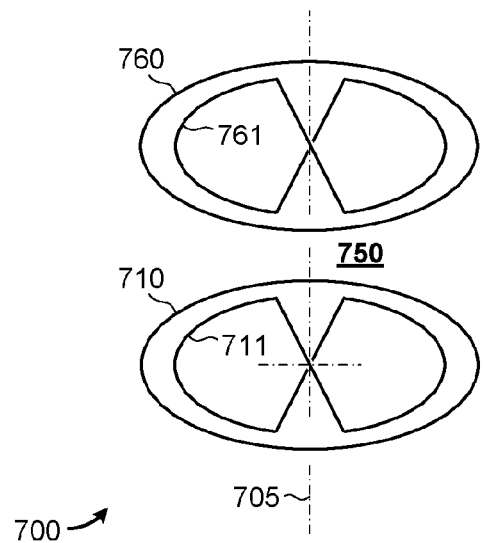
FIG. 7

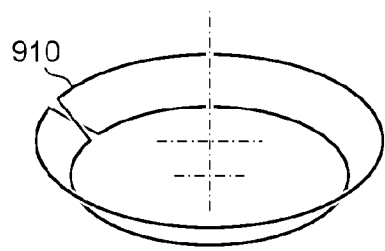
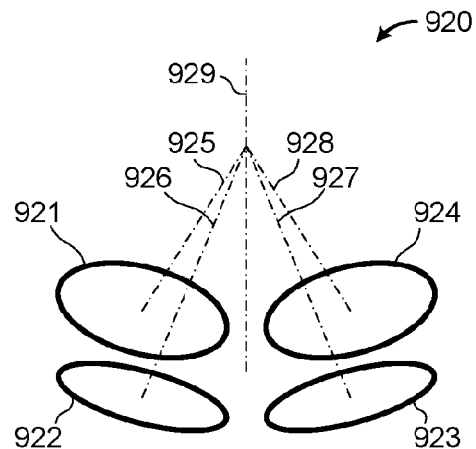
FIG. 9A  FIG. 9B
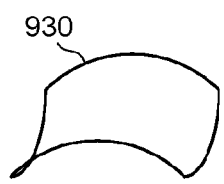
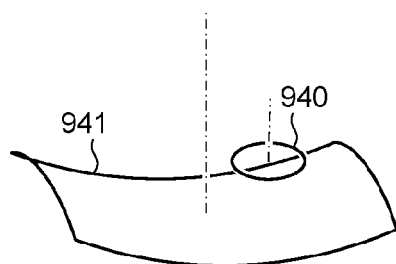
FIG. 9C  FIG. 9D

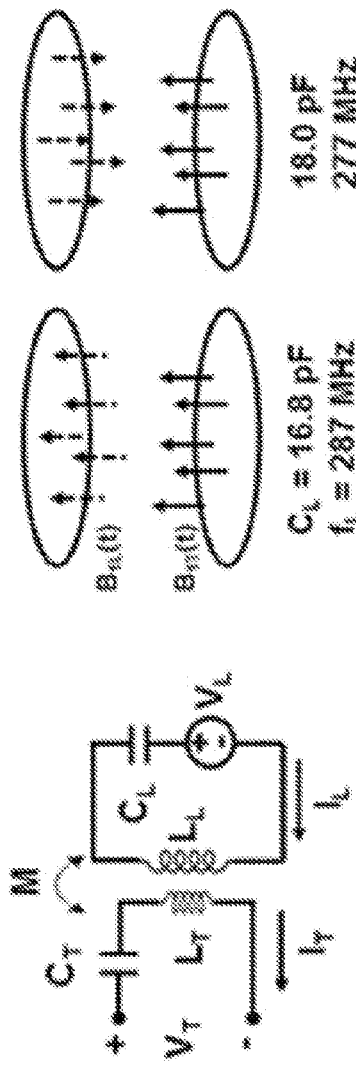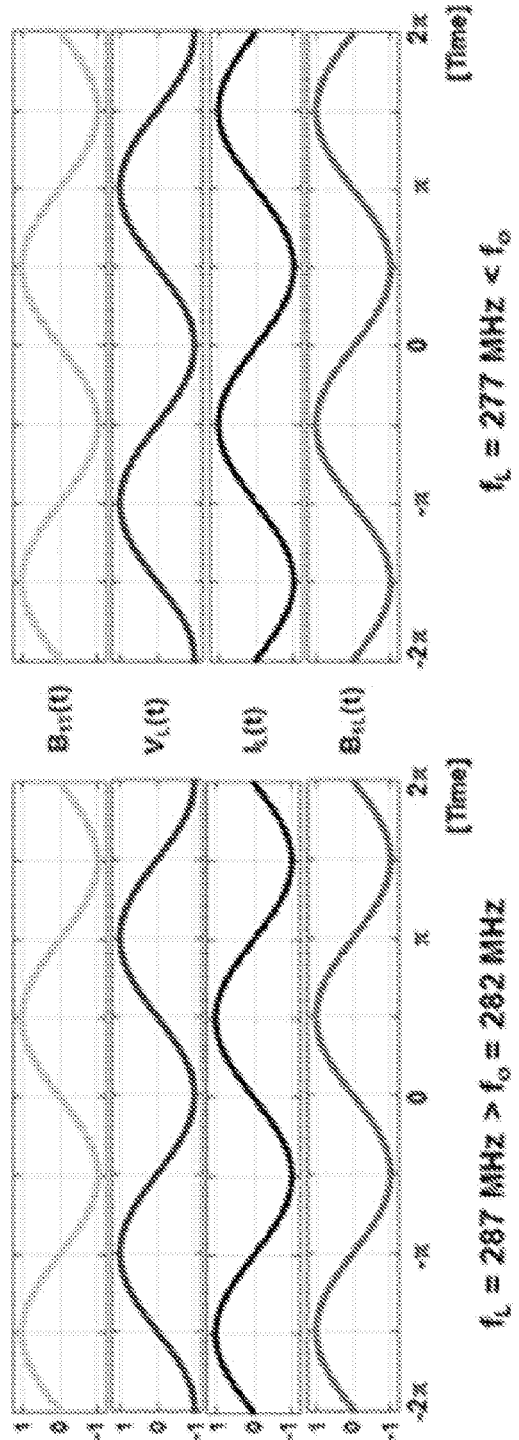
FIG. 14A  FIG. 14B  FIG. 14C  FIG. 14D  FIG. 14E

Red Fluorescence Image

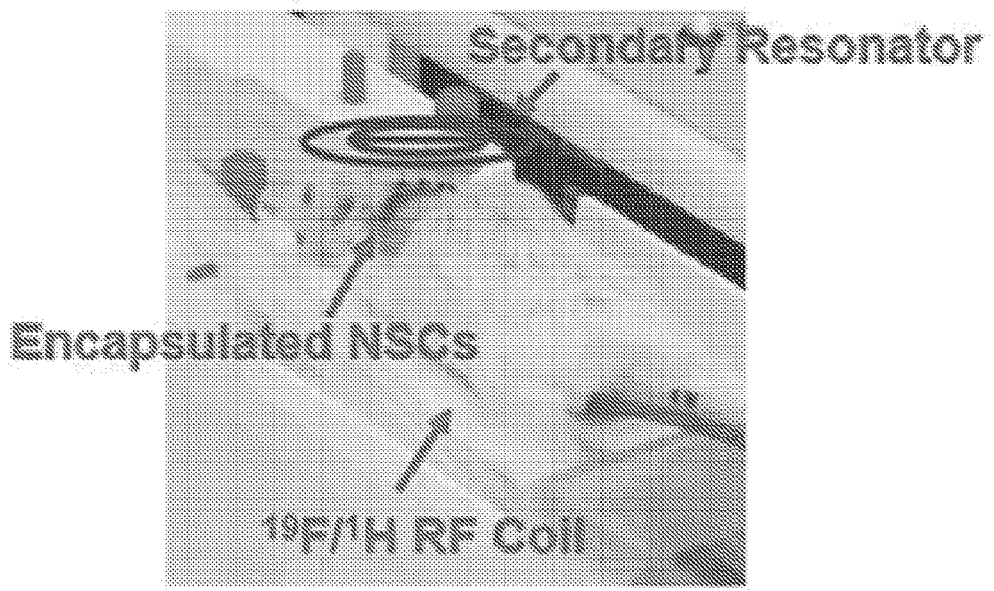
FIG. 22
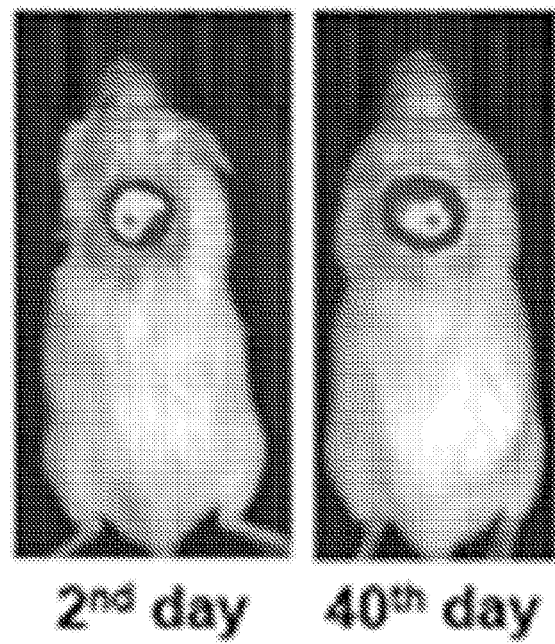
FIG. 23A  FIG. 23B

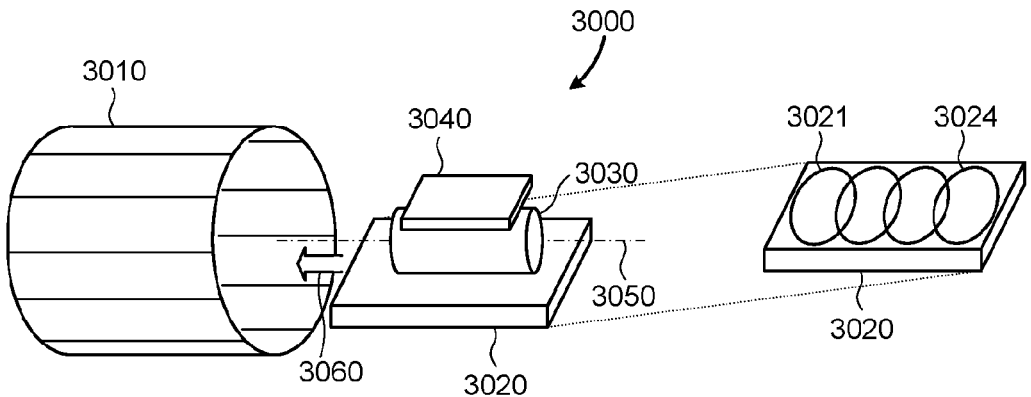
FIG. 30A  FIG. 30B
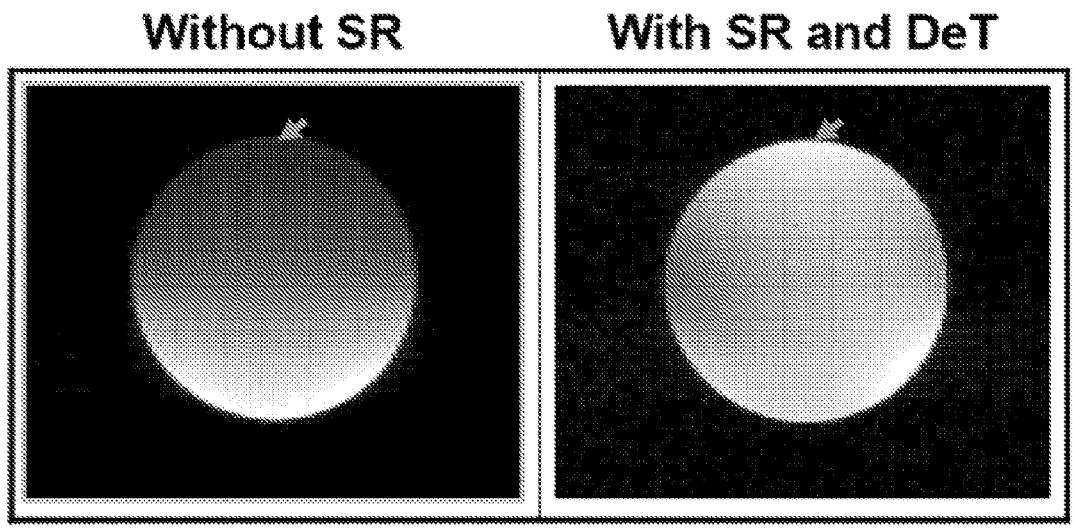
FIG. 31A
| | Signal Amplitude at the Arrow [a.u.] | Signal Mean within the Sample | Signal Std. Dev. within the Sample |
|---|---|---|---|
| Without SR | 500 | 1707 | 1108 |
| With SR and DeT | 3400 | 2040 | 555 |
FIG. 31B

RF MAGNETIC FIELD HOMOGENEITY AND MAGNETIC RESONANCE IMAGE UNIFORMITY USING INDUCTIVE COUPLING

CROSS REFERENCE TO RELATED APPLICATIONS

This application is a continuation of U.S. application Ser. No. 16/760,202, filed Apr. 29, 2021 and claims priority to the U.S. National Stage of International Application No. PCT/US2018/057698, filed Oct. 26, 2018, which was published in English under PCT Article 21(2), which in turn claims the benefit of U.S. Provisional Application No. 62/579,014, filed Oct. 30, 2017, all of which are incorporated herein by reference in their entirety.

FIELD

The disclosure pertains to improvement of magnetic resonance imaging (MRI) quality in an MRI system using inductive coupling.

BACKGROUND

MRI technology continues to advance through the development of new magnets, new pulse sequences, new analytic and image processing techniques, and joint imaging modalities. Different classes of MRI systems are available for whole body applications, brain studies, animal studies, and magnetic resonance microscopy. MRI is used to acquire cross-sectional images, study functional activity, diagnose disease, and measure tissue perfusion within human bodies and other organisms. In addition to medical applications, MRI has also been applied to diverse fields including oil exploration and is gradually finding use for imaging non-living solid objects.

Dual-frequency MRI systems allow imaging of a specimen using two nuclides with different gyromagnetic ratios and different resonance frequencies. This can provide benefits by combining, for example, superior spatial resolution of images obtained from $^1$H nuclei with absence of background signal in images obtained from $^{19}$F nuclei. In other examples, dual-frequency imaging can provide better imaging where the two targeted nuclides have significantly different spatial distributions. Dual-frequency technology can also be extended to multiple frequencies in a technique dubbed multi-nuclear MRI.

Higher magnetic fields provide benefits including improvements to signal-to-noise ratio, image contrast, spatial resolution, and/or temporal resolution. However, higher magnetic fields translate to higher resonant frequencies having shorter wavelengths, which are often associated with reduced uniformity of RF magnetic fields over a sample volume. Uniformity of RF magnetic field strength across a sample volume is important to obtain uniformity of contrast and sensitivity. Commercially available RF antennas (often termed "RF coil") for dual frequency MRI systems are often simple planar designs that have a rapid fall-off in RF magnetic field strength with depth. Adding additional RF coils to address this issue can be difficult and inefficient. For this reason, there has been considerable interest in developing techniques to improve RF field uniformity as MRI technologies move towards higher field strengths.

However, dual-frequency MRI at high field poses certain problems that are distinct from the single-frequency case: any homogenization achieved at one of the RF frequencies should not adversely impact the operation at the other RF frequency. Then, MRI systems having separate transmit and receive antennae face additional problems, including distortion of the transmit field by receive antenna structures. To overcome such deficiencies, there remains a need for improved technology to maintain homogeneous RF magnetic fields within an MRI sample volume in various MRI configurations.

SUMMARY

In certain examples, the disclosed technologies are embodied in an RF magnetic field shim suitable for use with a dual-antenna MRI system, which can have separate antennae for transmitting and receiving an RF signal at an operating frequency used for resonant imaging of sample nuclei. The shim has a first passive circuit incorporating one or more electrically conductive segments, e.g. copper strip, and one or more capacitors connected together to form one or more loops. Each capacitor can be a combination of one or more lumped capacitors proximate to each other, or can include a distributed capacitance such as a length of stripline. The loops are self-contained and do not include any cable connection to an outside device such an amplifier or signal source. The first passive circuit has a first resonance frequency above the operating frequency. Additionally, one or more controllable shunt detuning circuits are connected across respective capacitors of the first passive circuit. The shunt detuning circuit can be controlled to be ON (for detuning the resonance of the shim) while the transmit RF antenna is active, and can be controlled to be OFF (no detuning) while detecting a received RF signal.

In some examples, the controllable shunt detuning network can be a series combination of a diode network and a passive network. The passive network can variously be an inductor or a parallel combination of an inductor and a secondary capacitor. The diode network can include a crossed diode pair (e.g. an anti-parallel connection of two PIN diodes), which can be turned ON by induced currents in the transmit RF field. In some examples, only one of the capacitors has a shunt detuning network, while in other examples every capacitor has its own shunt detuning network, and in further examples an intermediate number of capacitors is provisioned with a shunt detuning network. In other examples, the diode network can be a single diode, and the diode network can be turned ON by a pulsed bias signal (DC current or voltage) applied across the diode network, in which case the shunt detuning network is an active detuning network. In example shims using active detuning, exactly one of the capacitors can be shunted by a detuning circuit, which in turn is coupled to a DC bias source by a single conductor pair. In further examples, the inductor of a shunt detuning network can have a secondary capacitor connected in parallel across the inductor. The first passive circuit can be adjustable, including at least one adjustable component. In some examples, one of the capacitors is an adjustable capacitor.

In additional examples, the first resonance frequency can be between 100% and 130%, 100.2% and 110%, between 100.5% and 105%, or between 101% and 102% of the operating frequency, when the first passive circuit is proximate to a sample to be imaged, such as an aqueous sample and/or proximate to a primary receive antenna. The first passive circuit can be a single-turn coil of circular, oval, rectangular, square, saddle-shaped, or another shape.

In certain examples, the disclosed technologies are embodied in a method. A passive circuit (e.g. a secondary resonator according to the disclosed technology) and a sample can be affixed to a translation stage of an MRI machine and a primary receive antenna system of the MRI machine, with the passive circuit near or adjacent to the sample. (The translation stage is sometimes known as a sample table or cradle, for positioning a sample and/or RF antennae.) The MRI machine can have a body with a bore and a transmit RF antenna affixed around the bore. The passive circuit can have one or more electrically conductive segments and one or more capacitors connected together to form one or more loops. At least one of the capacitors can be electrically coupled to a respective detuning circuit. The passive circuit can be adjusted to have a first resonant frequency when affixed to the sample and translation stage, the first resonance frequency being between 1% and 2% above an operating frequency of the MRI machine in further examples. The stage can be positioned within the bore, and MRI signals are acquired at the first operating frequency.

In some examples, MRI signals are acquired by actuating the transmit RF body coil during a transmit phase, with the detuning circuit in an ON state during the transmit phase (e.g. a time period when the transmit RF body coil is ON), and subsequently detecting the MRI signals with the receive antenna system during a receive phase, with the detuning circuit being OFF during the receive phase (e.g. a time period when MRI signals are being detected with the receive antenna system). The detuning circuit can be a passive detuning circuit turned on by currents or fields induced in the detuning circuit by RF fields generated by the transmit RF body coil during the transmit phase. In alternative examples, the detuning circuit can be an active detuning circuit controlled by a pulsed bias source to be ON during the transmit phase and OFF during the receive phase. The bias sources can be electrical (DC current or DC voltage) or optical.

In additional examples, image data can be generated using the acquired MRI signals.

In certain examples, the disclosed technologies are embodied in a system for improving RF magnetic field sensitivity within a sample volume of an MRI machine. The system includes an RF transmit antenna, an RF receive antenna, a secondary RF resonator, and a detuning circuit. The RF transmit antenna is configured to generate a transmit magnetic field at a first operating frequency of the MRI machine during a transmit phase. The RF receive-only antenna is distinct from the RF transmit-only antenna, and is configured to detect a receive magnetic field at the first operating frequency during a receive phase. The secondary RF resonator incorporates one or more electrically conductive segments and one or more capacitors connected together to form one or more loops, and is configured to have a resonant frequency above and within 30% of the operating frequency, when placed in proximity to an aqueous sample in the sample volume. The detuning circuit is coupled to a given one of the capacitors of the secondary resonator, and is configured to be ON during the transmit phase and OFF during the receive phase.

In some examples, the detuning circuit can be a passive detuning circuit incorporating anti-parallel PIN diodes turned on by the transmit magnetic field during the transmit phase. In other examples, the detuning circuit can be an active detuning circuit comprising a single diode coupled to an external pulsed bias source configured to turn on the diode during the transmit phase. The detuning circuit can be configured to provide a parallel resonance with the given capacitor during the transmit phase, the parallel resonance having a parallel resonant frequency within 1% of the MRI operating frequency. In further examples, the detuning circuit can be configured to shift the passive circuit series resonant frequency to be at least 5% away from the MRI operating frequency during the transmit phase, with the detuning circuit ON.

In additional examples, the secondary RF structure can be adjustable, and can be tuned with at least one adjustable component, such as an adjustable capacitor or inductor.

In further examples, the MRI machine can be a dual-frequency MRI machine and the system can include a second transmit RF antenna configured to generate a second magnetic field at a second operating frequency of the MRI machine, the second operating frequency being above the first operating frequency, and the first resonant frequency at least 10% below the second operating frequency.

In some examples, the system can include a computing node having one or more hardware processors and memory coupled thereto, as part of the MRI machine or as an auxiliary computer for added processing power or post-processing. Together, the system can be configured to acquire MRI signals of a sample in the sample volume at the first operating frequency, and generate image data based on the MRI signals.

In certain examples, the disclosed technologies are embodied in an electromagnetic RF shim suitable for use with a dual-frequency MRI system. The shim has a first passive circuit incorporating one or more electrically conductive segments and one or more capacitors connected together to form one or more loops. The first passive circuit has a first resonance frequency between first and second operating frequencies of the dual-frequency MRI system.

In some examples, the electromagnetic RF shim can include a second passive circuit incorporating one or more electrically conductive segments and one or more capacitors connected together to form one or more loops. The second passive circuit can have a resonant frequency above both the first and second operating frequencies. In some examples, the first passive circuit can be adjustable and can incorporate one or more adjustable components. The second passive circuit can also incorporate one or more adjustable components.

In additional examples, the dual-frequency MRI system has a sample volume and is configured to image an aqueous sample in the sample volume. The first resonance frequency can be applicable in a condition wherein the first passive circuit is proximate the aqueous sample. The second resonance frequency can be applicable in a condition wherein the second passive circuit is proximate the aqueous sample. The first operating frequency can be within a first resonant bandwidth of the first passive circuit and the second operating frequency can be outside the first resonant bandwidth. The second operating frequency can be within a second resonant bandwidth of the second passive circuit.

Loops of either passive circuit can be coplanar or in different planes, can be concentric or can have different centers, can have the same enclosed area or different enclosed areas, and can have the same shape or different shapes, in any combination. In further examples, at least one of the passive circuits can be substantially circular, substantially planar, or can conform to a curved surface around the sample volume. At least one passive circuit can have a figure-eight shape. A passive circuit can have exactly one loop, or more than one loop. Electrically conductive segments of a passive circuit can be partially or wholly made of copper, aluminum, silver, gold, a superconductor, or a high-temperature superconductor. A passive circuit can have from one to twenty capacitors. The capacitors can be lumped capacitors, or distributed capacitors such as a MITS coil or a section of a transmission line. The first passive circuit can incorporate one or more variable capacitors. A passive circuit can include one or more discrete resistors, or one or more variable resistors.

In further examples, 19F can be resonant in the sample volume at the first operating frequency, which is lower than the second operating frequency, or 1H can be resonant in the sample volume at the second operating frequency. The dual-frequency MRI system can include a first transmit antenna for the first operating frequency and a second transmit antenna for the second operating frequency. The first and second antennas can be distinct, or can be the same. A transmit antenna can include a drive coil, which can be circular, planar, or can conform to a curved surface around the sample volume. The first antenna and the first passive circuit can be situated on opposite sides of the sample volume. The second antenna and the second passive circuit can be situated on opposite sides of the sample volume.

A first mutual inductance can be defined between the first antenna and the first passive circuit. A second mutual inductance can be defined between the second antenna and the first passive circuit. A third mutual inductance can be defined between the second passive circuit and the first passive circuit. In some examples, the first mutual inductance can greater than the second mutual inductance. The first mutual inductance can be greater than the third mutual inductance. The primary RF magnetic field generated by the first antenna can share a symmetry with the induced magnetic field resulting from induced currents in the first passive circuit.

In certain examples, the disclosed technologies are embodied in a method. A passive circuit is adjusted to have a first resonance frequency when the first passive circuit is in a first operating environment. The first operating environment is with the passive circuit proximate to a sample in a sample volume of a dual-frequency MRI system. The first resonance frequency is above a first operating frequency (which can be a $^{19}$F resonance frequency, e.g. 282 MHz at 7.0 T) of the dual-frequency MRI system and below a second operating frequency (which can be a $^{1}$H resonance frequency, e.g. 300 MHz at 7.0T) of the dual-frequency MRI system. In the method, first MRI signals are acquired at the first operating frequency, for which the passive circuit can provide improved field uniformity and improved image quality. In some examples, second MRI signals are also acquired at the second operating frequency. Image data representative of at least a portion of the sample in the sample volume can be generated based partly on the first MRI signals and based partly on the second MRI signals.

In certain examples, the disclosed technologies are embodied in a system for improving RF magnetic field uniformity within a sample volume of a dual-frequency MRI machine. A first antenna has one or more electrically conductive segments and one or more capacitors connected together to form one or more loops. A first RF transmit antenna is configured to generate a magnetic field at a first operating frequency of the dual-frequency MRI machine. A second RF transmit antenna is configured to generate a second magnetic field at a second operating frequency of the dual-frequency MRI machine. The first adjustable antenna is configured to have a first resonance frequency above the first operating frequency and below the second operating frequency. The first adjustable antenna, the first RF transmit antenna, and the second RF transmit antenna are in fixed positions proximate to a sample volume of the dual-frequency MRI machine.

Some examples of this system can additionally include a second antenna having one or more electrically conductive segments and one or more capacitors connected together to form one or more loops. The second antenna can have a second resonance frequency above the second operating frequency, so as to improve RF magnetic field uniformity at the second operating frequency, within the sample volume. The second antenna can be in a fixed position near the sample volume. The first or second antenna can be adjustable and can incorporate one or more adjustable components.

The first or second resonance frequencies can be applicable in the condition that the respective antennas are near an aqueous sample to be imaged within the sample volume.

In certain examples, the disclosed technologies are embodied in a dual-frequency MRI machine incorporating a system such as described above. The dual-frequency MRI machine can also include a computing system having one or more processors with memory coupled thereto, and configured to acquire first MRI signals at the first operating frequency, and acquire second MRI signals at the second operating frequency. The computing node can be configured to generate an image or fused dataset based partly on the first MRI signals and based partly on the second MRI signals.

The foregoing and other objects, features, and advantages of the invention will become more apparent from the following detailed description, which proceeds with reference to the accompanying figures.

BRIEF DESCRIPTION OF THE DRAWINGS

FIGS. 1A-1B illustrate an example of an inductively coupled electromagnetic RF shim for use with a dual frequency MRI system, according to disclosed technology.

FIG. 2 shows an oblique view of a portion of a dual-frequency MRI system having two secondary resonators, according to disclosed technology.

FIGS. 5A-5E illustrate a variety of designs for a dual-frequency secondary resonator.

FIGS. 6A-6B show different symmetry relationships between primary and secondary magnetic fields, for different configurations of the disclosed technology.

FIG. 7 shows an example of a dual-frequency RF magnetic system, according to the disclosed technology.

FIGS. 9A-9D are oblique views of alternative secondary resonator configurations according to the disclosed technology.

FIGS. 14A-14E are diagrams illustrating the operation of an example circuit model of the disclosed technology.

FIG. 22 shows an implanted mouse prepared for MRI, above a primary transmitter surface coil.

FIGS. 23A-23B show bioluminescence images of the mouse of FIG. 22.

FIGS. 30A-30B show a perspective view of an assembly, with a phantom vial located between a phased array primary receive only coil set and a secondary receiver resonator with detuning circuit according to disclosed technology, for operation within a transmit body coil.

FIGS. 31A-31B show experimental data for a transverse cross-section of a phantom imaged with and without the disclosed technology.

DETAILED DESCRIPTION

Terminology

Figure 3B:
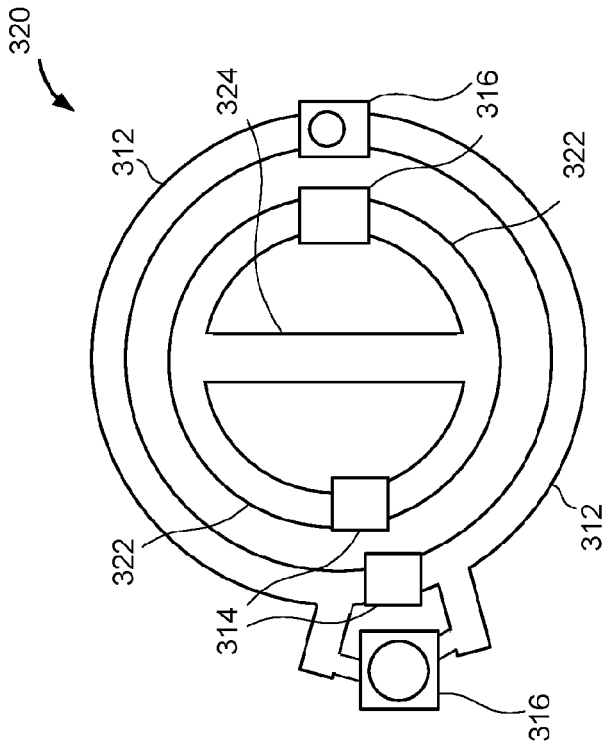
FIGS. 3A-3B illustrate single-frequency and dual-frequency secondary resonator designs, according to disclosed technology.

An "antenna" is a transducer which converts alternating currents into RF electromagnetic fields or vice versa. Some antennas are formed of electrically conducting material, optionally with additional discrete components, in the shape of coils or other structures.

The "contrast" of an object represented in an image is a difference in intensity, luminance, color, or other image characteristic that renders the object distinguishable over the background or over other objects. The term "image contrast" is shorthand for contrast of one or more objects in the image.

A "figure-eight" shape or topology of a circuit refers to a circuit comprising two adjacent non-overlapping loops in which currents flow in opposite senses (see e.g. figure-eight resonator such as shown in FIG. 6B). A figure-eight shape can be smoothly formed (e.g. "8") or can include any combination of piecewise linear or curved segments.

An "image" refers to a viewable image of a specimen as well as stored representations of such a viewable image. In an MRI system, an image of the specimen is formed from analysis of detected magnetic resonance signals from one or more targeted nuclides. The term "$^1H$ imaging" is shorthand referring to the acquisition of $^1H$ magnetic resonance signals and optionally analysis of these signals to obtain an image representing a distribution of $^1H$ nuclei in an imaged sample. "$^{19}F$ image" is shorthand referring to an image of tissue or another sample based on magnetic resonance signals of $^{19}F$ nuclei, and similarly for other targeted nuclides such as $^{31}P$ or $^{13}C$.

A "loop" of a circuit is a closed or substantially closed portion of an electrical circuit enclosing an area through which magnetic flux can pass. A substantially closed portion of an electrical circuit is one that is closed when projected along magnetic field lines onto a two-dimensional surface. Thus, a wire bent into a circle can form a single loop, a two-turn coil can form two loops, a figure-eight coil can form two loops, or an N-turn coil can form N loops. However, the number of loops of a particular circuit can also vary depending on its orientation relative to a magnetic field in which the circuit is placed. Loops can overlap, as in a two-turn coil (see e.g. resonator 110 in FIG. 1A) or can be disjoint (see e.g. a figure-eight shaped resonator such as resonator 611 shown in FIG. 6B). The shape of a loop can be circular, oval, square, hexagonal, octagonal, polygonal, or another closed shape. Loops can incorporate any combination of straight and curved segments, with angular or smoothly curved junctions between segments.

"Magnetic field" is used to represent the physical quantity sometimes known more formally as magnetic flux density or magnetic induction, represented by the symbol B, and measured in Tesla. As will be clear from the context, this term is variously used to refer to the field itself, its vector amplitude (denoted B), or its scalar amplitude (denoted $B \equiv |B|$). Some usages may be further qualified by a subscript, suffix, or other designator representing a particular component of the total magnetic field. In an MRI environment, example components of the magnetic field include the main field $B_0$; gradient fields Gx, Gy, Gz; induced magnetization M; and RF field $B_1$. The term magnetic field strength solely refers to the scalar field amplitude B.

The main field is generated by one or more main field magnets (e.g. coils) and is the largest component of the magnetic field; gradient fields are generated by respective gradient coils, and superposed on the main field to allow distinguishing spatial slices based on nuclear magnetic resonance frequency; induced magnetization is the magnetic field generated by a material placed in the externally applied magnetic field(s); RF magnetic field is generated by one or more RF antennas (e.g. coils) to provide time-varying magnetic fields at or near magnetic resonance frequencies of particular nuclides.

The symbol "$B_1$" denotes an RF magnetic field associated with an RF antenna of an MRI system. The transmit rotating RF magnetic field applied to nuclei in the sample volume is denoted by vector $B_1^+$, having scalar amplitude $B_1^+ \equiv |B_1^+|$. The receive rotating RF magnetic field is denoted by vector $B_1^-$, having scalar amplitude $B_1^- \equiv |B_1^-|$ and units of e.g. Tesla. In some examples, but not necessarily, a single antenna can be both a transmit and receive antenna, in which case the field patterns of $B_1^+$ and $B_1^-$ are similar. In embodiments of the disclosed technology, $B_1^+$ has a "primary" RF magnetic field component $B_{1T}$ due to a transmit antenna acting by itself, and a "secondary" component $B_{1L}$ due to a secondary resonator placed within the primary RF magnetic field.

"Magnetic resonance" is a condition under which the precession frequency of a nuclear magnetic spin matches the frequency of an applied $B_1^+$ field. The precession frequency f of a nucleus in a magnetic field B can be determined by the Larmor formula:

$$f = \frac{\gamma B}{2\pi},$$

where $\gamma$ is the gyromagnetic ratio of the nucleus. At or near magnetic resonance, the $B_1^+$ field exerts a torque on the nuclear magnetic spin, causing the orientation of the nuclear magnetic spin to change. After the $B_1^+$ stimulus is removed, the disturbed nuclear magnetic spin continues to precess in the total magnetic field (typically dominated by $B_0$) at its resonant frequency, which generates an RF magnetic field ($B_1$) that can be detected and analyzed. The resonant frequency of an atomic nucleus depends on its gyromagnetic ratio and the amplitude of the magnetic field in which it is immersed.

"MRI signals" (also "magnetic resonance signals," "imaging signals," or simply "signals") are signals originating from the detection of precessing nuclei in the sample volume of an MRI machine. Precessing nuclei can induce small currents in a receiving antenna (in some examples, the same as the RF transmit antenna) which can be detected by any combination of filters, amplifiers, or digitizers, and can be stored, recorded, reproduced, or presented in analog or digital form. An MRI signal can refer to any of these signals at any stage of the signal acquisition or processing.

"Nuclide" refers to a species of atomic nucleus, particularly nuclei of a particular isotope. "Nucleus" and "nuclei" refer to the nuclei of one or more individual atoms. Because different nuclides have different gyromagnetic ratios and therefore different resonance frequencies in a given magnetic field, they can be detected separately using RF magnetic fields $B_1$ at different respective frequencies.

The "operating frequency" of an MRI system is the frequency of a primary oscillatory magnetic field applied to a region of interest or a sample volume, and is often at or near the magnetic resonance frequency of a particular nuclide within the region of interest or sample volume.

A "passive circuit" is an electrical circuit whose operation does not depend on inclusion of one or more components that generate electrical or magnetic energy from internal energy stored as other than an electric field or a magnetic field. Energy stored in an inductor or capacitor is stored as magnetic field or electric field, respectively, and accordingly a passive circuit can incorporate inductors and capacitors. Whereas, a battery or fuel cell is considered to store chemical energy, and accordingly a passive circuit cannot incorporate a battery. Electrical currents can flow in a passive circuit, and magnetic fields can be created by a passive circuit, particularly when driven by energy from external sources. Common "passive circuits" comprise some combination or subcombination of the passive components listed below.

A "passive component" is an electrical circuit component that is incapable of power gain. Examples of passive components include resistors, capacitors, inductors, wires, and diodes. "Wires" includes conductive traces on printed circuit boards and electrical conductors in other form factors.

"RF" stands for radio frequency, covering a range from about 300 kHz to about 300 GHz (the RF frequency range), and is generally understood to refer to electromagnetic radiation and processes in that frequency range. "RF" is also used as an adjective to describe components, processes, quantities, or attributes thereof, that are operable at or associated with processes occurring at a frequency or range of frequencies within the RF frequency range.

A "region of interest" is a portion of a sample or sample volume from which magnetic resonance images are sought. "Region of interest" refers to a region over which magnetic resonance signals are gathered, analyzed, or rendered by a computer, or over which performance parameters of an MRI system are evaluated or specified, and does not refer to any human interest.

A "sample volume" of an MRI system is a space within which a specimen or sample can be placed. The sample volume can be fully or partially defined by an enclosure.

A "secondary resonator" is a passive circuit that generates a secondary oscillating magnetic field when situated in a primary oscillating magnetic field. The secondary resonator has a resonant frequency, and the response of the secondary resonator to the primary oscillating magnetic field depends on the relationship between the resonant frequency of the secondary resonator and the frequency of oscillation of the primary magnetic field. In some examples, the secondary resonator can be coupled to a receive-only antenna or coil in an MRI system having separate transmit and receive antennas.

"Sensitivity" of an MRI system is the amount or concentration of a detected nuclide required to form an image. A small numerical value for sensitivity is generally better and indicates that the MRI system is more sensitive. The term "imaging sensitivity" refers to the sensitivity of an imaging system such as an MRI system. Because imaging sensitivity and image contrast can be related, the term "imaging uniformity" encompasses both uniform sensitivity and uniform contrast.

Introduction

As MRI technology evolves toward higher magnetic fields and correspondingly higher nuclear magnetic resonance frequencies, the RF wavelength decreases, leading to increased percentage variations in RF magnetic field amplitudes over a region of interest or a sample volume. The disclosed technology provides a more homogeneous RF magnetic field at one or more operating frequencies of an MRI system, leading to more uniform image contrast and more uniform imaging sensitivity.

A passive circuit, such as a wire loop or an LC circuit, can experience induced current when subject to a changing magnetic field, according to Faraday's law of induction. The induced current can in turn generate an induced secondary RF magnetic field, so that the passive circuit acts as a secondary resonator. Deployed according to the disclosed technology, the passive circuit can be used to shim a primary RF magnetic field in a sample volume of an MRI system, without any RF cables or associated RF source equipment. The disclosed technology can be applied both to dual-frequency MRI systems, and to single-frequency systems with separate transmit and receive antennae. In some examples, a detuning circuit can be incorporated to minimize interference between a body transmit RF coil and a disclosed secondary resonator.

As described below, the relative phase of the induced RF magnetic field (referred to the primary RF magnetic field) can be controlled by suitable selection or adjustment of a resonant frequency of the passive circuit, in relation to the frequency of the primary RF magnetic field.

Examples are described for transmit coils, wherein the disclosed technologies provide improved uniformity of $B_1^+$. However, through the principle of time-reversal symmetry, the $B_1^-$ pattern is also made more uniform, providing better coupling from precessing nuclei to the receive coil (assuming the transmit and receive coils are the same) from off-center locations in the sample volume, as compared to operation without the passive secondary circuit.

Through the disclosed technologies, improved MRI images can be obtained, including multi-nuclear images, extending the many advantages of MRI into the realm of high-field dual-frequency imaging. For example, MRI is non-invasive, free from ionizing radiation, offers excellent soft tissue contrast, supports various contrast mechanisms, and provides enough depth of imaging to cover a whole human body. The disclosed technology can be applied, for example, to track migration and survival of cellular therapies after their placement into patients, to identify optimal routes of cell delivery, cell dosing, and product mode of action. Functional imaging can also be performed, for example same-breath triple MRI with $^1$H, $^3$He, and $^{129}$Xe to study lung function.

Example Electromagnetic RF Shim

FIGS. 1A-1B illustrate two different views of an example RF magnetic field shim for use with a dual frequency MRI system. The shim operates on electromagnetic principles and effects changes in an MRI RF field, particularly changes in one or more of the amplitude, direction, or field distribution pattern over a sample volume of the MRI system. The dual-frequency MRI system generates an RF magnetic field $B_1^+$ at a first operating frequency to detect a first target nuclide, and generates an RF magnetic field $B_1^+$ at a second operating frequency to detect a second target nuclide. Without loss of generality, the first operating frequency is considered to be the lower of the two operating frequencies in this disclosure. The RF magnetic field shim incorporates a passive circuit 110 optionally having at least one adjustable component. In some embodiments, the first operating frequency can be that at which $^{19}$F nuclei are resonant in a main magnetic field $B_0$, or at which $^{19}$F imaging signals are acquired. In some embodiments, the second operating frequency can be that at which $^1$H nuclei are resonant in a main magnetic field $B_0$, or at which $^1$H imaging signals are acquired.

FIG. 1A shows the passive circuit 110 in a pictorial view. The illustrated RF magnetic field shim incorporates two loops 120 formed of an electrically conductive material, four fixed-value capacitors 130, and one variable capacitor 140. When placed in an RF magnetic field (dubbed the primary magnetic field), the conductive loops 120 experience an induced electromotive force (EMF) through Faraday's law (induced EMF equals the rate of change of magnetic flux, with appropriate signs). The induced EMF causes an induced current to flow, dependent on the total impedance of the passive circuit 110 at the frequency of the primary magnetic field. The induced current in turn creates an induced magnetic field that is superposed on and "shims" the primary RF magnetic field.

FIG. 1B shows the passive circuit 110 in a circuit diagram. The loops are represented by an inductor 122 and a mutual inductance M, to be described further. The circuit diagram also shows fixed capacitors 130 and an optional variable capacitor 140 corresponding to the components in FIG. 1A. The inductor 122 represents the inductance (short for "self-inductance") of the conductive loops 120, while mutual inductance M represents the coupling between passive circuit 110 and a transmit antenna 160 generating the primary RF magnetic field. Thus, circuit 110 is passive, yet currents can be made to flow through it due to its coupling to the externally driven transmit antenna.

In FIG. 1B, the capacitors are all grouped together and the inductor 122 is shown as a single lumped element, whereas in FIG. 1A the loops are shown formed of electrically conductive segments joined by the several capacitors 130, 140. Because FIG. 1A is a circuit diagram, series components can be arranged in any order without affecting the circuit behavior. However, the physical embodiment can be subject to spatial effects and parasitic effects whereby the ordering of components can make a practical difference. In the present instance, the physical embodiment of adjustable passive circuit 110, as shown in FIG. 1B, can be implemented with segmented loops to alleviate build-up of charge (and attendant electric fields) along a long unbroken wire segment due to the induced EMF. FIG. 1B illustrates that passive circuit 110 has no external wire or cable connections, and operates by inductive coupling from transmit antenna 160.

In the illustration of FIG. 1A, the passive circuit 110 has two loops, however this is not a requirement. In other embodiments, a passive circuit 110 can have one loop, three loops, four loops, or any integer number of loops, up to six, twelve, or even more. The loops can be substantially similar in one or more attributes (e.g. concentric, coplanar, the same size, the same shape, same material, same material cross-section), or can vary in any one or more of these attributes, in any combination. The segmentation of the loops can be in just one segment (with one capacitively coupled junction), or two segments, three segments, four segments, or any integer number of segments, up to six, twelve, or even more.

In the illustration of FIGS. 1A-1B, the passive circuit 110 has a single adjustable component which is a variable capacitor, however this is not a requirement. In other embodiments, an adjustable passive circuit 110 can have two, three, four, or any number of adjustable components, up to six, twelve, or even more. Moreover, adjustable inductors can be used. The inductance of the conductive loops can also be varied mechanically, by altering the enclosed area of the conductive loops (e.g. by changing the shape or size of one or more conducting loop), by changing the number of loops in the passive circuit, or by altering a wire cross-section of the conductive material. Where more than one adjustable component is used, the adjustable components can be of different types. Adjustable resistors can beneficially provide control of the quality factor Q of a passive circuit in some examples, and can concurrently affect the resonant frequency of the passive circuit.

Because the passive circuit 110 comprises both conductive loops having an inductance, as well as capacitors, it functions as an LC circuit (which can be regarded as either a series LC circuit or as a parallel LC circuit) having a resonant frequency $$f = \frac{1}{2\pi\sqrt{LC}}$$

when the circuit is unloaded.

The passive circuit 110 has a resonant frequency that is between the first and second operating frequencies of the dual-frequency MRI. Such a passive circuit 110 can advantageously shim the RF magnetic field at the (lower) first operating frequency to improve uniformity of the RF magnetic field over a region of interest or a sample volume. In examples, the resonant frequency of circuit 110 can be selected to be closer to the first operating frequency than to the second operating frequency. Circuit 110 can provide a strong effect at the first operating frequency (better homogeneity of $B_1^+$), and can provide only a weak effect at the second operating frequency (insignificantly worse homogeneity of $B_1^+$). In multi-nuclear MRI having more than two operating frequencies, the resonant frequency can be in between any two neighboring frequencies of operation, for advantageously shimming the RF magnetic field at the lower of the two neighboring operating frequencies.

Example with Two Secondary Resonators

The passive circuit 110 is dubbed a "secondary resonator," as it generates a secondary RF magnetic field when placed in a primary RF magnetic field and is an LC resonant circuit (even though, under normal operating conditions, it is operated close to resonance, but not at resonance). The passive circuit 110 has been described as improving field homogeneity at the (lower) first operating frequency of a dual-frequency MRI machine.

In examples, a second passive circuit can be used to improve the homogeneity at the (higher) second operating frequency. That is, two secondary resonators can be used in combination to improve image quality at both operating frequencies of a dual-frequency MRI. FIG. 2 shows an oblique view of a portion of a dual-frequency MRI system 200. In this illustration, secondary resonator 210 can be an embodiment of passive circuit 110. Secondary resonator 211 can be a passive circuit similar to 210 or 110, or dissimilar, as described further. For purpose of illustration, both secondary resonators 210, 211 are shown as circular structures, however this is not a requirement. A common central axis 205 is shared by both secondary resonators 210, 211 and a dual-frequency primary transmit structure 260, which can include one or more antennas configured to generate primary RF magnetic fields. Sample volume 250 generally is situated between the transmit structure 260 and the secondary resonators 210, 211.

Like the first passive circuit 110, the second passive circuit 211 can incorporate one or more loops of an electrically conductive material, and one or more capacitors. The operating principle of the second passive circuit is similar to that of the passive circuit 110, and the second passive circuit 211 can have a resonant frequency that is higher than the second operating frequency. In some embodiments, the second passive circuit 211 can have at least one adjustable component with which its resonance frequency can be tuned, while in other embodiments, the second passive circuit 211 has no adjustable components. This is because the range of suitable resonant frequencies for the second passive circuit 211 can be significantly wider than for the first resonator 210. In embodiments where the second passive circuit 211 does have an adjustable component, the operation of the dual-frequency MRI system 200 for imaging at the second frequency can be optimized suitably for different samples.

In embodiments with two secondary resonators, the two secondary resonators can be coplanar or in different planes, can be concentric or have offset centers, can be the same shape or different shape, or can have the same enclosed area or different enclosed areas. In some embodiments, the secondary resonator at the first operating frequency is larger than the secondary resonator at the second operating frequency.

Transmit structure 260 can incorporate one or more antennas for generating RF magnetic fields at one or more of the operating frequencies of MRI system 200. In some embodiments, a single antenna can serve at two or more operating frequencies, while in other embodiments, the two or more separate antennas can be used at respective operating frequencies. A transmit antenna can include a drive coil of one or more turns and can include one or more discrete components or transmission line segments. A drive coil of a transmit antenna can be circular, elongated, planar, or can conform to a curved surface surrounding a sample volume of the MRI system 200.

A secondary resonator can have respective mutual inductances with the one or more transmit structures and other secondary resonators. In some embodiments with two transmit structures for different frequencies, a secondary resonator that homogenizes the RF magnetic field at one frequency can have greater mutual inductance with the transmit structure for that frequency, compared with the mutual inductance(s) to other transmit structure(s) or compared with the mutual inductance(s) to other secondary resonator(s). In embodiments, the mutual inductances correspond to a configuration of the MRI system that is ready for imaging, with a sample in the sample volume.

Examples of Combined $^{19}F/^{1}H$ Secondary Resonators

Figure 3A:
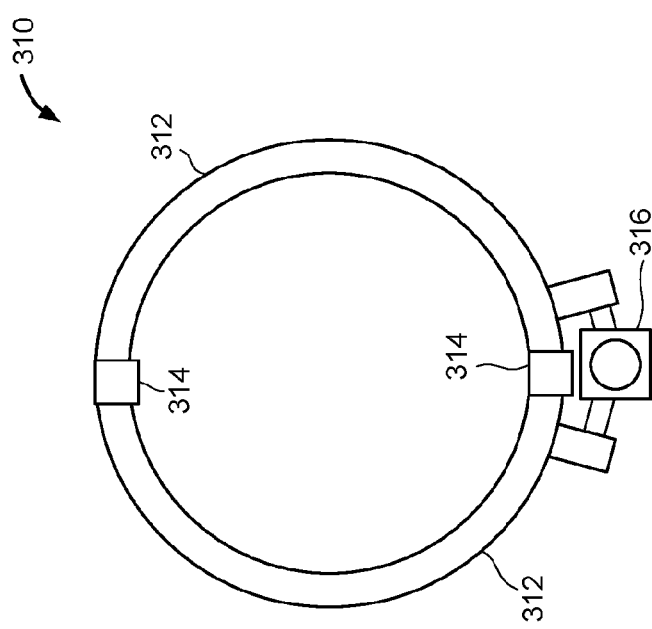

FIGS. 3A-3B illustrate single-frequency and dual-frequency secondary resonator designs. FIG. 3A shows single-frequency secondary resonator 310 comprising a segmented copper ring 312, the segments being joined by two fixed capacitors 314 and one adjustable capacitor 316. For use in $^{19}F$ imaging at 7.0T, the secondary resonator 310 can be tuned for resonance (in the presence of the sample) above the $^{19}F$ operating frequency. In this example, the operating frequency for $^{19}F$ imaging can be $f_1=282$ MHz, and the resonance frequency of resonator 310 can be $F_1=287$ MHz$>f_1$.

Among contrast agents, $^{19}F$ in the form of a perfluorocarbon holds particular interest because it is naturally absent from biological specimens and consequently the distribution of $^{19}F$ can be imaged with no background level and high dynamic range. Perfluorocarbons are readily quantified to obtain an accurately determined dose level of $^{19}F$, and the covalently bonded $^{19}F$ labeled molecules are relatively inert and provide a good safety profile.

FIG. 3B shows a dual-frequency secondary resonator 320. The outer resonator circuit comprising segmented copper ring 312 is substantially similar to secondary resonator 310 of FIG. 3A, except that in this illustration, the outer resonator circuit utilizes two adjustable capacitors 316 and one fixed capacitor 314. As for resonator 310, the outer circuit of resonator 320 can be tuned for resonance above the $^{19}F$ operating frequency, to provide improved $^{19}F$ imaging quality as discussed herein, e.g. with reference to FIG. 21 or 29 described below. Resonator 320 also includes an inner resonator circuit comprising segmented copper ring 322 along with a crossbar 324. The segmented copper ring 322 is also joined by a fixed capacitor 314 and an adjustable capacitor 316. The inner circuit of resonator 320 can be tuned for resonance above the $^1H$ operating frequency, to provide improved $^1H$ imaging quality as discussed herein, e.g. with reference to FIG. 26, 27, or 28 described below.

Figure 4:
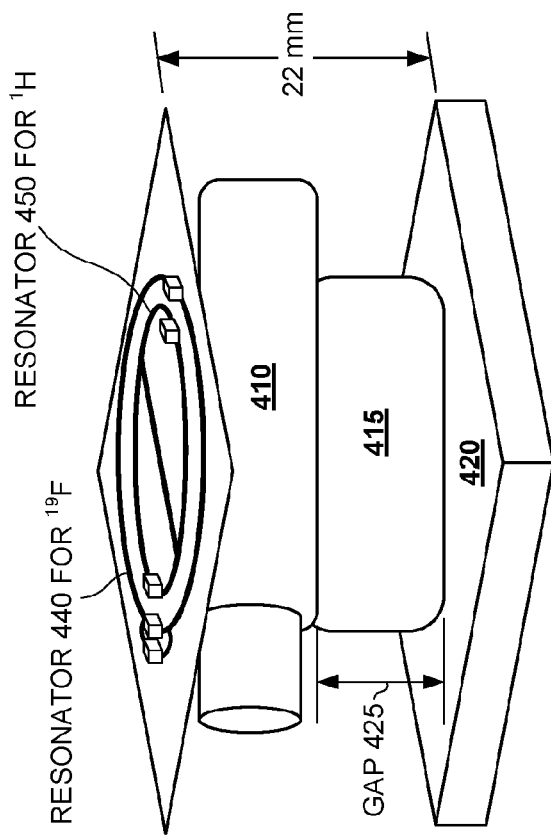
FIG. 4 shows a perspective view of an assembly, with a phantom vial located between a prior art primary transmitter surface coil and a dual-frequency secondary resonator according to disclosed technology.

FIG. 4 shows a perspective view of an assembly, with a phantom vial 410 located between a commercial primary transmitter surface coil 420 and a dual-frequency secondary resonator similar to 320, comprising outer resonator 440 for improving RF field uniformity at the $^{19}F$ operating frequency and inner resonator 450 for improving RF field uniformity at the $^1H$ operating frequency. In this illustration, the sample coil is positioned with a gap 425 of 6 mm to the surface coil, provided by spacer 415. The overall spacing of 22 mm between primary transmitter surface coil 420 and the dual-frequency resonator assembly 440, 450 reflects the size of a sample volume in e.g. a small animal MRI system. The phantom and its applications are described further below in context of FIGS. 20-21.

FIGS. 5A-5E illustrate a variety of designs for a dual-frequency electromagnetic shim. FIG. 5A illustrates a design having two secondary resonators 511, 512 in the shape of simple circular coils. The outer resonator 511 can be similar to passive circuit 310 described above. The inner resonator 512 can be tuned to have a resonance above the $^1H$ operating frequency. FIG. 5B illustrates a design similar to 320, in which an inner circuit 522 has a crossbar. The inner circuit 522 can support induced currents in different modes. When placed in an azimuthally symmetric primary RF magnetic field, the $^1H$ resonator operates in "common mode" with currents flowing around the circular loop exactly as in the simple coil of FIG. 5A. However, when placed in an azimuthally antisymmetric primary RF magnetic field (similar to FIG. 7), the $^1H$ resonator operates in "differential mode," with currents flowing in opposite directions around the two halves of the circular loop, similar to the operation of a figure-eight resonator. A particular advantage of this design is that it can be matched to an unknown transmit antenna. Outer resonator 521 can be similar to passive circuit 310 described above.

FIG. 5C illustrates a design in which the $^1H$ resonator 532 has a figure-eight topology, considered further below. The $^{19}F$ resonator 531 can be similar to passive circuit 310 described above. For purpose of illustration, capacitors or adjustable components have been omitted from the depiction of resonators 512, 522, and 532 in FIGS. 5A-5C.

FIG. 5D illustrates a design having a single $^{19}F$ resonator 541 and two separate $^1H$ resonators 542-543, each of which is in the shape of a simple generally circular coil. The two resonators 542-543 can operate together in a primary RF magnetic field as a phased array.

FIG. 5E illustrates a design having a single $^{19}F$ resonator 551 in a figure-eight configuration and two generally circular separate $^1H$ resonators 552-553. The two resonators 552-553 can operate together in a primary RF magnetic field as a phased array.

Although the resonators of FIGS. 5D-5E are variously depicted as generally planar, coplanar, or circular, these are not requirements. Phased arrays of independent resonators can be non-planar, in different planes, and have various non-circular shapes. Although FIGS. 5D-5E show a phased array configuration for $^1H$ resonators, a phased array can alternatively be used for $^{19}F$ resonators, or for both $^{19}F$ and $^1H$ resonators. For purpose of illustration, capacitors or adjustable components have been omitted from the depiction of resonators 542-543, and 551-553 in FIGS. 5D-5E.

Example Symmetry Considerations

FIGS. 6A-6B show different symmetry relationships between primary and secondary magnetic fields. For clarity of illustration, FIGS. 6-7 show the shapes of transmit antennas and secondary resonators in oblique view; details such as discrete components, adjustable components, or numbers of loops have been omitted.

FIG. 6A shows an MRI configuration in which primary transmit antenna 660 and secondary resonator 610 are both nominally circular, with a common axis of symmetry 605, and are situated on opposite sides of a sample volume 650. In such a configuration, antenna 660 generates a primary magnetic field 662 shown by solid lines. The changing magnetic flux through the secondary resonator 610 generates a secondary magnetic field 612 as shown by dashed lines, when the secondary resonator 610 is tuned as disclosed herein. In this configuration, the primary component of the RF magnetic field in the sample volume is parallel to the axis 605.

FIG. 6B shows an MRI configuration in which primary transmit antenna 661 and secondary resonator 611 are both nominally in a figure-eight shape. Solid lines show the primary magnetic field 663 for this configuration. The current in the primary transmit antenna 661 and the primary magnetic field 663 are both antisymmetric about the axis 606, that is, a 1800 rotation of the transmit antenna 661 about the axis 606 causes both the antenna current and the primary magnetic field to switch sign or be inverted. Unlike in FIG. 6A, the predominant component of the magnetic field within the sample volume 651 is transverse to the axis 606. The primary magnetic flux passing through the two halves of the secondary resonator 611 are opposite in sign, but, because of the figure-eight configuration of the secondary resonator the sense of the wire loop is also opposite, and the induced EMF over the two halves add in phase. The resulting secondary magnetic field 613 (dashed line) is similarly predominantly transverse to axis 606.

In both FIGS. 6A-6B, the symmetry of the secondary resonator matches the symmetry of the primary transmit antenna, the coupling between the primary transmit antenna and the secondary resonator is relatively strong, and the secondary magnetic field can be effective at improving the homogeneity of the RF magnetic field.

Exchanging secondary resonators between FIGS. 6A-6B would lead to poor coupling between primary transmit antenna and secondary resonator. The azimuthally symmetric magnetic field of primary transmit antenna 660 would lead to cancellation of induced EMF between the two halves of a figure-eight secondary resonator and substantially no secondary magnetic field would be generated. Similarly, the asymmetric magnetic field of primary transmit antenna 661 would result in a net magnetic flux of zero through a circular secondary resonator, and substantially no secondary magnetic field would be generated. However, cancellation can be avoided by displacing the axes or changing the relative orientation of primary transmit antenna and secondary resonator. Therefore, in some examples, a combination of symmetric and antisymmetric types of antenna/resonator can be used effectively.

In some embodiments, the frequency separation between the first and second frequencies of a dual-frequency MRI system is sufficiently large that two simple circular secondary resonators can be used together at the first and second operating frequencies: the resonance frequency of each secondary resonator is far enough from the other operating frequency that the secondary resonators present a high impedance to each other and have very little interaction.

In other embodiments, such as with $^{19}$F and $^{1}$H, the two operating frequencies are relatively close and the secondary resonators can interact. Particularly, as the two secondary resonators have resonances on opposite sides of the $^{1}$H operating frequency, interaction can reduce the total secondary magnetic field generated during $^{1}$H imaging. Therefore, in some embodiments it can be advantageous to design the RF magnetic system so that the interaction between $^{19}$F components and $^{1}$H components is minimized. This can be done by exploiting the symmetry properties.

FIG. 7 shows an example of a dual-frequency RF magnetic system 700. For $^{19}$F imaging, primary transmit antenna 760 and secondary resonator 710 are both nominally circular and symmetric, while for $^{1}$H imaging, primary transmit antenna 761 and secondary resonator 711 are both figure-eight shaped and antisymmetric. Thus, each transmit antenna is well-coupled to its own secondary resonator, and only weakly coupled to each other or to the opposite secondary resonators; the two secondary resonators are also only weakly coupled to each other. With ideal geometry, the weakly coupled pairs could have zero coupling, however some coupling can arise due to mechanical tolerances, geometric imperfections, or asymmetry of the sample in the sample volume. In the illustration of FIG. 7, all antennas and resonators share a common axis 705; the sample volume 750 lies between each transmit antenna (e.g. 760, 761) and its corresponding secondary resonator (710, 711).

Example Variations

In biological applications, it is common to acquire images of samples having significant water content. As used in this disclosure, an "aqueous" sample is one having at least 10% water, by weight. Some aqueous sample incorporate at least 20%, at least 50%, at least 80%, or at least 90% of water by weight. The presence of water or other materials in a sample placed in the MRI sample volume, and subject to both primary and secondary RF magnetic fields, can cause loading of a secondary resonator which can affect its resonant frequency. In a 7 T machine for $^{19}$F/$^{1}$H imaging, the operating frequencies are around 282 and 300 MHz, i.e. separated by only 18 MHz. A small phantom vial containing an aqueous sample can pull the resonant frequency by a few MHz; a larger sample such as a mouse can pull the resonant frequency by a correspondingly larger amount, up to or greater than 10 MHz. Therefore, in some embodiments, the resonant frequency of a secondary resonator can be the resonant frequency in the condition that the secondary resonator is in proximity to the aqueous sample. The primary RF magnetic field transmit antenna and driver can also load the secondary resonator. In some embodiments, the loading on the secondary resonator due to the primary surface coil antenna can be insignificant, which can be less than 10% or less than 1% of the loading due to the sample, measured in terms of power dissipation or shift of resonant frequency.

A secondary resonator has a resonant bandwidth, which can be measured on a network analyzer. The resonant bandwidth is also affected by loading. During MRI operation, i.e. with sample in the sample volume, an MRI operating frequency can be within the resonant bandwidth of a secondary resonator used to shim the RF magnetic field at that MRI operating frequency. During MRI operation, i.e. with sample in the sample volume, an MRI operating frequency can be outside the resonant bandwidth of a secondary resonator used to shim the RF magnetic field at a different MRI operating frequency. A network analyzer can also be used to measure scattering parameters, such as $S_{11}$ reflection parameter, using a probe/pickup coil in a configuration similar to that described in context of FIG. 11.

A secondary resonator can be substantially circular, meaning that at least 90% of the conductive loop material (excluding capacitors, capacitor terminals, and other discrete circuit components) lies within 0.15×R of a circle of radius R. A secondary resonator can be substantially cylindrical, meaning that at least 90% of the conductive loop material (excluding capacitors, capacitor terminals, and other discrete circuit components) lies within 0.15×R of a right circular cylinder of radius R. A secondary resonator can be substantially planar, meaning that at least 90% of the conductive loop material (excluding capacitors, capacitor terminals, and other discrete circuit components) lies within two parallel planes separated by a perpendicular distance D, and the ratio of the enclosed area of the conductive loops to $D^2$ is greater than a threshold value. The threshold value can be in the range 10 to 10,000, for example 10, 30, 100, 300, 1,000, 3,000, or 10,000. A secondary resonator can conform to a curved surface around the sample volume, meaning that at least 90% of the conductive loop material (excluding capacitors, capacitor terminals, and other discrete circuit components) lies within two parallel curved surfaces separated by a perpendicular distance D, and the ratio of the enclosed area of the conductive loops (measured in a plane parallel to the curved surface) to $D^2$ is greater than the above-mentioned threshold value.

In some embodiments, a secondary resonator can incorporate a single conductive loop. The conductive loop of a secondary resonator can incorporate one or more of copper, aluminum, silver, gold, any alloy thereof, a high-temperature superconductor, or a classical superconductor. A high-temperature superconductor can be a material that exhibits superconductivity at some temperature greater than or equal to 77K (liquid nitrogen boiling point at 1 atmosphere), or exhibits superconductivity at some temperature greater than or equal to 300K (nominal room temperature). The conductive segments of a secondary resonator can be substantially made of any of the preceding materials, meaning that the electrically conductive segments have at least a threshold proportion of that material by weight. The threshold proportion can be in the range 50-99.99% inclusive, for example 80% or 90%.

A secondary resonator can incorporate from one to twenty capacitors. Zero, one, or more of the capacitors can be adjustable capacitors. An adjustable capacitor can be controlled mechanically, e.g. by turning a rotating member with a screwdriver (which can be a non-magnetic screwdriver if tuning is performed with magnetic field(s) activated), or electrically, such as a varactor. A secondary resonator can incorporate one or more discrete resistors or one or more variable resistors.

Figure 8A:
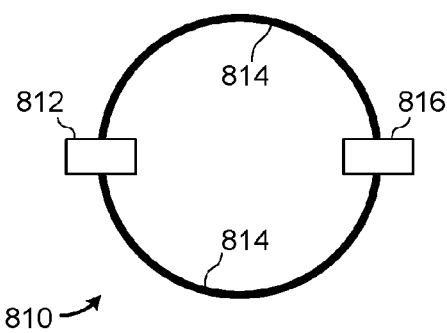
FIGS. 8A-8C illustrate alternative examples of adjustable passive circuits according to the disclosed technology.
Figure 8B:
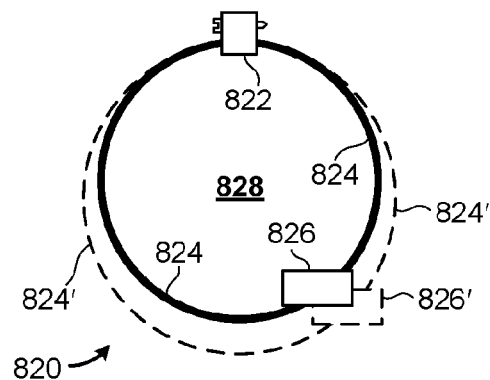
Figure 8C:
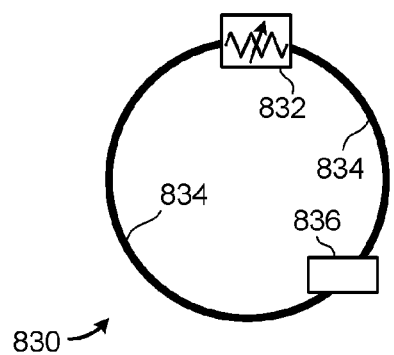

As described herein, adjustable components other than variable capacitors can be used to provide tunability of a secondary resonator. FIGS. 8A-8C illustrate alternative example designs of adjustable passive circuits.

FIG. 8A illustrates an example circuit 810 in which an adjustable inductor 812 is used in conjunction with electrically conductive segments 814 and capacitor 816 to form a tunable one-turn loop. Passive circuit 810 has a fixed inductance of its loop in addition to the adjustable inductance of inductor 812. Non-magnetic tunable inductors have been described in e.g. U.S. Pat. No. 8,248,198, and can be used in an MRI environment.

FIG. 8B illustrates an example circuit 820 in which a mechanical adjustment 822 such as a non-magnetic screw permits adjustment of the enclosed area 828 of the loop formed by electrically conductive segments 824 and capacitor 826. Through adjustment of the enclosed area 828, the loop inductance and resonant frequency of passive circuit 820 can be adjusted. Other mechanical arrangements such as scissor linkages and trombone sections can be used to alter the length and enclosed area of a passive circuit loop. Dashed lines show the loop distended by action of screw fitting 822, with electrically conductive segments 824' and capacitor 826' moved to new positions relative to the screw fitting 822.

FIG. 8C illustrates an example circuit 830 in which a variable resistor 832 provides adjustment of the Q of passive circuit 830, and further effect on the resonant frequency through the weak dependence of resonant frequency on resistance in a series LCR circuit. Circuit 830 further includes electrically conductive segments 834 and capacitor 836. Through adjustment of the enclosed area 828, the loop inductance and resonant frequency of passive circuit 820 can be adjusted.

As described herein, embodiments of secondary resonators can have a wide range of configurations. FIG. 1A shows a single secondary resonator having two concentric coplanar circular loops. FIG. 2, described below, shows two secondary resonators 210, 211 which are coplanar, concentric, and the same shape, but have different sizes. FIG. 7 shows two secondary resonators 710, 711 which are coplanar and concentric, but have different shapes.

FIGS. 9A-9D are oblique views of alternative secondary resonator configurations. For clarity of illustration, capacitors and adjustable elements are omitted from FIGS. 9A-9D.

FIG. 9A illustrates a single resonator 910 having two loops that are concentric but not coplanar.

FIG. 9B illustrates a compound resonator 920 having four disjoint passive circuits 921-924 that have different centers and respective axes 925-928 tilted relative to the axis 929 of a primary transmit antenna (not shown).

FIG. 9C illustrates a single resonator 930 having a single non-circular loop that is not planar but conforms to a curved surface.

FIG. 9D illustrates two secondary resonators 940, 941 that are not coplanar, concentric, the same shape, or the same size. Resonator 940 is planar and circular and intended for a localized RF field for a small region of interest of a first target nuclide. Resonator 941 conforms to a curved surface and is elongated for a larger region of interest of a second target nuclide.

Example Method

Because of loading, it can be desirable to tune the resonant frequency of a secondary resonator prior to imaging, to provide a substantially optimized shimming of the RF magnetic field, to increase signal to noise ratio and reduce standard deviation of imaging sensitivity across a region of interest of a sample within the MRI system's sample volume.

Figure 10:
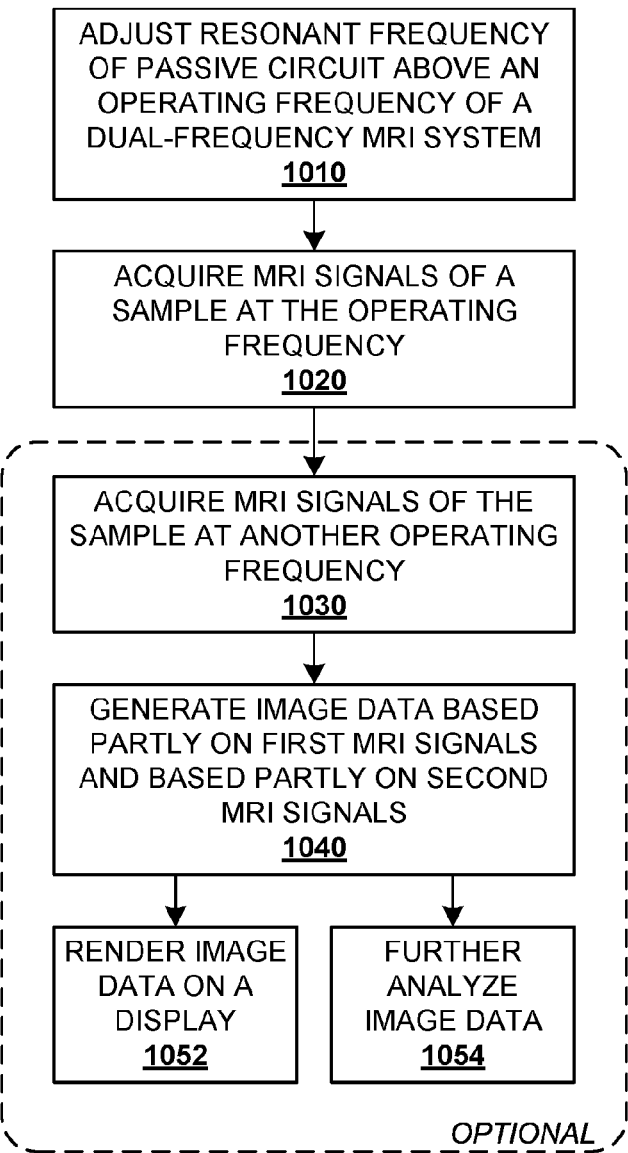
FIG. 10 describes an example method according to the disclosed technology.

FIG. 10 describes an example method. At process block 1010, a secondary resonator, which can be similar to one of the passive circuits described herein, is tuned to a first resonant frequency while situated in an operating environment, near to a sample in the sample volume of an MRI system. For imaging a first nuclide (e.g. $^{19}$F) at a first operating frequency of the MRI system, the first resonant frequency is above the first operating frequency, and below a second operating frequency of the MRI system. At process block 1020, MRI signals are acquired at the first operating frequency.

In some embodiments, the method can be extended with one or more optional process blocks. As shown at optional process block 1030, MRI signals are also acquired at the second operating frequency for imaging a second nuclide, e.g. $^1$H. At process block 1040, the MRI signals can be combined to prepare joint or fused image data, which can be used, at process block 1052, to render the joint or fused image on a display. Alternatively or in addition, the image data can be further analyzed at process block 1054.

In some embodiments, tuning can be performed manually, e.g. by trimming a variable capacitor with a screwdriver, while in other embodiments tuning can be performed using an electrically operated actuator under electrical control, such as by pushbutton, dial, or slider. In further embodiments, a remote actuator can be computer-controlled. In some embodiments, tuning can be integrated with measurement of the resonant frequency of a secondary resonator, so that the resonant frequency measurement can provide feedback to the tuning operation. In other embodiments, tuning and resonant frequency measurement can be performed in alternating fashion. Resonant frequency measurement can be performed using one or more antennas such as a pickup coil for providing a source signal and detecting a received signal. In some embodiments, a single pickup coil can be used for both source and receiver, and the received signal can be measured by a VSWR (voltage standing wave ratio) meter, while in other embodiments a network analyzer can be used. By sweeping or stepping the source signal over a range of frequencies, the resonant frequency can be identified by observing a dip in the reflected signal, or other equivalent measurement.

Figure 11:
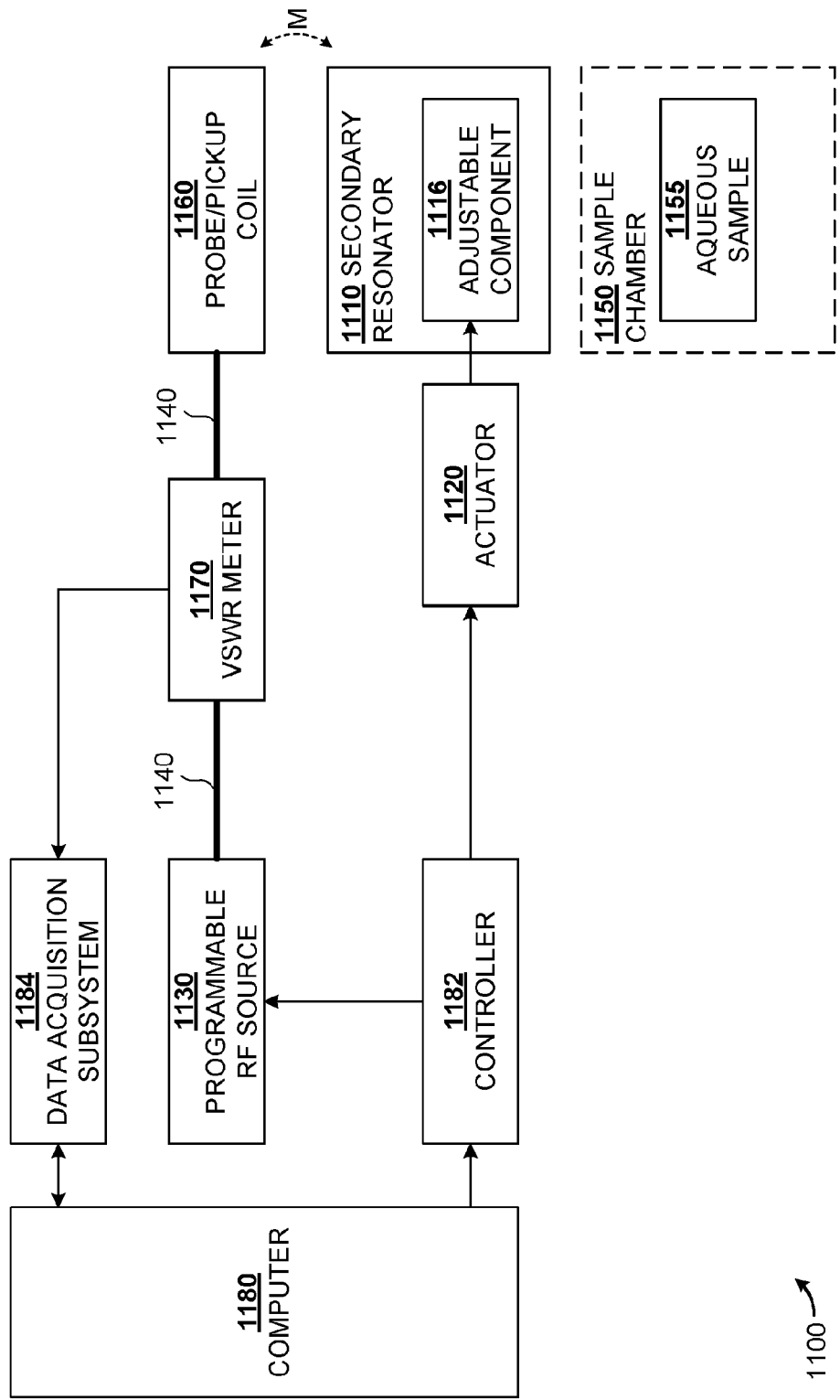
FIG. 11 illustrates an example tuning system for tuning a secondary resonator according to the disclosed technology.

FIG. 11 illustrates an example tuning system 1100 for tuning a secondary resonator 1110 that includes an adjustable component 1116, such as a varactor. Computer 1180 is configured to operate actuator 1120 to adjust the adjustable component 1116 via controller 1182, which can include a programmable logic controller, a motor controller, or a digital-to-analog converter. Computer 1180 also controls programmable RF source 1130 through controller 1182 or through another controller. The programmable RF source applies a selected RF signal (which can be a sweep signal, a chirp signal, or a stepped sequence through selected frequencies) to probe/pickup coil 1160 via transmission line 1140. The probe/pickup coil 1160 is situated in proximity to and coupled by mutual inductance M to the secondary resonator 1110. VSWR meter 1170 is situated on the transmission line 1140, and a measurement from the VSWR meter 1170 is relayed back to the computer 1180 via a data acquisition subsystem 1184. The VSWR measurements over multiple frequencies provides data from which the computer 1180 can be configured to extract the resonant frequency of the secondary resonator 1110. By comparing the measured resonant frequency with a target frequency, the computer can be configured to determine which direction to adjust the adjustable component 1116, and operate the actuator 1120 accordingly, until the measured resonant frequency is within a desired tolerance of the target frequency.

In some examples, the secondary resonator tuning can be performed in situ, with the secondary resonator 1110 placed in its operational position adjacent to or in proximity to the sample chamber 1150, with the sample 1155 to be imaged fixedly positioned with the sample chamber 1150. In some examples, a network analyzer can be used in place of VSWR meter 1170.

Example System

Figure 12:
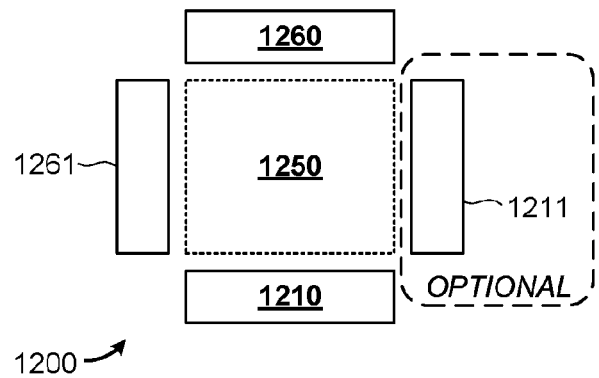
FIG. 12 shows an example system for improving magnetic field uniformity according to the disclosed technologies.

FIG. 12 shows an example system 1200 for improving magnetic field uniformity. Antenna 1210 is a secondary resonator situated in proximity to a sample volume 1250 of a dual-frequency MRI machine. The sample volume 1250 is shown for reference as dotted outline, being part of the environment of system 1200 and not necessarily part of the system 1200. First and second transmit antennas 1260, 1261 are also located near the sample volume 1250. Antenna 1260 is configured to generate an RF magnetic field $B_{1T,f1}$ at a first operating frequency f1 of the MRI machine, in order to cause precession of a first nuclide, whereby magnetic resonance signals of the first nuclide can be detected. Similarly, antenna 1261 is configured to generate an RF magnetic field $B_{1T,f2}$ at a second operating frequency f2 of the MRI machine, for stimulation and detection of a second nuclide. In the illustration, the sample volume 1250 is positioned between transmit antenna 1260 and its associated secondary resonator, the antenna 1210. The antenna 1210 is further configured to have a resonance frequency above the first operating frequency f1 and below the second operating frequency f2. The positions of antennas 1210, 1260, 1261 can be fixed in relation to the sample volume 1250. Antenna 1210 can improve the homogeneity of the RF magnetic field $B_{1T,f1}$ at the first operating frequency f1.

In the illustration, the sample volume is positioned between transmit antenna 1260 and its associated secondary resonator, the antenna 1210. Optionally, a second resonator, antenna 1211, can be fixedly positioned near the sample volume to provide improved homogeneity of the RF magnetic field $B_{1T,f2}$ at the second operating frequency f2. The resonance frequency of antenna 1211 can be configured to be above the second operating frequency of the dual-frequency MRI machine. In some examples, the resonance frequency conditions for the antennas 1210, 1211 are applicable with an aqueous sample to be imaged positioned within the sample volume 1250.

In the illustration, the antenna pairs (1260, 1210) and (1261, 1211) are located along different axes, but this is not a requirement of system 1200. In other examples, all antennas 1260, 1210, 1261, and 1211 can all share a common axis.

Example MRI Machine

Figure 13:
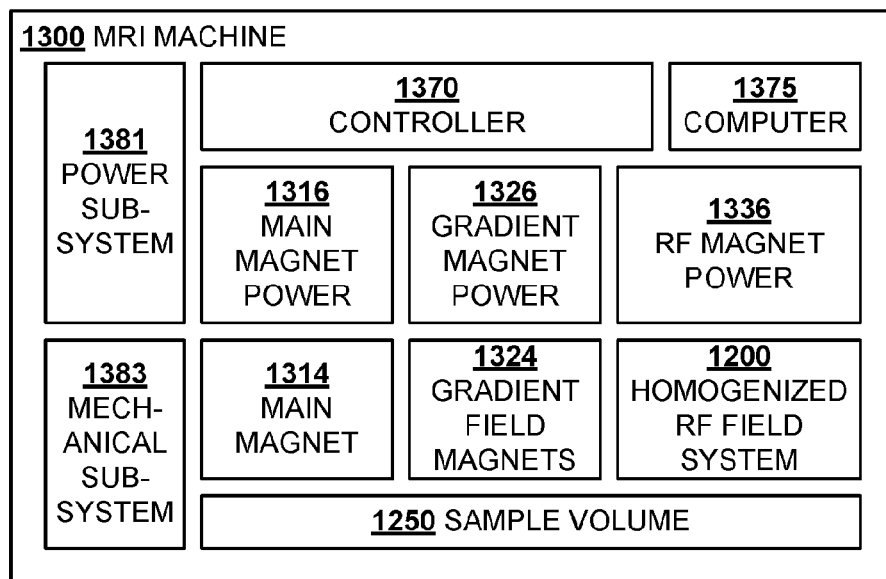
FIG. 13 shows an example MRI machine incorporating the disclosed technology.

FIG. 13 shows an example MRI machine 1300 incorporating the disclosed technology. The MRI machine 1300 incorporates a system 1200 as described above, incorporating two transmit antennas and at least one secondary resonator about a sample volume 1250 of the MRI machine 1300. MRI machine 1300 can additionally incorporate other components and subsystems, including one or more of: main field magnet 1314 and power supply 1316; gradient field magnets 1324 and power supply 1326; RF magnet power supply 1336; controller 1370; power subsystem 1381; or mechanical subsystem 1383. The mechanical subsystem can include one or more of: a translation stage, a sample container, or a belt or clamp to fasten a sample within sample volume 1250. The MRI machine 1300 can further include a computing node 1375, incorporating one or more processors with memory coupled thereto, and operable to acquire first MRI signals of a first nuclide at a first operating frequency and to acquire second MRI signals of a different second nuclide at a second operating frequency. The computing node 1375 can be further configured to generate an image or a fused dataset based partly on the first MRI signals and partly on the second MRI signals.

Theory of Operation

The theory of operation is described in context of FIGS. 14A-14E. FIG. 14A shows an equivalent circuit model of an example system. On the left, an RF voltage source $V_T$ drives a transmit coil load modeled as an inductor $L_T$ in series with a capacitor $C_T$, as a result of which a current $I_T$ flows in the left-hand circuit. Henceforth, and elsewhere in this disclosure, symbols such as $L_T$, $C_T$ are used to represent both the components themselves, and the value of their principal parameter. The quantities $V_T$, $I_T$ are assumed to be sinusoidally varying at a frequency $f_0$, which can be the resonant frequency of a target nuclide in the sample volume of an MRI system having a main field $B_0$. In this example, $f_0$=282 MHz, which can be the resonant frequency of $^{19}F$ in a $B_0$=7.0 T main magnetic field. The left-hand circuit can represent a $^{19}F$ transmit coil in a dual-frequency MRI system.

On the right-hand side of FIG. 14A is a passive secondary circuit modeled as an inductor $L_L$ in series with a capacitor $C_L$. The inductor $L_L$ can be a wire loop of one or more turns, in a circular shape or another shape. The capacitor $C_L$ can be any combination of fixed and variable capacitors. Because FIG. 14A is an equivalent circuit model, one or ordinary skill will appreciate that the components shown can be instantiated in many forms. For example, inductor $L_L$ can comprise four 90° arcs of a circle, and capacitor $C_L$ can comprise 3 fixed and one adjustable capacitor joining the arcs of inductor $L_L$. Likewise, $C_T$ can represent an equivalent capacitance arising through a Smith chart transformation of one or both of source $V_T$ or inductor $L_T$ along a transmission line.

The passive right-hand circuit is coupled to the driven left-hand circuit by the mutual inductance M between $L_T$ and $L_L$. The symbol $V_L$ represents not a tangible voltage source such as a battery (in which case the right-hand circuit would not be a passive circuit) but the induced electromotive force (EMF) arising in the right-hand circuit due to the inductive coupling between $L_T$ and $L_L$. The induced EMF $V_L$ applied to the series arrangement of $L_L$ and $C_L$ results in an induced current $I_L$ in the secondary circuit.

FIGS. 14B-14C show the primary and secondary components of the $B_1$ magnetic field for different configurations of the passive right-hand circuit of FIG. 14A. Two configurations are depicted side-by-side in perspective view, with the central axis (not shown) of the $B_1$ field oriented vertically on the drawing sheet. In both configurations, the lower circle represents the transmit side inductor (e.g. coil) $L_T$, and the primary field $B_{1T}$ is shown oriented vertically along the central axis, as indicated by the solid arrows. The upper circle represents the secondary circuit inductor $L_L$. In FIG. 14B, a configuration is shown with the secondary circuit having a resonant frequency of 287 MHz, which is above the operating frequency of $f_0$=282 MHz. Here, the induced current $I_L$ in the secondary circuit generates a secondary field $B_{1L}$ which is aligned with the primary field $B_{1T}$, as shown by the dashed arrows. In FIG. 14C, a configuration is shown with the secondary circuit having a resonant frequency of 277 MHz, which is below the operating frequency of 282 MHz. Here, the induced current $I_L$ in the secondary circuit generates a secondary field $B_{1L}$ which is opposed to the primary field $B_{1T}$, as shown by the dashed arrows. The difference between the left- and right-hand configurations can be achieved by adjusting a tuning capacitor. In the illustrated example, the value of $L_L$ was 18.3 nH, and the value of $C_L$ was adjusted between 16.8 pF and 18.0 pF to achieve the resonant frequencies shown.

FIGS. 14D-14E show exemplary waveforms of $B_{1T}$, $V_L$, $I_L$, and $B_{1L}$ for the same two circuit configurations as FIG. 14B-14C, respectively. In general, there can be a phase shift between the primary magnetic field $B_{1T}$ (which causes the induced current) and the secondary magnetic field $B_{1L}$ (caused by the induced current). The waveforms are all normalized to peak amplitude of 1. The waveforms $B_{1T}$ and $V_L$ are the same for both cases: $B_{1T}$ is sinusoidal at an operating frequency 282 MHz, and the induced voltage $V_L$ is proportional to $-dB_{1T}/dt$, where t represents time.

FIG. 14D shows the waveforms for the case with secondary circuit resonance $f_L$=287 MHz. Since the circuit is operating below resonance, at $f_0$=282 MHz, the combination of $C_L$ and $L_L$ appears capacitive, and the current $I_L$ leads the voltage. The secondary magnetic field $B_{1L}$ follows the secondary current $I_L$ as shown, and is substantially in phase with the primary magnetic field $B_{1T}$. As discussed herein, having $B_{1L}$ in phase with $B_{1T}$ causes the gradients of these two fields to partially cancel out, leading to improved field uniformity in the sample volume between $L_T$ and $L_L$.

FIG. 14E shows the waveforms for the case with secondary circuit resonance $f_L$=277 MHz. Since the circuit is operating above resonance, at 282 MHz, the combination of $C_L$ and $L_L$ appears inductive, and the current $I_L$ lags the voltage. The secondary magnetic field $B_{1L}$ follows the secondary current $I_L$ as shown, and is substantially out of phase with the primary magnetic field $B_{1T}$. As discussed herein, having $B_{1L}$ out of phase with $B_{1T}$ causes the gradients of these two fields to reinforce each other, leading to increased field variations and worsened field uniformity in the sample volume between $L_T$ and $L_L$.

Thus, the resulting $B_{1L}$ induced in the secondary circuit can be changed depending on the frequency where the secondary circuit is tuned.

For this illustration, the EMF $V_L$ can be calculated as $$EMF = V_L(t) = \oint E_T \cdot dl = -\frac{d\varphi_m(t)}{dt} = -\frac{d}{dt}\int\int B_{1T}(t)dS \quad (1)$$

where $E_T$ is the electric field vector along the secondary circuit, infinitesimal dl follows the path of the secondary circuit, $\varphi_m$ is the primary magnetic flux through the secondary circuit, and dS represents an element of a surface bounded by the secondary circuit.

The induced magnetic field $B_{1L}$ can be calculated under assumptions that both primary and secondary circuits have insignificant resistance, and the mutual inductance between $L_T$ and $L_L$ is weak enough that the primary circuit does not significantly load the secondary circuit for the purpose of calculating $I_L$ and $B_{1L}$.

Case 1: $f_L$=287 MHz>$f_0$=282 MHz

Here, the impedance $Z_L$ of the secondary circuit at $f_0$ is dominated by the capacitance $C_L$, and can be expressed as $$Z_L = j\omega L_L + \frac{1}{j\omega C_L} \quad (2)$$
$$= jX_1 \text{ for some } X_1 < 0$$

where $\omega$=$2\pi f_0$. $Z_L$ can be expressed in terms of an equivalent capacitance $C_{Eq}$ so that $$Z_L = \frac{1}{j\omega C_{Eq}}.$$

Then $$I_L \approx C_{Eq} \cdot \frac{dV_L}{dt} \quad (3)$$

which means that $I_L$ leads $V_L$ by 90°, as shown in FIG. 14D.

Case 2: $f_L$=277 MHz<$f_0$=282 MHz

Here, the impedance $Z_L$ of the secondary circuit is dominated by the inductance $L_L$ and can be expressed as $$Z_L = j\omega L_L + \frac{1}{j\omega C_L} \quad (4)$$
$$= jX_2 \text{ for some } X_2 > 0.$$

$Z_L$ can be expressed in terms of an equivalent inductance $L_{Eq}$ so that $Z_L$=$j\omega L_{eq}$ at the spot frequency $\omega$=$2\pi f_0$. Then $$V_L \approx L_{Eq.} \frac{dI_L}{dt} + M\frac{dI_T}{dt} \approx L_{Eq.}\frac{dI_L}{dt} \quad (5)$$

which means that $I_L$ lags $V_L$ by 90°, as shown in FIG. 14E.

This analysis considers a sinusoidal time-varying magnetic field; every periodic time-varying field can be decomposed into a superposition of sinusoidally time-varying fields by Fourier analysis.

The magnetic field can be considered at a central location between the passive circuit and a transmitter or antenna creating the primary magnetic field. If the frequency of the primary magnetic field is above the resonant frequency of the passive circuit, then the secondary magnetic field is shifted by more than 90° with respect to the primary magnetic field and serves to decrease (or counteract) the magnetic field scalar amplitude at the central location. Whereas, if the primary magnetic field frequency is below the resonant frequency of the passive circuit, then the secondary magnetic field is shifted by less than 90° with respect to the primary magnetic field and serves to increase (or reinforce) the magnetic field scalar amplitude at the central location.

In the reinforcing case, the secondary magnetic field becomes stronger as the observation point is moved from the central location towards the passive circuit, while the primary magnetic field becomes weaker because the observation point moving towards the passive circuit means that the observation circuit is moving away from the primary transmitter. The analysis is similar in the case that the observation point is moved from the central location away from the passive circuit and towards the primary transmitter. Because the gradients of the primary and secondary magnetic field vector amplitudes are opposite, the net result is that homogeneity of the magnetic field vector amplitude and homogeneity of the magnetic field scalar amplitude are both improved. For example, the ratio of standard deviation to mean of the magnetic field scalar amplitude over a region of interest, or sample volume, can decrease. As indicated by the analysis of Case 1 above, these benefits accrue whenever the resonance frequency $f_L$ of the passive circuit is greater than the operating frequency $f_0$ and the total impedance $Z_L$ of the passive circuit is capacitive. However, for fixed inductance $L_L$, as the resonance frequency $f_L$ is increased far above the operating frequency $f_0$, both $C_L$ and $C_{Eq}$ are reduced, and the induced current drops according to Equation (3).

Conversely, in the counteracting case, the decrease in primary magnetic field as the observation point is moved towards the passive circuit is exacerbated by an increase in secondary magnetic field that has opposite polarity to the primary magnetic field. Because the gradients of the primary and secondary magnetic field vector amplitudes are aligned, the net result is that homogeneity of the magnetic field vector amplitude and homogeneity of the magnetic field scalar amplitude are both worsened. For example, the ratio of standard deviation to mean of the magnetic field scalar amplitude over a region of interest, or sample volume, can increase.

Therefore, to improve magnetic field homogeneity, the passive circuit can be tuned to have a resonant frequency above the frequency of operation of the primary transmitter. This analysis is independent of the primary MRI magnetic field $B_0$, and is applicable for any sign, magnitude, or direction of $B_0$.

In an example, dual-frequency MRI application at 7.0T, $^{19}F$ and $^1H$ are used as two target nuclides for imaging, with magnetic resonance frequencies of approximately 280 MHz and 300 MHz respectively. A passive secondary circuit in the form of an LC resonator can be used, tuned to about 285 MHz or 287 MHz, has been found to work well, improving uniformity of the $^{19}F$ image, without adversely impacting the $^1H$ image. The passive secondary circuit can be sized comparably to the primary transmitter for efficient coupling, and the passive secondary circuit can be situated so that the MRI sample volume lies around the central location, in between the passive secondary circuit and the primary transmitter. That is, the passive secondary circuit and the primary transmitter can be situated on opposite sides of the sample volume.

Advantageously, the passive secondary circuit can be made tunable. Because the frequency separation of $^{19}F$ and $^1H$ is relatively small, and the loading of the secondary resonator due by a sample largely consisting of water can be several MHz or even greater than 10 MHz, it is desirable to tune the passive secondary circuit to have a suitable resonance frequency in the presence of the sample. Non-limiting examples of samples include: a phantom, a small animal such as a mouse, or a biological tissue sample.

Because time-varying electric and magnetic fields are related, through Maxwell's equations, high dielectric constant materials can also be used, with capacitive coupling, to shape magnetic fields within the sample volume. However, the inductively coupled passive resonator is advantageous because it is easily tunable, compact, and can be accommodated within the volume of a small-bore MRI such as a small-animal MRI.

Commercially available transmit and receive coils are often simple planar surface coils that have a rapid fall-off of magnetic field amplitude with distance from the coil (or, with depth in the sample volume). This limited RF magnetic field ($B_1$) uniformity can be problematic when attempting to image even relatively small volumes of an animal.

Numerical Simulations

Figure 15:
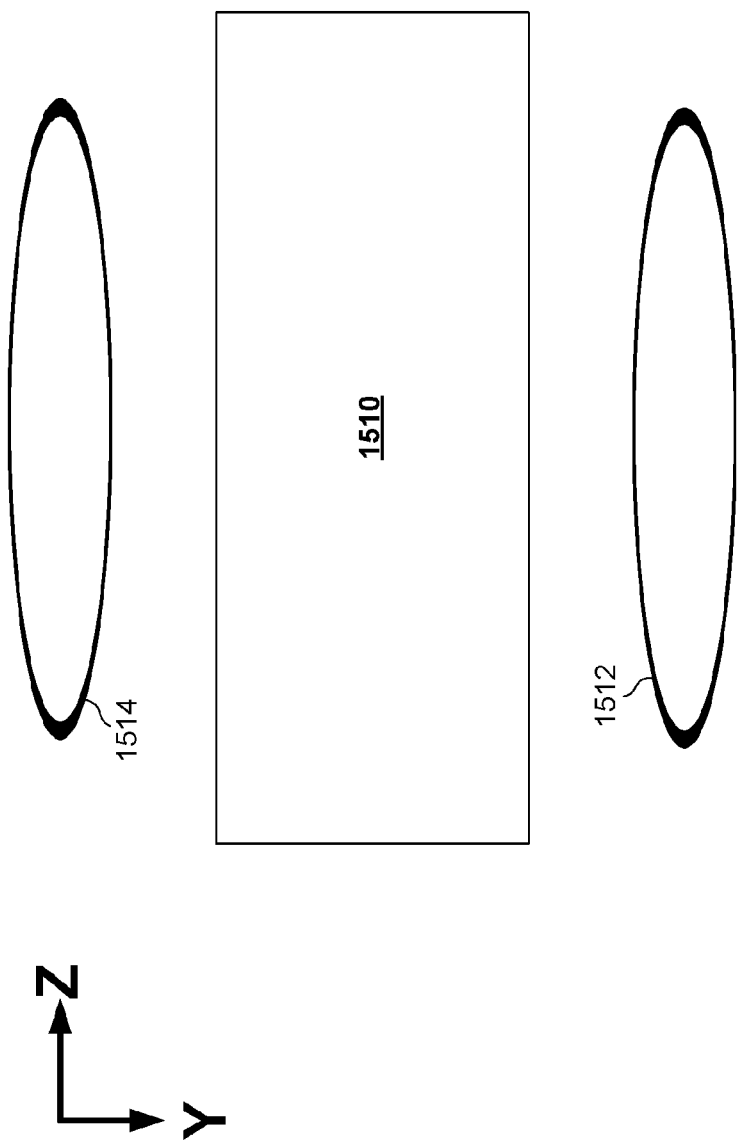
FIG. 15 is an oblique view of a geometric model used for numerical simulations of the disclosed technology.

FIG. 15 is an oblique view of a geometric model used for numerical simulations. A simplified cylindrical phantom 1510 consisting of a uniform saline solution was used for numerical simulations. The phantom 1510 is situated between a driven primary surface coil 1512 and a secondary resonator 1514. Surface coil 1512 and resonator 1514 are generally circular; for purpose of illustration, discrete components such as capacitors or adjustable components are omitted. The main field $B_0$ is parallel to the z-axis, and the axis of symmetry of the $B_1$ field is parallel to the y-axis.

All numerical simulations were performed with a convergence threshold of −60 dB, with a cutoff of 500,000 maximum time steps. Numerical simulations were performed using commercially available software (xFDTD; Remcom, Inc.; State College, Pa.) and post-processing analysis was performed in Matlab (the MathWorks, Inc., Natick, Mass.). All the simulation results were normalized to yield a $|B_1^+|$ of 2 μT at the center of the phantom, which is equivalent to a 90° flip angle for rectangular RF pulse with 3.0 ms duration.

Figure 16:
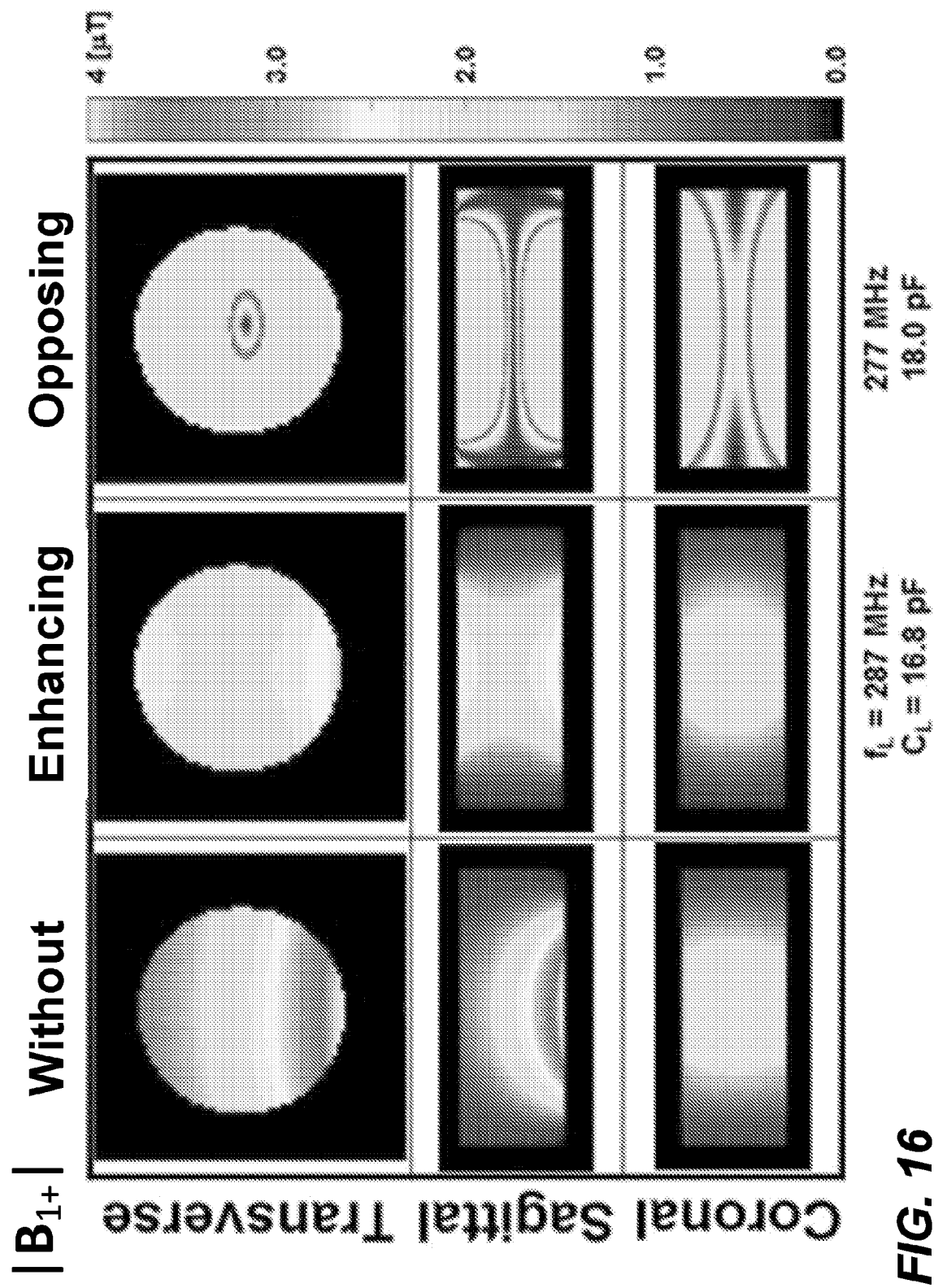
FIG. 16 shows simulation results for $B_1^+$ amplitude for various cross-sections of the phantom and various configurations of the disclosed technology.

FIG. 16 shows simulation results of $B_1^+$ amplitude along transverse (XY), sagittal (YZ), and coronal (XZ) cross-sectional planes, in three columns for respective configurations. The left column labeled "Without" shows field amplitudes with only primary transmitter and no secondary resonator. The middle column labeled "Enhancing" shows field amplitudes with primary transmitter (282 MHz) and secondary resonator tuned to $f_L$=287 MHz, so that the secondary field $B_{1L}$ enhances the primary field $B_{1T}$. Finally, the right column labeled "Opposing" shows field amplitudes with primary transmitter (282 MHz) and secondary resonator tuned to $f_L$=277 MHz, so that the secondary field $B_{1L}$ opposes the primary field $B_{1T}$. All simulations were arranged to obtain a magnetic field amplitude of 2.0 uT at a center of the phantom; all plots of FIG. 16 are shown in a color temperature scale clipped to 0-4 uT. The left column shows the fall-off of magnetic field amplitude $B_1^+=B_{1T}$ moving away from the primary transmitter. The middle column shows the much more homogeneous field amplitudes obtained in the "Enhancing" configuration. The right column shows the strong field gradients near the center of the phantom. Because of substantial cancellation in these simulations, the primary transmitter operates at high drive power to obtain 2.0 uT at the center of the phantom, leading to very high fields >>4.0 uT in much of the phantom volume. That is, the large regions of pale pink shading are an artifact of the clipped color temperature scale, and are not at all indicative of field uniformity.

Figure 17:
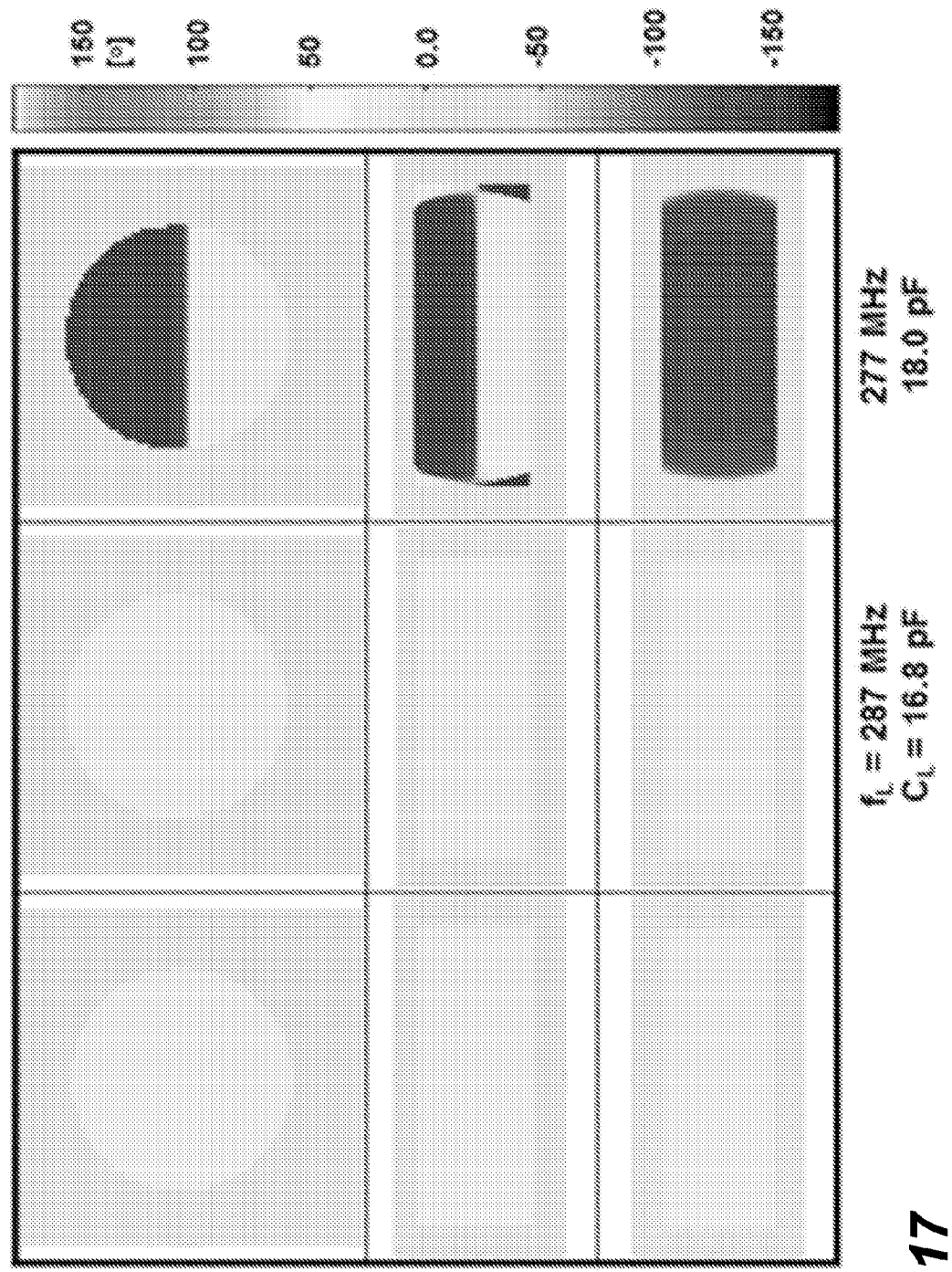
FIG. 17 shows simulation results for the phase of axial $B_{1Y}$ for the same phantom cross-sections and configurations as FIG. 16.

FIG. 17 shows simulation results of $B_{1T}$ phase along the same planes and for the same configurations as FIG. 16. As indicated in FIG. 15, the Y direction is along a central axis of the RF magnetic antenna and resonator. Unsurprisingly, both the "Without" and "Enhancing" configurations show substantially uniform phase throughout the phantom volume. The "Opposing" configuration, however, shows the opposition between $B_{1T}$ and $B_{1L}$ fields: areas dominated by the secondary fields are 1800 out of phase (i.e. opposite in polarity) with respect to the primary $B_{1T}$ field.

Table 1 presents certain parameters of the simulation results for these three configurations ("Without", "Enhancing", and "Opposing"), arranged to provide $B_1^+=2.0$ uT at the center of the phantom.

TABLE 1

| Row | Parameter | "Without" | "Enhancing" | | "Opposing" |
|---|---|---|---|---|---|
| 1 | Tuning capacitor in the resonator ($C_L$) [pF] | N/A | 16.8 | 17.4 | 18.0 |
| 2 | Tuned Frequency [MHz] | n/a | 287.2 | 282.2 | 277.3 |
| 3 | Max $|B_1^+|$ [µT] | 4.19 | 2.74 | 4.05 | 30.9 |
| 4 | Mean $|B_1^+|$ [µT] | 1.40 | 1.36 | 1.35 | 8.12 |
| 5 | Std. $|B_1^+|$ [µT] | 0.82 | 0.61 | 0.78 | 5.49 |
| 6 | Drive Power [$10^{-4}$ W] | 4.60 | 3.50 | 3.29 | 761 |

The first two rows list the tuning capacitor value for $C_L$ for each configuration, and the associated resonance frequency of the secondary resonator. The next two rows list the maximum and mean values of $B_1^+$ over the phantom volume respectively, while the fifth row lists the standard deviation ("Std") of $B_1^+$ over the phantom volume. The standard deviation is a measure of uniformity of the RF magnetic field, and is related to uniformity of image contrast and imaging sensitivity. The sixth row lists the power dissipated for each configuration. Considering the "Without" configuration as a baseline, it can be observed that the "Enhancing" configuration ($f_L=287$ MHz>$f_0=282$ MHz), by compensating for $B_{1T}$ gradients and reinforcing the $B_{1T}$ field, permits 2.0 uT to be reached at the center of the phantom with lower peak field amplitude and less drive power. Further, because the maximum $B_{1+}$ field is reduced, the mean field is reduced also. Finally, as a demonstration of field uniformity, the standard deviation of $B_1^+$ is reduced by about 25%, from about 40% of the central $B_{1+}$ value to about 30% of the central $B_1^+$ value.

In stark contrast, the "Opposing" configuration results in near cancellation of $B_{1T}$ at the center of the phantom, as a consequence the primary transmitter must be driving with more than 100× power to achieve 2.0 uT at the center of the phantom. Accordingly, the maximum $B_1^+$ field is extremely high at over 30 uT, and the mean and standard deviation are correspondingly high also.

Experiments

All experimental measurements were performed on an Agilent 7.0T horizontal bore animal MRI (Agilent Inc.; Santa Clara, Calif.) with an open bore of 310 mm, a diameter of 115 mm inside the gradient coil (Resonance Research Inc.; Billerica, Mass.). The primary transmitter used for all experiments was a dual-tuned commercial surface coil for $^{19}$F (282 MHz) and $^1$H (300 MHz) purchased from RAPID MR International Inc. (Columbus, Ohio). The development studies (numerical simulations and experiments) were directed to improvement of field homogeneity at the $^{19}$F frequency.

The secondary resonator (inner diameter (ID)=18 mm, outer diameter (OD)=22 mm) was tuned either to 287 MHz or 277 MHz using the capacitors of 4.7 pF, 5.5 pF, and 11 pF (ATC Inc., Huntington Station, N.Y.) combined with the variable capacitor described herein, to produce either mode of an enhancing or an opposing $B_1$.

A cylindrical phantom and a mouse model were used as samples.

As described below, the same secondary resonator configurations were used in the experiments as in the numerical simulations, namely "Without" having no secondary resonator, "Enhancing" having the secondary resonator tuned for resonance at 287 MHz, above the $^{19}$F operating frequency, to enhance and homogenize the $B_1$ field in the sample volume, and "Opposing" having the secondary resonator tuned for resonance at 277 MHz, below the $^{19}$F operating frequency, which increases field gradient and decreases uniformity of the $B_1$ field in the sample volume. However, unlike the numerical simulations, the different configurations were not used at the same values of $B_1$ field amplitude at a central location, but were used with the same primary transmitter drive power.

Magnetic resonance imaging was performed using a gradient echo sequence for $^{19}$F imaging with TR/TE=35/4 ms, flip angle=30°, averaging=512, matrix=64×64, FOV=35×35 mm² (for the phantom) and 100×100 mm² (for the mouse in-vivo), number of slices=3 (phantom) and 5 (mouse in-vivo), thickness=10 mm, and scan time=1147 seconds. The same amount of RF input power was applied to the combined resonator ($^{19}$F/$^1$H surface coil and secondary resonator), with the secondary resonator tuned either to 287 MHz or to 277 MHz in the presence of the sample.

Example Primary Transmit Surface Coil

Figure 18C:
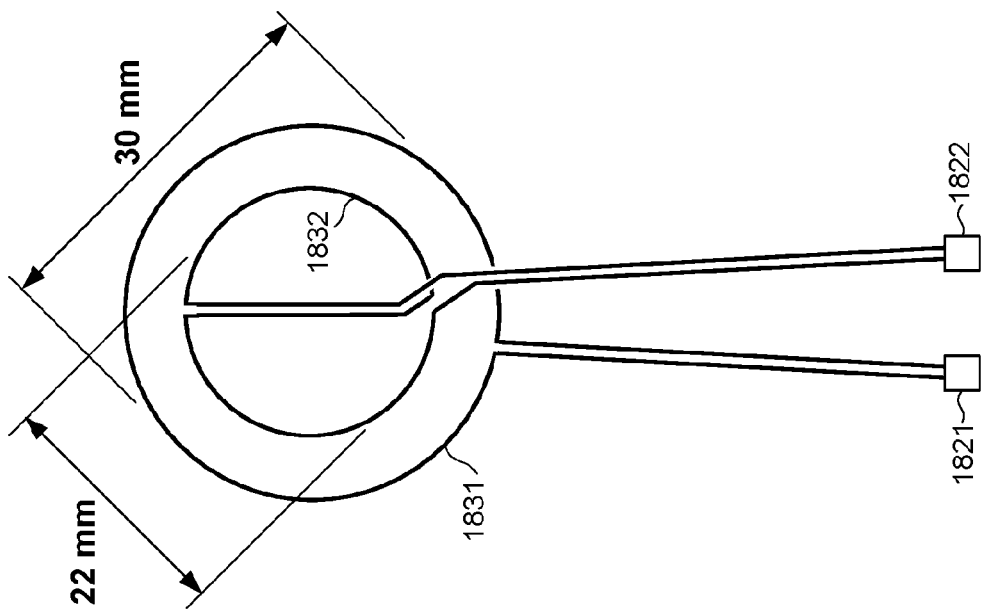
FIGS. 18A-18C show views of an exemplary surface coil used for dual-frequency MRI, and compatible with the disclosed technology.
Figure 18B:
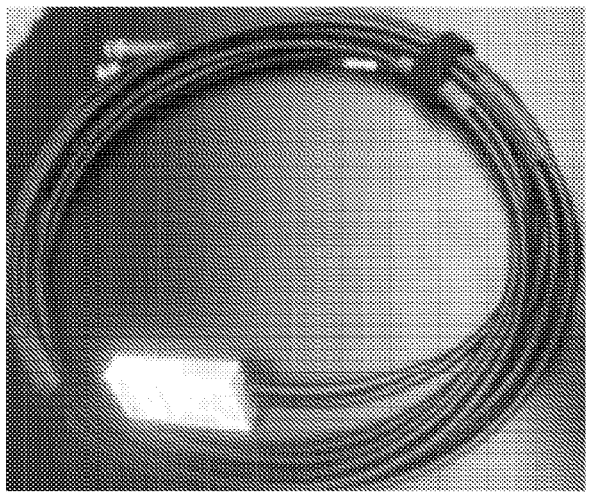
Figure 18A:
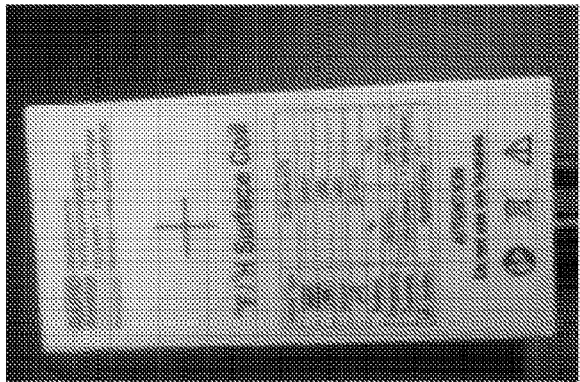

FIGS. 18A-18C show views of an exemplary prior art surface coil used as transmit antennas for dual-frequency MRI. FIG. 18A is a photograph of the nameplate of the surface coil, indicating its intended usage for $^{19}$F and $^1$H imaging. FIG. 18B is a photograph of the surface coil and its attached cable set, connectorized for connection to a dual-frequency RF power source. FIG. 18C shows the wiring shape of an exemplary dual-frequency transmit antenna pair. A first antenna 1831 is a single loop of 30 mm diameter circular conductive trace on a printed circuit board. The loop is connected by wiring traces to connector 1821 which can be driven from an RF amplifier under control of the dual-frequency MRI machine. A second antenna 1832 is a figure-eight configuration of two loops covering a 22 mm diameter circular area. The figure-eight antenna is connected by wiring traces to connector 1822 which can be driven from an RF amplifier under control of the dual-frequency MRI machine.

Figure 19:
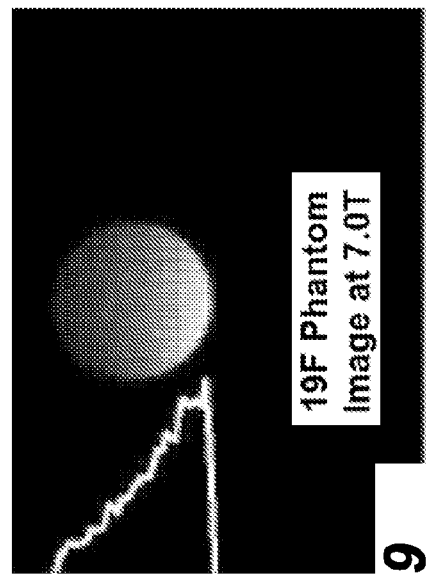
FIG. 19 shows an exemplary transverse slice MRI image obtained from $^{19}F$ in a phantom, taken with the prior art surface coil of FIGS. 18A-18C at a main field of $B_0=7.0T$.

FIG. 19 shows an exemplary transverse slice MRI image of $^{19}$F in a phantom, taken with the prior art surface coil of FIGS. 18A-18C at a main field of $B_0=7.0$T. The significant non-uniformity of the image across the phantom cross-section is clearly evident, as evidenced by a line profile shown alongside; the line profile being along a central section of the image.

Phantom Experiments

Figure 20A:
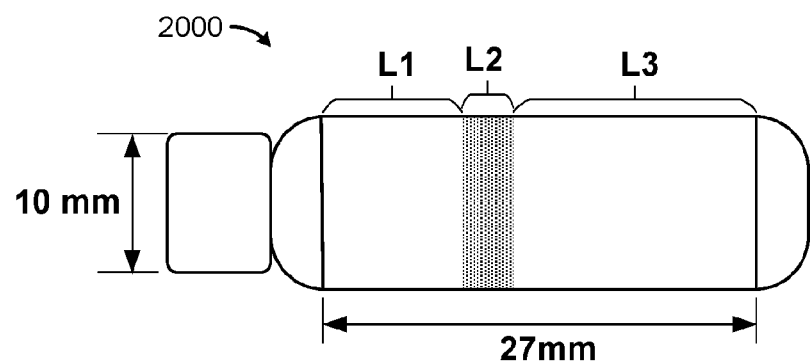
FIGS. 20A-20B illustrate an example phantom used in experimental studies.

FIG. 20A shows a phantom 2000 used in experimental studies, consisting of 3 layers L1, L2, and L3 assembled in a vial. Layers L1, L2, and L3 occupy the interior volume of the vial, which is 10 mm in diameter and 27 mm in length. The region of interest is layer L2, which contains 12×10⁶ labeled neural stem cells (NSC) encapsulated in a polyethylene glycol (PEG) disk. Layers L1 and L3 are composed of saline (conductivity about 1.7 S/m and dielectric constant about 78) with a green dye and 3% agar gel to immobilize the NSCs in layer L2.

Layer L2 was prepared as follows. $12\times10^6$ NSCs were labeled with CS-ATM DM Red (Celsense, Pittsburgh Pa.), a fluorescently tagged PFC MRI contrast agent, at a concentration of 20 mg/ml for 36 hours. The labeling media consisted of neurobasal medium, minus phenol red (Gibco, 21103-049; Thermo Fisher Scientific, Waltham Mass.) with 20 ng/mL EGF (Gibco, PHG0311), 20 ng/mL bFGF (Gibco, PHG0026), 2 µg/mL heparin, B27 supplement (Gibco, 17504-044), Penicillin/Streptomycin/Glutamine (Gibco, 10378-016) and 20 mg/ml CS-ATM DM Red. After labeling, the $12\times10^6$ $^{19}$F labeled NSCs were washed and encapsulated into a PEG disk (Laysan Bio, Arab Ala.) using UV for polymerization. The PEG disk containing the labeled cells had a diameter of 10 mm, length of 2.83 mm, and volume of 222 µL.

Figure 20B:
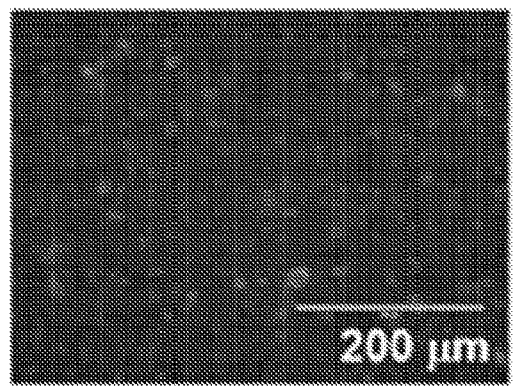

Because the PFCs used are fluorescently tagged, layer L2 can be directly imaged in fluorescence. FIG. 20B shows a fluorescence image of a portion of the prepared layer L2 disk, wherein the rhodamine tagged PFCs are visible within the NSCs.

In this example, the perfluorocarbons can be represented by the chemical formula $CF_3-O-(CF_2-CF_2-O-)_n-CF_3$, where n varies from 8 to 11, with an average value of 10.57. The average PFC molecular weight is 1380 and there are about 48 $^{19}$F atoms per PFC molecule, on average. In other examples, different PFC formulations or different $^{19}$F containing compounds can be used.

FIG. 4 has been described above, showing an example assembly of a phantom 410 in an imaging configuration, above a transmit antenna 420 and below secondary resonators 440, 450.

Figure 21:
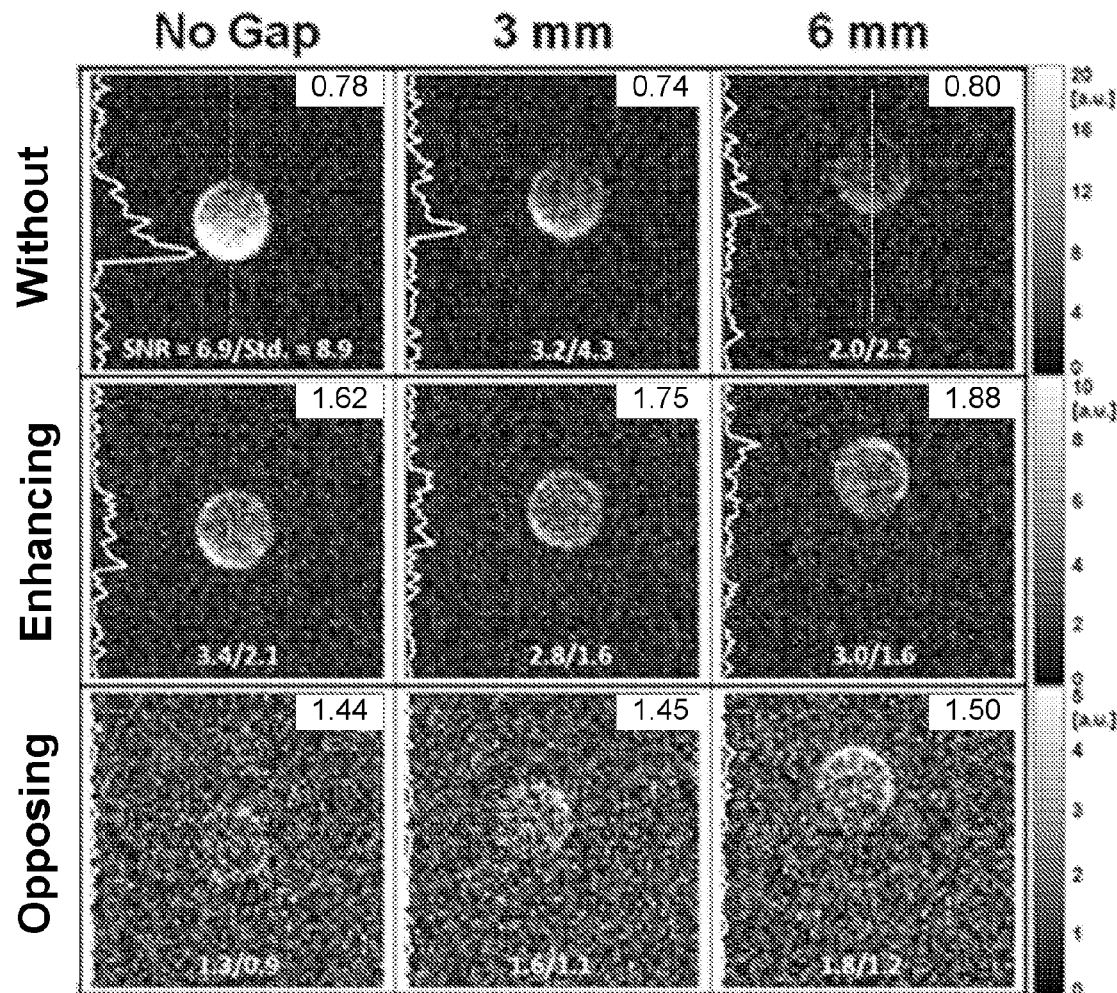
FIG. 21 provides experimental results with the phantom for different sample positions and different secondary circuit configurations according to the disclosed technology.

FIG. 21 provides experimental results with the phantom for different sample positions and different secondary circuit configurations. To evaluate the SNR and image uniformity at different region of interests, experimental $^{19}$F images were obtained with and without the secondary resonator at three different gap distances between $^{19}$F surface coil and phantom, i.e., no gap, 3 mm and 6 mm. The distance between the secondary resonator 440, 450 and the $^{19}$F surface coil 420 was kept constant at 22 mm as shown in FIG. 4. Thus, the imaging of the sample vial at different heights above primary transmitter 420 represents imaging of different regions of interest within a 22 mm diameter sample volume.

The $^{19}$F MRI images are shown for a transverse plane. The three columns of FIG. 21 correspond to different vertical positions of the sample phantom 410 above the primary transmitter surface coil 420. In the left-most column, the sample phantom 410 is directly on top of the surface coil 420, i.e. the gap is zero. In the central column, the gap is 3 mm, while in the right-hand column, the gap is 6 mm. These different vertical positions are also evident in the vertical offset of the imaged PEG disk, going from left to right. Within each column of FIG. 21, three rows correspond to different secondary circuit configurations. In the top row (labeled "Without"), the secondary circuit is absent, and the $B_1$ field is created solely by the primary transmit surface coil, subject to loading by the sample itself. In the middle row ("Enhancing"), the secondary circuit 440 is present and tuned to 287 MHz resonance in the presence of the sample, so as to produce a $B_{1L}$ field that reinforces the $B_{1T}$ field produced by the primary transmitter and improves field homogeneity as described herein. Finally, the bottom row of FIG. 21 ("Opposing") shows images acquired with secondary circuit 440 present and tuned to 277 MHz resonance in the presence of the sample, so as to produce a $B_{1L}$ field that opposes the $B_{1T}$ field produced by the primary transmitter and worsens field homogeneity as described herein.

Associated with each image is a line profile along the left-hand vertical (Y) axis; the line profile is taken along a vertical section as shown in the top right image. Also shown are two parameters along the bottom of each image, the first being signal-to-noise ratio of the signal from the $^{19}$F labeled NSCs in the PEG disk of layer B, and the second being standard deviation of the signal from the $^{19}$F labeled NSCs in the PEG disk of layer L2. It is desirable to have good signal to noise ratio and also low standard deviation. That is, high standard deviation detracts from image quality even if SNR is high: the "Without" configuration suffers from precisely this problem. Also, having low standard deviation is not advantageous if SNR is also low, as shown in the "Opposing" configuration, where the phantom image is barely discernible over the noise.

The "Enhancing" configuration provides readily distinguishable images at all vertical separations. Compared to the "Without" configuration, the standard deviation is considerably reduced, indicating uniform image quality. Compared to the "Opposing" configuration, the SNR is considerably increased, indicating the ability to resolve imaged objects from background. Thus, the homogeneous field of the "Enhancing" configuration provides consistent imaging quality across the sample volume. Particularly, the appearance of the PEG disk in the "Enhancing" configuration is more uniform across each disk and across different spatial positions of the phantom, indicating improved (more uniform) image contrast compared to the "Without" configuration. Also, the considerable signal-to-noise variation across the PEG disk in the "Without" configuration is considerably attenuated in the "Enhancing" configuration, demonstrating that the imaging sensitivity is more uniform (thus, improved) in the "Enhancing" configuration.

To compare the images, the ratio SNR/(standard deviation) is also shown as a figure of merit, in the upper right corner of each image. The "Enhancing" configuration has consistently the best figure of merit compared to the other configurations.

Mouse Experiments

A further set of experiments was conducted with a mouse, in vivo.

A PEG disk with a diameter size of 6 mm containing $10\times10^6$ $^{19}$F labeled NSCs encapsulated in PEG was implanted subcutaneously in the back of an immunodeficient NSG (NOD scid gamma) mouse. The PEG disk was about 6 mm diameter with a height of approximately 3.5 mm; labeling was done with a 20 mg/mL PFC formulation. FIG. 22 shows the implanted mouse prepared for MRI above a primary transmitter surface coil. All animal experiments conducted in these studies were performed in accordance with protocols approved by the Institutional Animal Care and Use Committee at the inventors' FDA research facility. FIG. 22 also shows the location of a dual secondary resonator used for some MRI imaging described further below.

Because the NSCs expressed the luciferase gene, the location and viability of the implanted cells could be monitored by luminescence over a period of 6 weeks. The luciferase was detected by bioluminescence after intraperitoneal injection of luciferin using the IVIS® SpectrumCT, (PerkinElmer Inc., Waltham Mass.). The bioluminescence images were taken as a reference on the second day after surgery (shown in FIG. 23A) and on the 40th day after surgery (shown in FIG. 23B).

Figure 24:
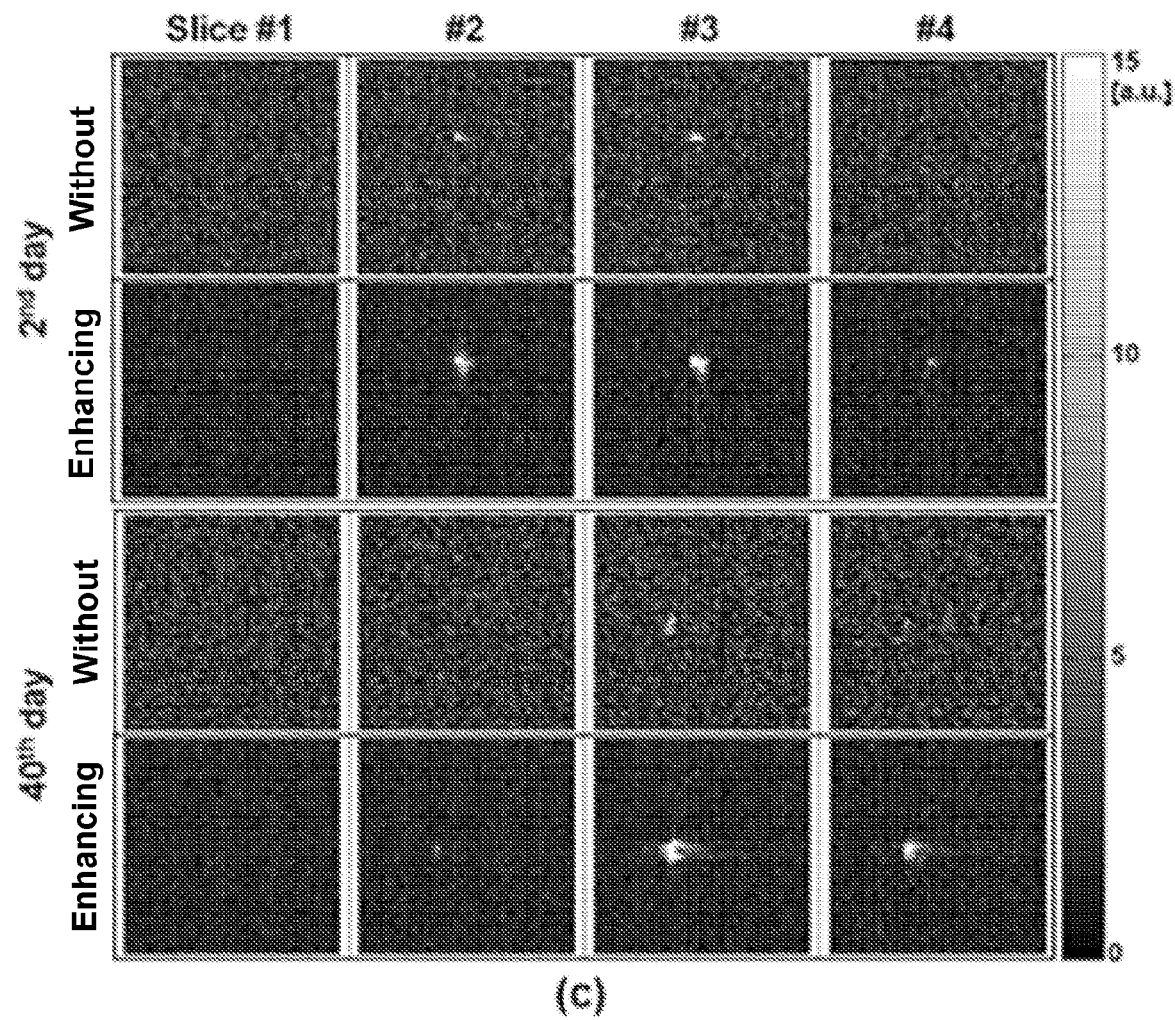
FIG. 24 shows a collection of $^{19}F$ MRI images for the mouse of FIG. 22.

MRI detection of the $^{19}$F labeled cells in vivo was also done on the 2nd and 40th days, over 4 slices. FIG. 24 shows a collection of these MRI images, in four rows and four columns. Each column corresponds to a respective slice, numbered 1-4 as shown. For each slice, the top two rows show images on the 2nd day, using "Without" and "Enhancing" configurations respectively. Similarly, the bottom two rows show images on the 40th day, also for the "Without" and "Enhancing" configurations respectively.

The ability to visualize the labeled NSCs, ascertain spatial extent and details of spatial distribution, and to distinguish the labeled NSCs from noise, are all markedly superior with the enhancing and homogenizing secondary circuit, in the "Enhancing" configuration, tuned to 287 MHz. This secondary circuit is the outer ring of the dual secondary resonator illustrated in FIG. 22. (The inner resonator illustrated in FIG. 22 is intended for $^{1}$H imaging.) Thus, the inductively coupled and tuned secondary resonator provides improved visualization of transplanted cell location and survival over a period of 6 weeks, non-invasively. The images of the "Without" configuration were obtained with the dual secondary resonator removed from the MRI environment.

Example Combination of $^{19}$F and $^{1}$H Imaging

Figure 25:
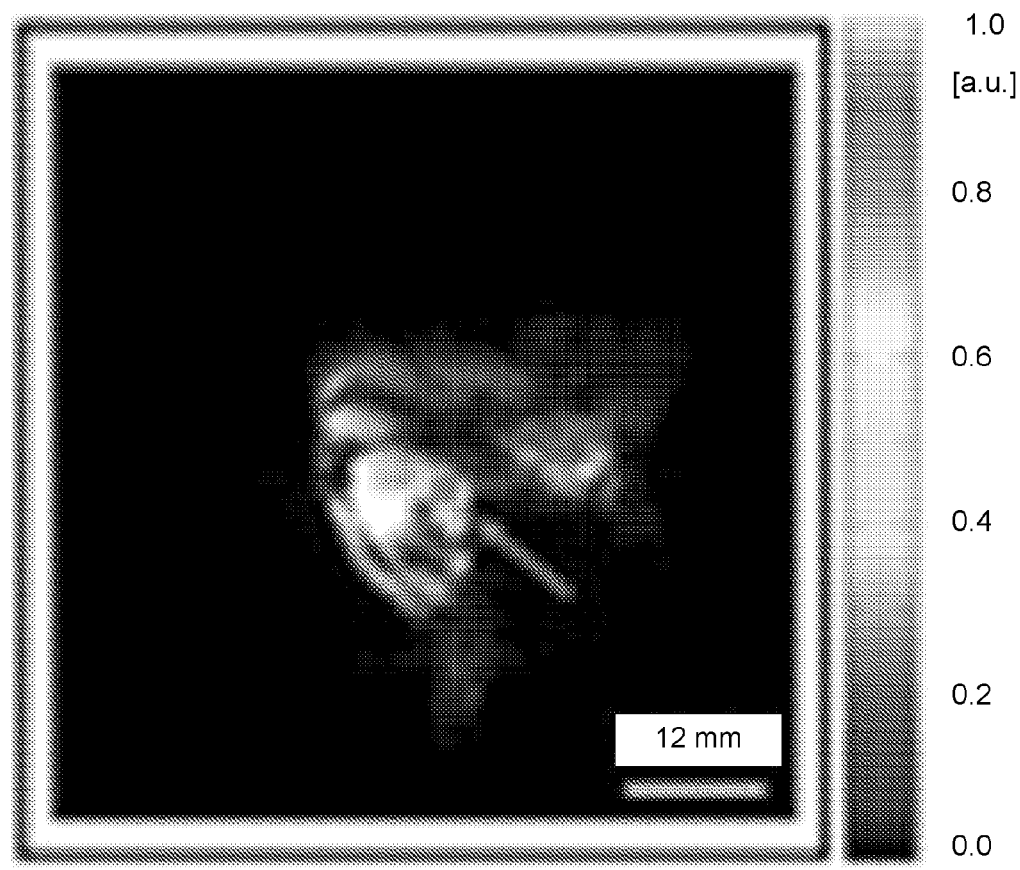
FIG. 25 shows an example of a fused image obtain using $^1H$ and $^{19}F$ imaging.

Dual-frequency MRI affords superior imaging capabilities. FIG. 25 shows an example of a fused image obtain using $^{1}$H and $^{19}$F magnetic resonance signals. Because of the relative ubiquity of $^{1}$H throughout an organism, the $^{1}$H image, shown in grayscale, provides structural detail of the organism. In contrast, $^{19}$F is highly localized and has no background signal within the organism. In FIG. 25, the $^{19}$F is shown in color, wherein blue represents weak signal amplitude and red represents a strong signal amplitude, as indicated by the scale alongside. Very weak $^{19}$F signal amplitudes are masked out to avoid obscuring the $^{1}$H image. In this example, dual-frequency imaging allows images to be obtained from two nuclides with significantly different spatial distributions, by using the $^{1}$H image to provide spatial reference for the $^{19}$F image.

Figure 26:
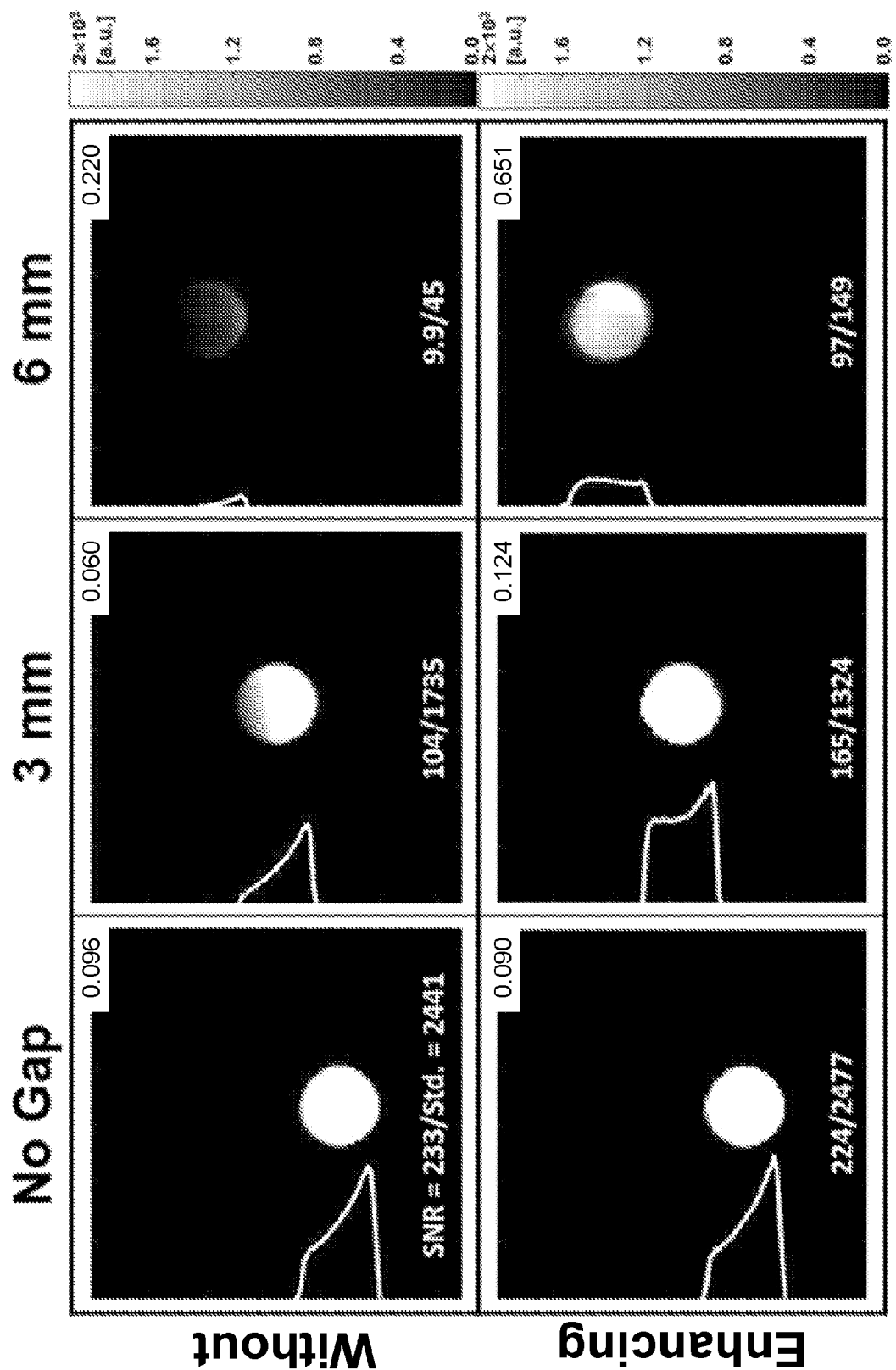
FIG. 26 shows an array of $^1H$ MRI images of a cylindrical phantom at the same spatial positions as FIG. 21, for configurations of the disclosed technology.

Similarly to $^{19}$F, a secondary passive circuit can similarly be effective for $^{1}$H images. FIG. 26 shows an array of $^{1}$H MRI images of a cylindrical phantom at the same spatial positions as FIG. 21, for the "Without" and "Enhancing" configurations described herein. For $^{1}$H, the operating frequency at 7.0 Tesla is 300 MHz; the secondary resonator is tuned for resonance at 305 MHz in the "Enhancing" configuration, and is of course absent in the "Without" configuration. In each image, SNR and Standard Deviation of the signal amplitude are shown, along with a central line profile as described for FIG. 21. As for FIG. 21, it is desirable to have high SNR and low standard deviation. For the 3 mm case, the secondary resonator provides an increase in the SNR and a lower standard deviation, representing an improvement in image uniformity. For the 6 mm case, the nearly 10× improvement in SNR allows the phantom to be clearly imaged with the secondary resonator in place, where the $B_{1T}$ drop-off is such that the phantom is barely discernible without the secondary resonator. For the "no gap" or zero mm case, the secondary resonator has little impact, because the relative amplitude of $B_{1L}$ compared to $B_{1T}$ is small at locations close to the primary surface coil and far from the secondary resonator. FIG. 26 also shows, as a figure-of-merit, the ratio of SNR to standard deviation for each of the images. The approximately 2-3× improvement at 3-6 mm is evident, where the image quality improvement is most needed.

Figure 27:
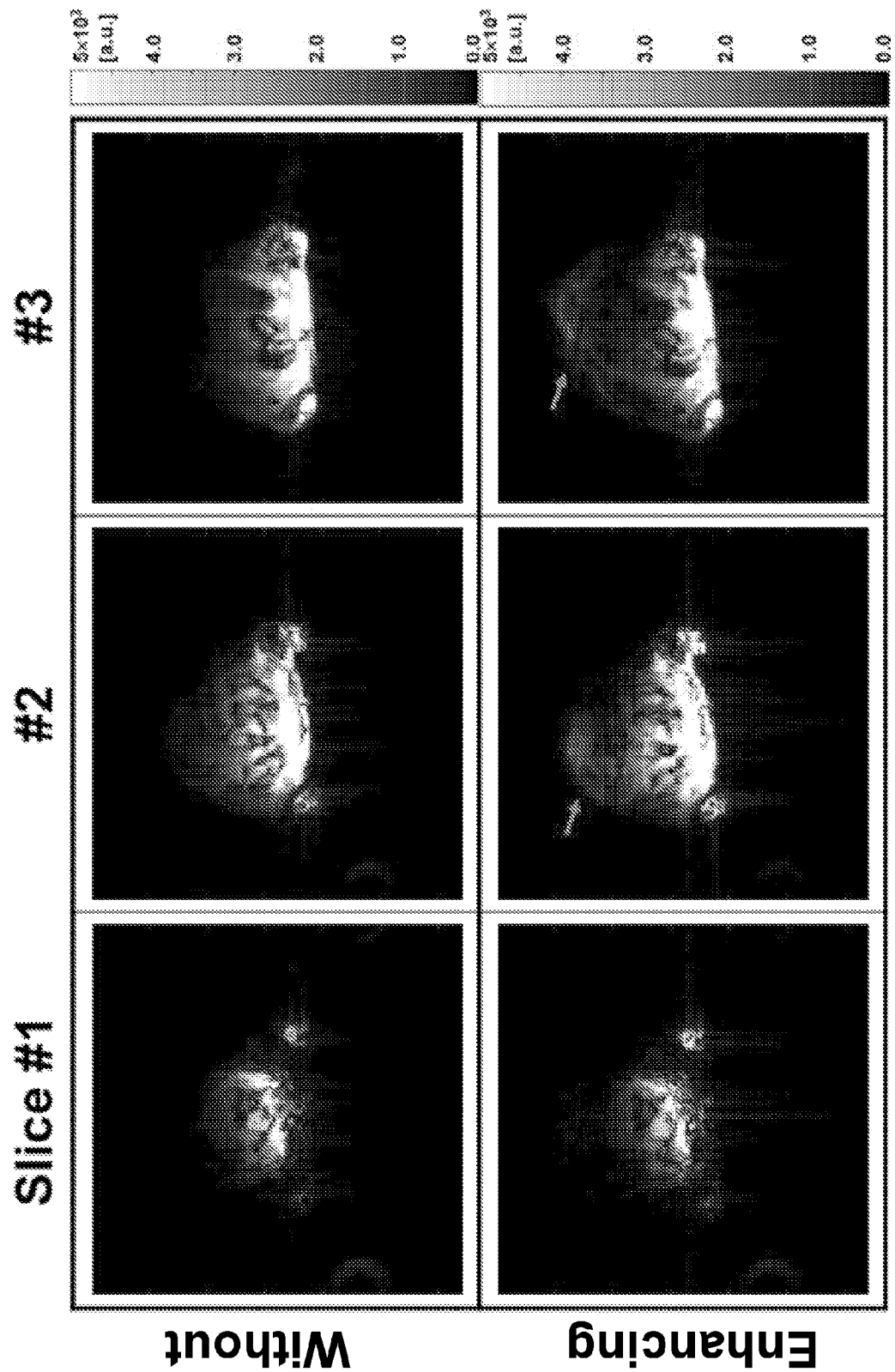
FIG. 27 shows $^1H$ image sets of a mouse, for transverse slices, according to disclosed technology.
Figure 28:
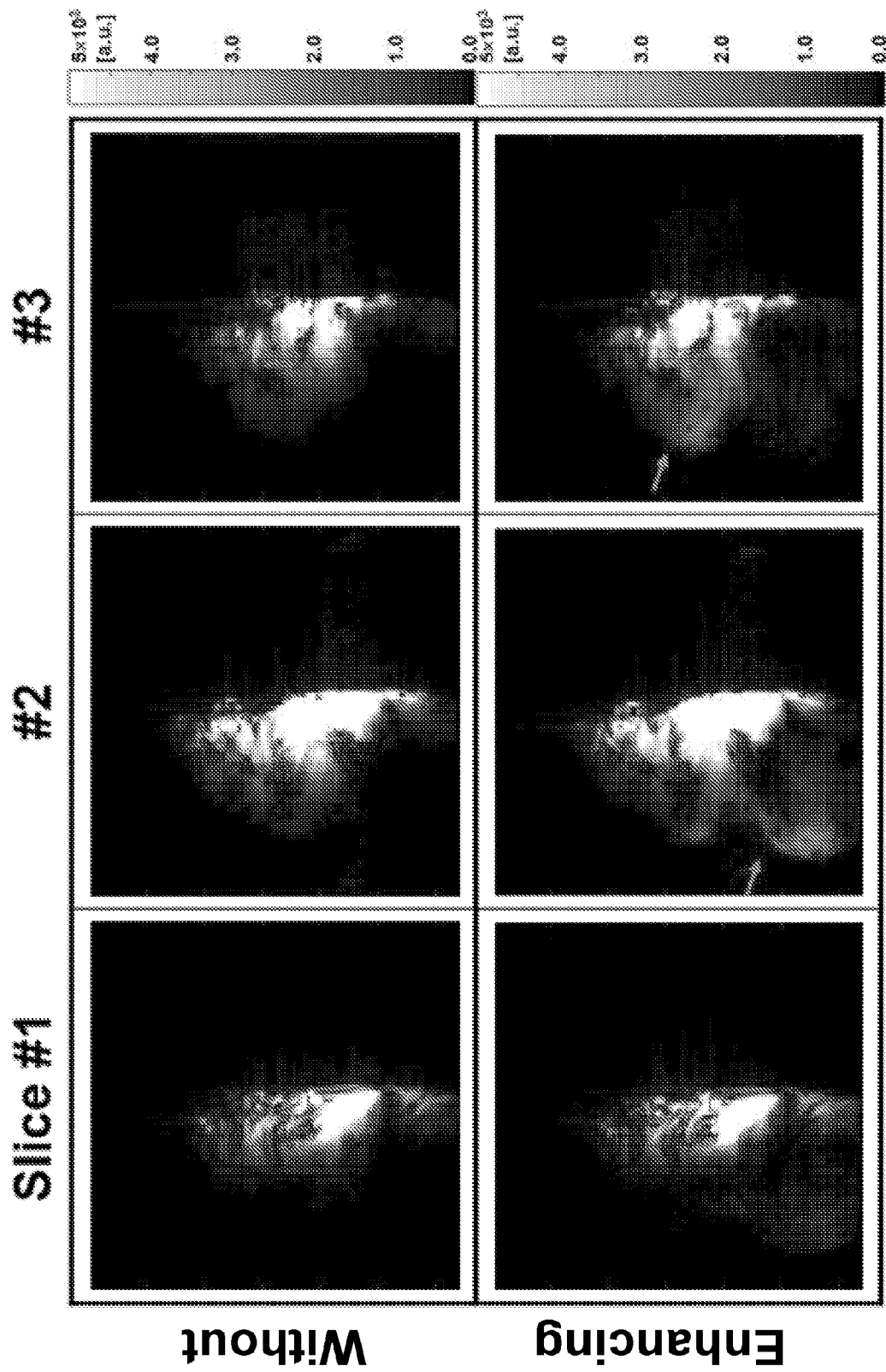
FIG. 28 shows $^1H$ image sets of a mouse, for sagittal slices, according to disclosed technology.

FIGS. 27-28 show $^{1}$H image sets of a mouse, for transverse and sagittal slices respectively. Each of these figures shows three different slices, for both "Without" and "Enhancing" configurations. Once again, the effectiveness of the secondary resonator (tuned to have a resonance frequency above the $^{1}$H operating frequency) is evident: structural details are clearly visible with the "Enhancing" secondary resonator that are very faint or invisible without the secondary resonator.

Figure 29:
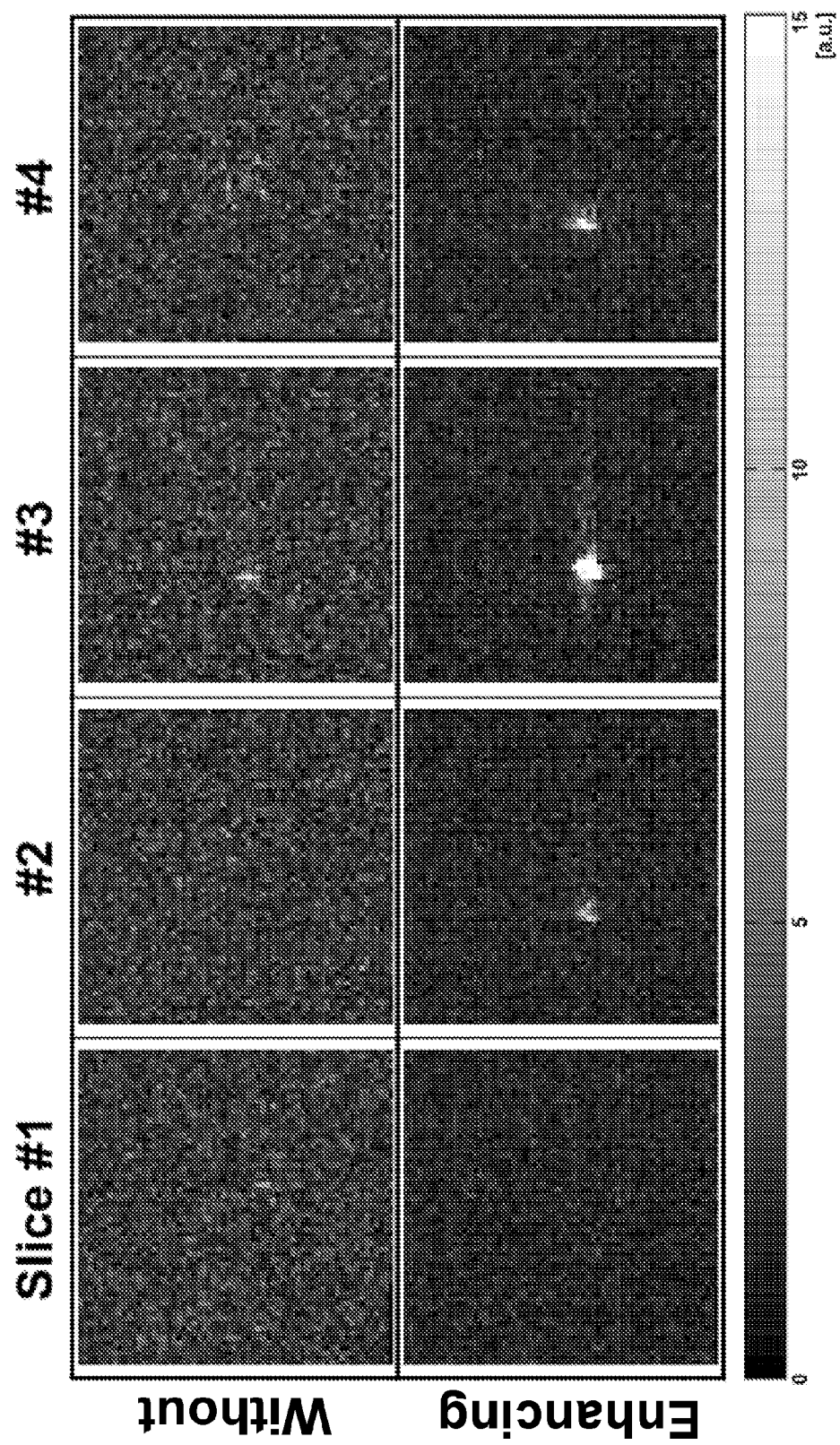
FIG. 29 shows a set of $^{19}F$ images for the same mouse visualized in FIGS. 27-28, according to disclosed technology.

FIG. 29 shows a set of $^{19}$F images for the same mouse visualized in FIGS. 27-28. The images with an "Enhancing" secondary resonator are superior to the images without a secondary resonator.

Example with Separate Transmit and Receive Antennae

In many MRI applications, separate transmit and receive antennae can be used to improve image sensitivity and uniformity, which can introduce additional considerations for the deployment of disclosed technologies. Commonly, a large transmit antenna system produces a transmit RF field $B_1^+$ having good spatial uniformity, while a receive antenna system having one or more small receive antenna receptors (e.g. RF coils) provides good sensitivity and signal strength over small volumes proximate to the respective receptors. An example deployment of disclosed technology in such a system is illustrated in FIGS. 30A-30B.

FIG. 30A shows a perspective view of an assembly, with a phantom vial 3030 located between a phased array primary receiver coil set 3020 and a secondary resonator 3040 according to disclosed technology, for operation within a transmit body coil 3010. In this example, transmit body coil 3010 can be affixed to the magnet or body of an MRI machine and surrounds the sample volume. Transmit body coil 3010 can be an antenna system of birdcage design as shown, comprising multiple antenna radiators of generally elongated rectangular shape disposed about central axis 3050 of the MRI machine. An example birdcage coil can have a 12-rung design, with inner dimensions 72 mm diameter×110 mm length, and end-ring and rungs each 5 mm wide. Other transmit body coil configurations, such as saddle coils, can also be used.

Receive antenna system 3020 can be fixed to a sample table or specimen table (not shown), to which a patient or sample such as phantom vial 3030 is attached. With the disclosed technology, a secondary resonator 3040 can also be attached to one or more of the receive antenna system 3020, the sample 3030, or the table. As indicated by arrow 3060, the table, receive antenna system 3020, and phantom vial 3030 can be slid, continuously or step-wise, into the MRI machine body to attain an operational configuration for imaging, with sample 3030 generally aligned with the main axis 3050 of the MRI machine. An example phantom vial can have inner dimensions 26 mm diameter×100 mm length, and conductivity of 1.69 S/m, corresponding to an 0.9% saline solution.

FIG. 30B is an inset showing further detail of receive antenna system 3020. A receive RF coil can be a single channel or phased array. A phased array of antenna receptor coils 3021-3024 is illustrated in this example, however this is not a requirement. Other receiver antenna designs can be used, including a loop coil, a D coil, a figure-eight coil, or a butterfly coil, either singly or in an array, in any combination of a single channel or phased array. An example phased array can have 4 planar coils (18 mm inner diameter, 22 mm outer diameter) successively overlapped by 25% lengthwise. A phased array incorporates two or more receive channels, e.g. independent receive coils with staggered spatial positions.

The secondary resonator 3040 can be designed and operated according to the principles described herein. In particular, secondary resonator 3040 can be tuned to have a resonance frequency above an MRI operating frequency, thereby boosting the amplitude and uniformity of the $B_1^-$ magnetic field within a sensing volume. In varying embodiments, the secondary resonator 3040 can be sized to supplement the performance of a single receptor 3021 of receive antenna system 3020, two or more receptors, or the entire receive antenna system 3020. The antenna or coil design of resonator 3040 can be selected from a similar variety of configurations as for primary antenna system 3020. $B_1^-$ field enhancement mechanisms can follow those discussed in the context of FIGS. 6A-6B.

Figures 34, 35:
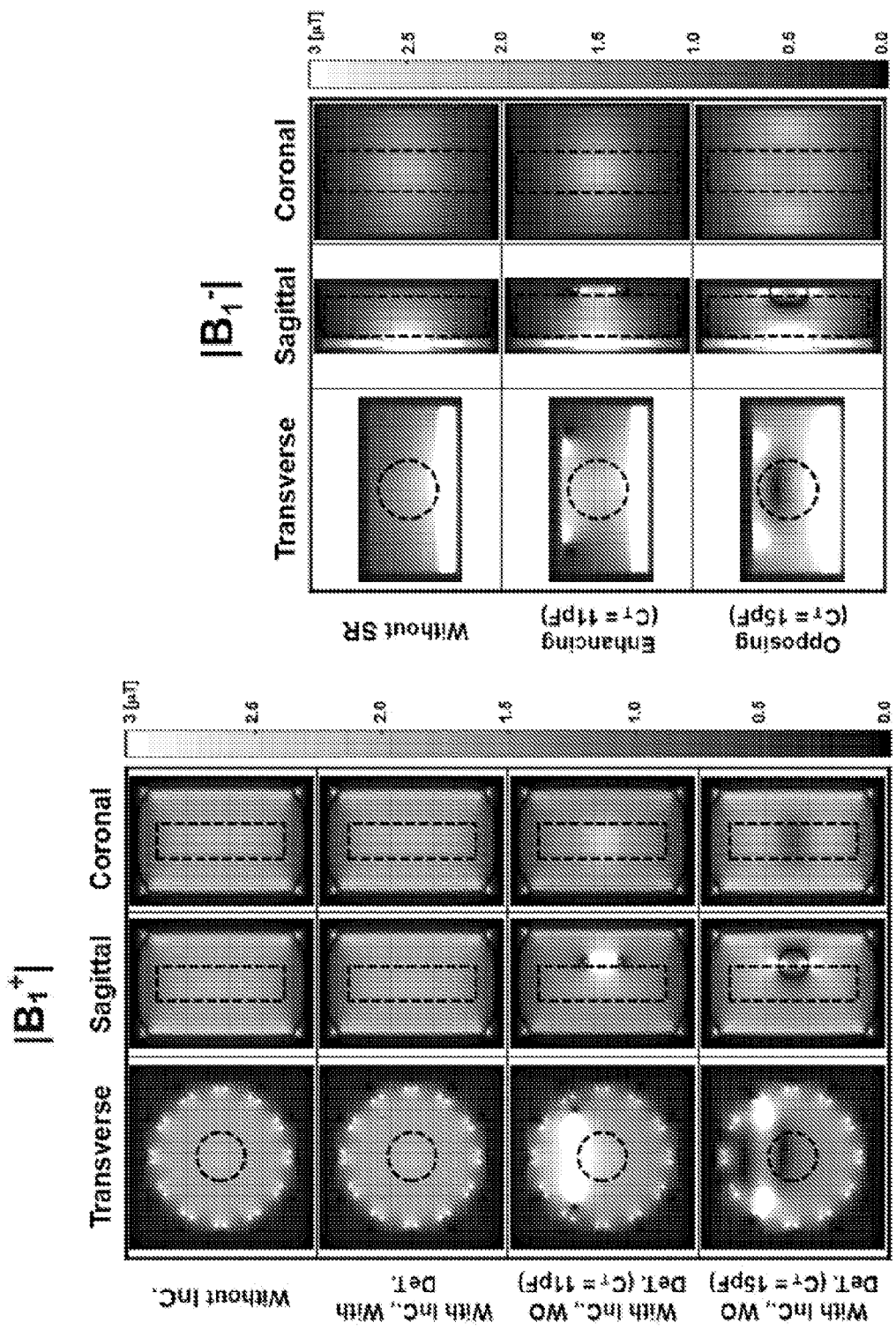
FIG. 34 shows simulation results for $B_1^+$ amplitude for various cross-sections of the MRI machine and various configurations of the disclosed technology.
FIG. 35 shows simulation results for $B_1^-$ amplitude for various cross-sections of the MRI machine and various configurations of the disclosed technology.

However, secondary resonator 3040, having a resonant frequency close to a frequency of operation, can adversely affect field uniformity of the transmit $B_1^+$ magnetic field, as shown in FIGS. 34-35. FIG. 34 shows simulation results for $B_1^+$ amplitude ($|B_1^+|$) for various cross-sections of the phantom and various configurations of the disclosed technology. The columns of FIG. 34 show $|B_1^+|$ along transverse, sagittal, and coronal midplanes of the MRI system respectively, as labeled, for four configurations shown in respective rows of FIG. 34. Dashed circular and rectangular outlines indicate the sample volume, for example the volume occupied by vial 3030. In the row labels, "InC" refers to the secondary resonator, "DeT" refers to the detuning circuit, and "WO" means "without". As a baseline, the top row illustrates $|B_1^+|$ with no secondary resonator 3040. The third row illustrates $|B_1^+|$ with a secondary resonator 3040 as previously described, in an Enhancing configuration tuned to have a resonant frequency of 305 MHz. It can be observed that the secondary resonator 3040 adversely impacts the $|B_1^+|$ uniformity in this configuration. ($|B_1^+|$ is enhanced, according to the principles described herein.) The second row illustrates a configuration with secondary resonator 3040 modified according to the disclosed technology with a detuning circuit, described further herein. The detuning circuit effectively removes the secondary resonator 3040 during the transmit phase of operation. Thus, the $|B_1^+|$ pattern with detuned secondary resonator 3040 (second row of FIG. 34) is substantially identical to the case with no secondary resonator 3040. For comparison, the bottom row of FIG. 34 shows $|B_1^+|$ for a configuration having a secondary resonator 3040 with no detuning circuit and tuned to have resonance at 265 MHz, below the operating frequency. The secondary resonator 3040 is in Opposing configuration relative to the transmit antenna 3010 and reduces $|B_1^+|$ in its proximity, according to the principles described herein.

FIG. 35 shows corresponding simulation results for receive $B_1^-$ amplitude ($|B_1^-|$) for various cross-sections of the MRI machine and various configurations of the disclosed technology. Like FIG. 34, the columns of FIG. 35 correspond to respective midplane slices, while the rows of FIG. 35 correspond to different configurations of secondary resonator 3040. As a baseline, the top row illustrates $|B_1^-|$ with no secondary resonator 3040 ("without SR"). The middle row illustrates $|B_1^-|$ with a secondary resonator 3040 in the Enhancing configuration previously described, with resonant frequency of 305 MHz. $|B_1^-|$ is seen to be boosted, with greater amplitude uniformity, as compared to the baseline top row, in line with the principles described herein. The bottom row illustrates $|B_1^-|$ with a secondary resonator 3040 in the Opposing configuration previously described, with resonant frequency of 265 MHz. $|B_1^-|$ is considerably degraded in the Opposing configuration, with lower average amplitude, and higher gradients.

Because the detuning circuit is inoperative during the receive phase of MRI operation, there is no need in FIG. 35 to compare cases with and without detuning circuit.

The images described below were obtained on an Agilent Inc. (Santa Clara, Calif.) 7.05 T horizontal bore animal MRI machine with an open bore of 115 mm inside diameter and 310 mm length. The nominal $^1$H resonant frequency for this machine is about 300 MHz. This machine was used with a birdcage RF transmit antenna (RAPID MR International, Columbus, Ohio) and a four channel phased array primary receive antenna system (also RAPID MR International), as described further below.

FIG. 31A shows transverse cross-section images of a phantom imaged with and without the disclosed technology. The left image, labeled "Without SR" is obtained for a configuration without a secondary resonator (denoted as "SR" in Figures). This image has marked non-uniformity and very low sensitivity in the top half of the image. The right image, labeled "With SR and DeT" is obtained for a configuration having a secondary resonator with a detuning circuit (denoted as "DeT" in Figures). The sensitivity and uniformity of the image are noticeably improved, compared to the "Without SR" case. FIG. 31B presents the improvement in tabular form. The middle row corresponds to the baseline without secondary resonator, and shows in successive columns the detected signal amplitude, 500, at the top center location (arrow in FIG. 31A), the mean detected signal amplitude, 1707, over the circular cross section, and the standard deviation of the detected signal amplitude, 1108, over the cross section. The bottom row corresponds to a disclosed secondary resonator and detuning circuit. The sensitivity at the top center is greatly improved (detected amplitude of 3400 compared to 500 for the baseline configuration), as is the overall sensitivity (mean detected signal amplitude of 2040 vs 1707). The uniformity of the image (or, image sensitivity) is also greatly improved (standard deviation of 555 is about half that of the baseline case, 1108). The images of FIG. 31A were acquired with a same input power.

Figure 36:
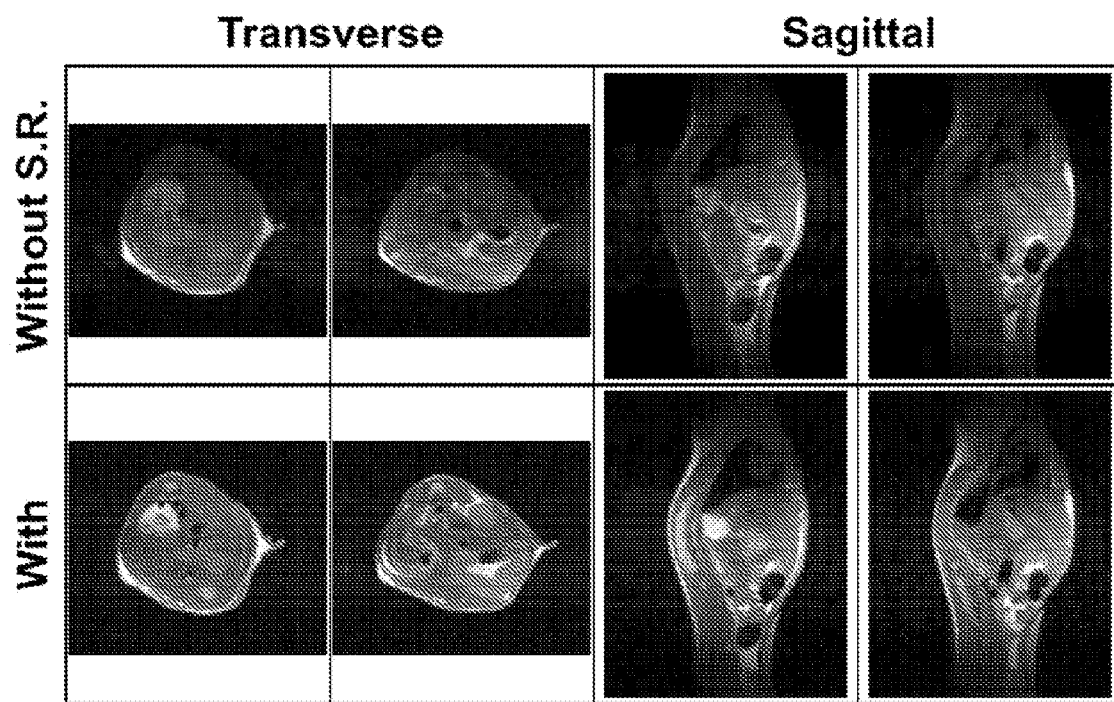
FIG. 36 shows $^1H$ image sets of a mouse, for transverse and sagittal slices, with and without a secondary receiver resonator with detuning circuit according to disclosed technology.

FIG. 36 shows $^1$H image sets of a mouse, for transverse and sagittal slices, with and without a secondary receiver resonator having a detuning circuit according to disclosed technology. These images were obtained using a spin echo sequence with parameters: TR=2500 ms, ESP=5.66 ms, Segment/ETL=32/8, kzero=3, Effective TE=16.99 ms, Avg.=4, Rep.=1, Matrix=256×256, FOV=70×50 (Sagittal) or 50×50 mm (Transverse), NS (Number of Slices)=15, Thickness=1.00 mm, Scan Time=5 min 25 s.

The top row of images represents a configuration with no secondary resonator, while the bottom row of images represents a configuration with a secondary resonator incorporating a detuning circuit as disclosed herein. The two left columns are for respective transverse slices of the sample mouse body. The two right columns are for respective sagittal slices of the sample mouse body. The improved contrast, improved image sensitivity, and generally uniform sensitivity in the bottom row are significant for all slices. The improvements are particularly noticeable in the upper halves of the transverse slices (in accord with the results of FIG. 31), and the left halves of the sagittal slices. A passive detuning circuit was used at each capacitor position of the secondary resonator.

Figure 37:
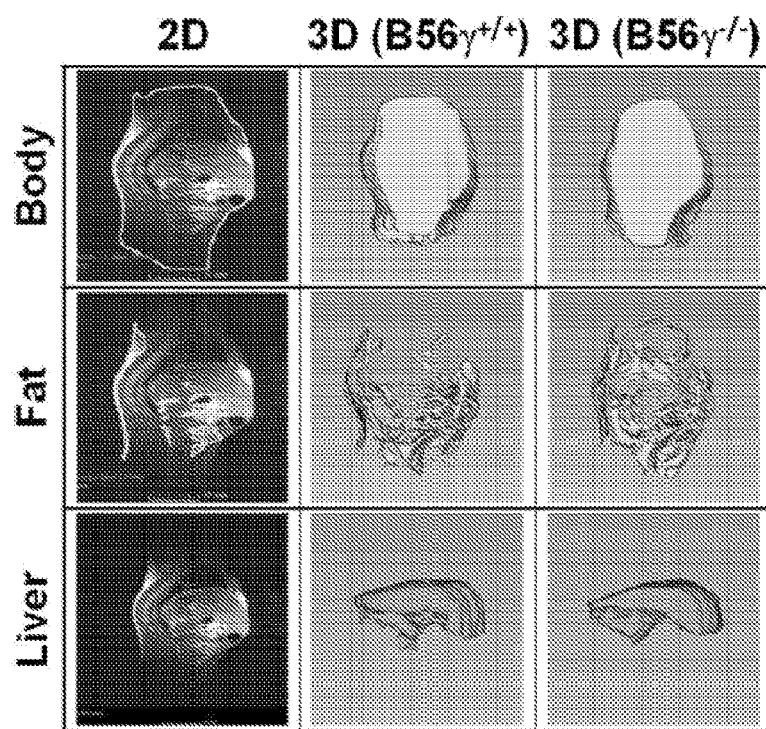
FIG. 37 shows sagittal images and 3-D volume reconstructions in a mouse study of PP2A B56γ using a secondary receiver resonator with detuning circuit according to disclosed technology.

FIG. 37 shows sagittal images and 3-D volume reconstructions in a study of PP2A B56γ in mice to present the example of pre-clinical application of our disclosed technology. All MRI images were acquired in a configuration having secondary resonator with a detuning circuit as described herein. A mouse having the B56γ subunit was used as a control, with images shown in the second column (labeled B56γ+/+). Another mouse without the B56γ subunit had a heart malfunction and developed obesity, with images shown in the third column (label: B56γ−/−). The obese mouse had 17% greater body volume and 70% greater fat volume than the control mouse. The left column shows 2-D images of representative sagittal slices for the mouse having no B56γ subunit. The rows of FIG. 37 were obtained with the same MRI imaging sequence used in FIG. 36 and the MRI images were reconstructed as a 3D volume mapping of body (first row), fat (second row) and liver (third row) using an open source software named Slicer (http://www.slicer.org) Comparison of the second and third column readily shows the increased amounts of fat for the obese mouse in the second row. Similarly, the bottom row shows differences in liver structure between the two mice, particularly at the lower left. The quality of 3-D reconstructions is dependent on having good sensitivity and good uniformity. The fat distribution in the obese mouse can be reliably picked up because of the superior imaging provided by the secondary resonator with detuning circuit. Without such secondary resonator, fat concentrations in "dark regions" of low sensitivity could easily be missed. A passive detuning circuit, with antiparallel PIN diodes, was used at each capacitor position of the secondary resonator.

In variations, multiple designs of secondary resonators can be used, e.g. for different sample sizes, or for different designs of primary receiver coils. Additionally, multiple secondary resonators can be deployed simultaneously to support imaging on different scales, for example whole body and single organ, on a single sample.

While secondary resonators for MRI machines having separate RF antennae for transmit and receive have particular considerations regarding detuning circuit, in other respects these secondary resonators are governed by the same principles described in earlier sections for dual-frequency MRI machines. Accordingly, the variations and features of secondary resonators described in earlier sections, or in context of FIGS. 1-29, are similarly available and can be deployed with separate-antennae MRI machines and detuning circuits as described in this and following sections. Features can also be combined. In some examples, separate secondary resonators can be deployed for transmit and receive RF coil to improve transmit field homogeneity and to improve receive uniformity and/or sensitivity. Experimental procedures and simulation procedures described in earlier sections are also generally applicable to the experiments and simulations of this and the following sections, with appropriate adaptation for differences in RF coil configurations.

Example Detuning Circuits

Figure 32A:
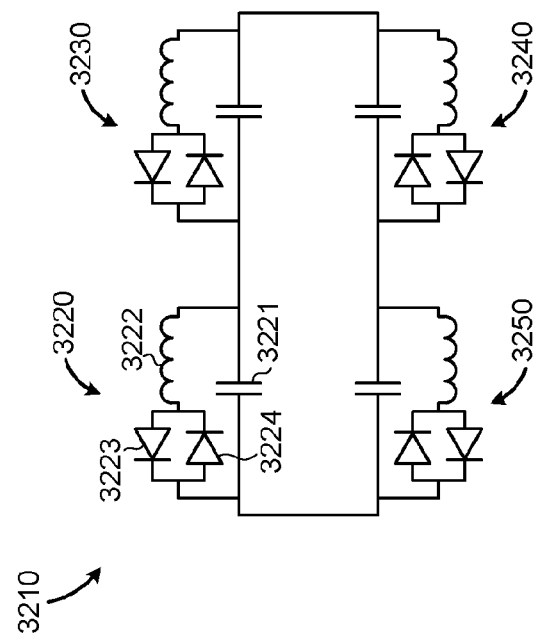
FIGS. 32A-32B are a circuit diagram and a photographic image of an exemplary secondary receiver resonator incorporating a detuning circuit according to the disclosed technology.
Figure 32B:
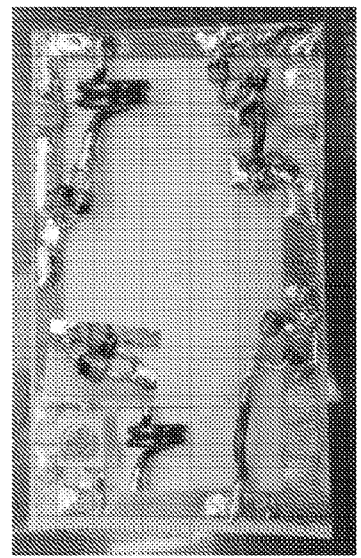

FIGS. 32A-32B are a circuit diagram and a photographic image of an exemplary secondary receiver resonator incorporating a detuning circuit according to the disclosed technology. As illustrated in FIG. 32B, secondary receiver resonator 3250 has the shape of a generally rectangular loop, however this is not a requirement. Other planar shapes, such as ovals, figure-eight, a D coil, or non-planar shapes, can be used. The illustrated resonator of FIG. 32B is about 45 mm×25 mm in size, with conducting segments formed of 2 mm wide copper strip, and four 11 pF capacitors. The illustrated resonator has a resonant frequency of 305 MHz, with shunt detuning circuit OFF. In another example, one of the four capacitors can be substituted by a variable capacitor for frequency tuning.

FIG. 32A is the circuit diagram 3210 corresponding to the resonator 3250. The circuit includes four circuit blocks 3220, 3230, 3240, 3250. Circuit block 3220 has a capacitor 3221 in parallel with a shunt detuning network of two anti-parallel PIN diodes 3223, 3224 in series with inductor 3222 as shown. During the receive phase, both diodes 3223, 3224 are in an OFF state with high-impedance, leaving the parallel shunt network, including inductor 3222 effectively disconnected from the circuit 3210. The other circuit blocks shown behave similarly. Thus, during receive phase, the illustrated secondary receive resonator of FIG. 32 has capacitor 3221 and three similar capacitors forming a loop in series with the self-inductance of the loop wiring. In common examples, this loop can have a resonant frequency a few MHz above the instant MRI operating frequency, and the secondary receive resonator behaves similarly to the examples discussed in context of FIG. 14B, 14D, or 6A. However, during transmit mode, the PIN diodes 3223, 3224 are in an ON state with low impedance, and circuit block 3220 can appear as a parallel combination of capacitor 3221 and inductor 3222. With the value of inductor 3222 chosen appropriately, this capacitor-inductor combination can be close to parallel resonance at the operating frequency $f_0$. If the parallel resonance is exactly at $f_0$ the circuit block 3220 will appear to have infinitely high impedance and appear as an open circuit. However due to component variations, a perfect match may not be achieved. Still, the effective impedance of circuit block 3220 can be shifted enough so as to detune the resonator 3210 and avoid significant distortion of the transmit field $B_1^+$. In varying examples, the parallel resonance frequency between capacitor 3221 and inductor 3222 can be within 1%, 2%, or 5% of the MRI operating frequency.

Detuning can be characterized in other ways. Detuning can cause a shift in series resonance frequency of the secondary resonator, by at least 5%, 10%, or 20%, in varying examples. Alternatively, reflection parameter $S_{11}$ of the secondary resonator (which can be measured with a probe/pickup coil and a network analyzer in a configuration similar to that of FIG. 11) can be increased when the detuning circuit is turned ON. In varying examples, this increase in $S_{11}$ can be at least 10 dB, 15 dB, or 20 dB. In examples, $S_{11}$ with detuning circuit OFF can be less than or equal to −15 dB, while $S_{11}$ with detuning circuit ON can be greater than or equal to −2 dB. With detuning circuit ON, the secondary resonator can also have a high series impedance around the loop, at the MRI operating frequency. In varying examples, this series impedance can be at least 100 Ω, 200 Ω, 500 Ω, 1 kΩ, or 2 kΩ.

When the detuning circuit is ON, the receive secondary resonator is not resonant at or near the MRI operating frequency. Accordingly, there is a considerably wide margin of inductance values for inductor 3222 that can be used. The anti-parallel combination of diodes 3223, 3224 can be switched between ON and OFF states by induced voltages from the $B_1^+$ field itself, a mode of operation dubbed passive detuning. Although FIG. 32A shows four substantially identical circuit blocks 3210-3240, this is not a requirement. In other examples, less than four (as few as one) or more than four circuit blocks can be implemented. Further, the detuning shunt network can be present in only one of the circuit blocks, or on less than all primary capacitors.

The circuit of FIG. 32 is an example of an RF magnetic field shim (with detuning circuit) in which capacitors 3221-3224 can be successively joined by electrically conductive traces to form a passive circuit. With detuning circuits OFF, this passive circuit can have a resonant frequency tuned to be above the MRI operating frequency but within 30% (often within 10%) of the MRI operating frequency. In some examples the resonant frequency can be tuned to be within 0.5-5% (often within 1-2%) above the MRI operating frequency, when in a deployed configuration proximate an aqueous sample to be imaged. The resonant frequency range can have a lower bound in the range of 0.1% to 5%, including 0.1, 0.2, 0.5, 1.0, or 2.0%, above the MRI operating frequency, and can have an upper bound in the range of 1% to 30%, including 1, 2, 5, or 10% above the MRI operating frequency. One or more shunt detuning circuits, each having a series combination of an inductor and a diode network, can be connected across respective capacitors of the first passive circuit. The diode network can be an anti-parallel pair of diodes such as PIN diodes, forming a passive detuning network. The capacitors of the primary loop can have similar values or can be different. Particularly, one or more of these capacitors can be adjustable.

Figure 33A:
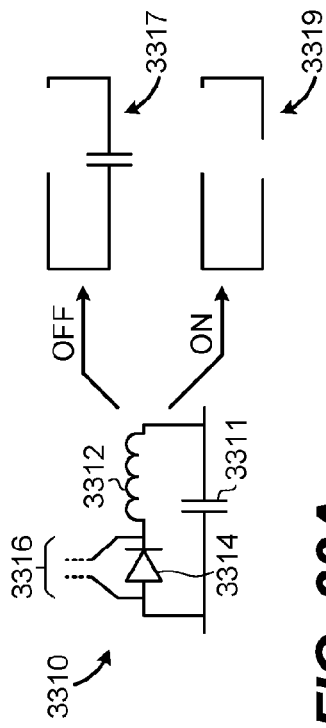
FIGS. 33A-33C are partial circuit diagrams of alternative embodiments of secondary receiver resonators with detuning circuit according to the disclosed technology.
Figure 33B:
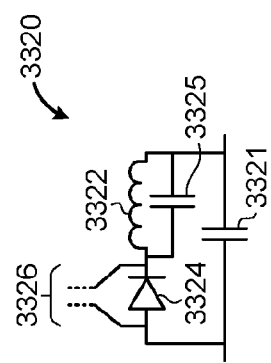
Figure 33C:
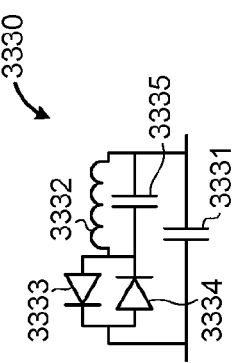

FIGS. 33A-33C are partial circuit diagrams of alternative embodiments of secondary receiver resonators according to the disclosed technology. Each of FIG. 33A-33C illustrates one circuit block similar to circuit blocks 3210-3240 of FIG. 32A. FIG. 33A shows circuit 3310, in which main capacitor 3311 is shunted by detuning inductor 3312, which can be switched in or out of the circuit by turning PIN diode 3314 ON or OFF. With detuning circuit OFF, the circuit block 3310 appears as a capacitor, as shown by inset 3317. With detuning circuit ON, the circuit block 3310 appears as an open circuit, as shown by inset 3319, at the operating frequency. In this example, bias connection 3316 across the diode 3314 permits the PIN diode to be switched ON by a pulsed DC current or voltage signal, pulsed ON for at least the duration of the transmit phase. (Pulsed DC refers to an electrical signal which has a quiescent OFF state, and is turned ON for the duration of a pulse. During the pulse, the signal can maintain the same sign, and can have substantially constant amplitude.) Although requiring an external control signal, such a configuration can be effective in situations when the $B_1^+$ field is not strong enough to turn the PIN diode 3314 ON by induced voltage alone.

FIG. 33B illustrates a variation 3320 where shunt inductor 3322 is itself shunted by another capacitor 3325. An advantage of this configuration is that the effective capacitance of the resonant L-C tank circuit is increased, and parallel resonance can be placed at or near operating frequency $f_0$ with a smaller value of inductance 3322 than without secondary capacitance 3325. Again, bias connection 3326 provides a means for turning ON the PIN diode 3324 during the transmit phase. Finally, the circuit 3330 of FIG. 33C combines features of FIG. 33B (secondary capacitance 3335) and FIG. 32A (anti-parallel combination of PIN diodes 3333, 3334 allows passive detuning, without any DC bias connection). Main capacitor 3331 and shunt inductor 3332 behave similarly to capacitor 3321 and inductor 3322 in FIG. 33B.

Many variations are possible. For example, an active detuning circuit can incorporate a photodiode which is switched ON by a light signal, which can be delivered over an optical fiber. As another example, the detuning circuit can be replaced by a tuning circuit, such that the tuning circuit is OFF during a transmit phase, and ON during a receive phase, such that the secondary resonator has a primary resonance substantially removed from the MRI operating frequency during the transmit phase. However, with tuning circuit activated, the primary resonance can be at a desired frequency, slightly above the MRI operating frequency (e.g. 305 MHz in the above example), during the receive phase. Additionally, a secondary resonator having multiple capacitors in a primary loop can desirably have the capacitors spaced apart. However, at each capacitor site, a plurality of discrete capacitors can be used to achieve a desired capacitance value. As used herein, references to a detuning circuit being placed across one capacitor refer to a detuning circuit being placed across one or more capacitors at one capacitor site, away from other capacitor sites of the secondary resonator. In some variations, distributed capacitance can be used.

Example Imaging and System Applications

The secondary resonators with detuning circuits can be deployed for MRI imaging. The secondary resonator can be affixed, along with a proximate sample, to a translation stage of an MRI machine and a primary receive antenna system (e.g. RF coil(s)) of the MRI machine. The MRI machine can have a body with a bore and a transmit RF antenna affixed around or within the bore. The passive circuit can have one or more electrically conductive segments and one or more capacitors connected together to form one or more loops, with at least one of the capacitors electrically coupled to a respective detuning circuit. The passive circuit can be adjusted to have a first resonant frequency when affixed to the sample and translation stage, the first resonance frequency being between 0.1% and 20% above an operating frequency of the MRI machine. In some examples, the resonant frequency can be restricted between 1-2% above the MRI operating frequency. The stage can be translated, continuously or step-wise, into the bore, and MRI signals can be acquired at the operating frequency. Any among a variety of known pulse sequences and protocols can be employed for imaging. The acquired MRI signals can be used to generate image data of the sample.

MRI signal acquisition can include a repetitive series of pulse sequences, each having a transmit phase and a subsequent phase, the subsequent phase including a receive time period for detection of MRI signals. During the transmit phase, a transmit RF antenna can be actuated, with detuning circuits switched ON, either passively by induced voltages or currents in the secondary resonator, or actively using a pulsed bias signal from a DC voltage, DC current source, or photonic source.

The secondary resonators with detuning circuits can be deployed in a variety of MRI systems. A first system can include an RF transmit antenna subsystem, an RF receive antenna subsystem, a secondary RF structure, and a detuning circuit. The RF transmit antenna subsystem can be configured to generate a transmit magnetic field at an operating frequency of the MRI machine during a transmit phase, the operating frequency being selected for nuclear magnetic resonance of $^1H$ or another targeted nuclide. The RF receive antenna subsystem can be distinct from the RF transmit antenna subsystem, and can be configured to detect a receive magnetic field at the operating frequency during a receive phase. The secondary RF structure can include one or more electrically conductive segments and one or more capacitors connected together to form one or more primary loops, which can be configured to have a resonant frequency above and within 30% the operating frequency, when placed in proximity to an aqueous sample in the sample volume. The detuning circuit can be coupled to a given one of the capacitors, and can be configured to be ON during the transmit phase and OFF during the receive phase. The secondary RF structure can include one or more adjustable components, such as a variable capacitor or variable inductor, to enable tuning its resonant frequency within a suitable range above the MRI operating frequency.

A second system can be similar to the first system described above, and can additionally incorporate second transmit antennae and second receive antennae for MRI operation at a second operating frequency. In examples, one or both of the second transmit antennae and second receive antennae can be common for both MRI operating frequencies. In examples with second operating frequency above the first operating frequency, the resonant frequency can be constrained to be below, for example at least 10% below, the second operating frequency.

A third system can be similar to the first system, and can further include a computing node, as part of the MRI machine or as an auxiliary computer for added processing power or post-processing. The system can be configured to acquire MRI signals at one or more operating frequencies, generate image data based on the acquired MRI signals, and optionally control active detuning shunt networks of secondary resonators to be ON during a transmit phase and OFF during a receive phase.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among a few or among many alternatives can be made, and such selections need not be lower, better, less, or otherwise preferable to other alternatives not considered.

In view of the many possible embodiments to which the principles of the disclosed technology may be applied, it should be recognized that the illustrated embodiments are only examples and should not be considered a limitation on the scope of the disclosure. We claim as our invention all that comes within the scope and spirit of the appended claims.

We claim:

1. An RF magnetic field shim for use with a dual frequency magnetic resonance imaging (MRI) system having separate transmit and receive antennae, comprising:
a first passive circuit comprising one or more electrically conductive segments and one or more capacitors connected together to form one or more loops;
wherein the first passive circuit is configured to have a first resonance frequency above a first operating frequency of the dual frequency MRI system and below a second operating frequency of the dual frequency MRI system;
wherein the RF magnetic field shim is magnetically coupled to a first receiving antenna, among the antennae, used at the first operating frequency.

2. The RF magnetic field shim of claim 1, wherein the first passive circuit is adjustable and includes at least one adjustable component.

3. The RF magnetic field shim of claim 1, further comprising a second passive circuit comprising one or more electrically conductive segments and one or more capacitors connected together to form one or more loops, wherein the second passive circuit has a second resonance frequency above the second operating frequency.

4. The RF magnetic field shim of claim 3, wherein the loops of the first passive circuit and the loops of the second passive circuit are concentric.

5. The RF magnetic field shim of claim 3, wherein the transmit and receive antennae comprise a first RF transmit antenna for the first operating frequency and a second RF transmit antenna for the second operating frequency, and wherein a third mutual inductance between the first passive circuit and the second passive circuit is less than a first mutual inductance between the first passive circuit and the first RF transmit antenna.

6. The RF magnetic field shim of claim 1, wherein the dual frequency MRI system is configured to image an aqueous sample in a sample volume of the dual frequency MRI system, and wherein:
the first resonance frequency is for a condition of the first passive circuit being located proximate to the aqueous sample.

7. The RF magnetic field shim of claim 1, wherein the first operating frequency is within a first resonant bandwidth of the first passive circuit and the second operating frequency is outside the first resonant bandwidth.

8. The RF magnetic field shim of claim 1, wherein the first passive circuit has a figure-eight topology.

9. The RF magnetic field shim of claim 1, wherein the dual frequency MRI system is configured to image a sample in a sample volume of the dual frequency MRI system, and wherein at least one of the loops of the first passive circuit conforms to a curved surface around the sample volume.

10. The RF magnetic field shim of claim 1, wherein:
the transmit and receive antennae comprise a first RF transmit antenna for the first operating frequency; and
the first passive circuit and the first RF transmit antenna are on opposite sides of the sample volume.

11. The RF magnetic field shim of claim 1, wherein:
the transmit and receive antennae comprise a first RF transmit antenna for the first operating frequency and a second RF transmit antenna for the second operating frequency; and
the first passive circuit has a first mutual inductance with the first RF transmit antenna and a second mutual inductance with the second RF transmit antenna, and the first mutual inductance is greater than the second mutual inductance.

12. The RF magnetic field shim of claim 1, wherein
the transmit and receive antennae comprise a first RF transmit antenna for the first operating frequency; and
an induced magnetic field resulting from induced currents in the first passive circuit shares a symmetry with a primary magnetic field generated by the first RF transmit antenna.

13. A method, comprising:
adjusting a passive circuit to have a first resonant frequency when in a first operating environment;
  wherein the first operating environment is proximate to a sample in a sample volume of a dual-frequency magnetic resonance imaging (MRI) system;
  wherein the passive circuit is distinct from transmit and receive antennae of the dual-frequency MRI system; and
  wherein the first resonance frequency is above a first operating frequency of the dual-frequency MRI system and below a second operating frequency of the dual-frequency MRI system; and
  acquiring first MRI signals of the sample at the first operating frequency;
wherein the passive circuit is magnetically coupled to one or more of the antennae.

14. The method of claim 13, further comprising:
acquiring second MRI signals at the second operating frequency; and
generating image data based partly on the first MRI signals and based partly on the second MRI signals.

15. A system for improving RF magnetic field uniformity within a sample volume of a dual-frequency magnetic resonance imaging (MRI) machine, comprising:
  a first antenna comprising one or more electrically conductive segments and one or more capacitors connected together to form one or more loops;
  a first RF transmit antenna configured to generate a first magnetic field at a first operating frequency of the dual-frequency MRI machine; and
  a second RF transmit antenna configured to generate a second magnetic field at a second operating frequency of the dual-frequency MRI machine;
  wherein the first antenna is configured to have a first resonance frequency above the first operating frequency and below the second operating frequency;
  a first RF receive antenna configured to receive first MRI signals at the first operating frequency of the dual-frequency MRI machine; and
  a second RF receive antenna configured to receive second MRI signals at the second operating frequency of the dual-frequency MRI machine; and
  wherein the first antenna, the first RF receive antenna, the second RF receive antenna, the first RF transmit antenna, and the second RF transmit antenna are in fixed positions proximate to a sample volume of the dual-frequency MRI machine.

16. The system of claim 15, wherein the first antenna is adjustable and includes at least one adjustable component.

17. The system of claim 15, further comprising a second antenna comprising one or more loops of a second electrically conductive material and one or more capacitors,
  wherein the second antenna is configured to have a second resonance frequency above the second operating frequency of the dual frequency MRI system; and
  wherein the second antenna is in a fixed position proximate to the sample volume.

18. The system of claim 15, wherein the first antenna has the first resonance frequency in a case that an aqueous sample to be imaged is positioned within the sample volume.

19. A first dual-frequency MRI machine comprising:
the system of claim 15, wherein the dual-frequency MRI machine is the first dual-frequency MRI machine; and
a computing node having one or more processors and memory coupled thereto, the computing node configured to:
  acquire the first MRI signals at the first operating frequency;
  acquire the second MRI signals at the second operating frequency; and
  generate an image or a fused dataset based partly on the first MRI signals and based partly on the second MRI signals.

20. The system of claim 15, wherein the first antenna is magnetically coupled to the first RF receive antenna.

* * * * *